US012777808B2

(12) United States Patent
Kubota et al.

(10) Patent No.: US 12,777,808 B2
(45) Date of Patent: Oct. 27, 2026

(54) ORGANIC DISPLAY APPARATUS HAVING CO-ADJACENT LIGHT-EMITTING AND LIGHT SENSING ELEMENTS WITH SHARED COMMON ELECTRODE

(71) Applicant: Semiconductor Energy Laboratory Co., Ltd., Kanagawa-ken (JP)

(72) Inventors: Daisuke Kubota, Atsugi (JP); Kenichi Okazaki, Atsugi (JP); Koji Kusunoki, Isehara (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 386 days.

(21) Appl. No.: 18/563,066

(22) PCT Filed: May 17, 2022

(86) PCT No.: PCT/IB2022/054558
§ 371 (c)(1),
(2) Date: Nov. 21, 2023

(87) PCT Pub. No.: WO2022/248973
PCT Pub. Date: Dec. 1, 2022

(65) Prior Publication Data
US 2024/0224706 A1 Jul. 4, 2024

(30) Foreign Application Priority Data
May 27, 2021 (JP) ................................ 2021-089340

(51) Int. Cl.
*H10K 59/38* (2023.01)
*H10K 50/00* (2023.01)
(Continued)

(52) U.S. Cl.
CPC ............ *H10K 59/38* (2023.02); *H10K 50/00* (2023.02); *H10K 50/19* (2023.02); *H10K 59/65* (2023.02);
(Continued)

(58) Field of Classification Search
CPC ........ H10K 59/38; H10K 50/00; H10K 50/19; H10K 59/65; H10K 59/871; H10K 59/873;
(Continued)

(56) References Cited

U.S. PATENT DOCUMENTS 7,663,140 B2 2/2010 Yamazaki et al.
8,076,671 B2 12/2011 Yamazaki et al.
(Continued)

FOREIGN PATENT DOCUMENTS

CN 001909751 A 2/2007
CN 102509733 A 6/2012
(Continued)

OTHER PUBLICATIONS

International Search Report (Application No. PCT/IB2022/054558), dated Aug. 9, 2022.
(Continued)

*Primary Examiner* — John P. Dulka
(74) *Attorney, Agent, or Firm* — Husch Blackwell LLP

(57) ABSTRACT

A display apparatus having an image capturing function is provided. A display apparatus or an image capturing with a high aperture ratio is provided. The display apparatus includes a light-emitting element and a light-receiving element. A first pixel electrode, a first organic layer, and a common electrode are stacked in this order in the light-emitting element. A second pixel electrode, a second organic layer, and the common electrode are stacked in this order in the light-receiving element. The second organic layer
(Continued)

includes a photoelectric conversion layer. A first layer and a second layer are included in a region between the first light-emitting element and the light-receiving element. The first layer overlaps with the second organic layer and contains a material the same as a material of the first organic layer. The second layer overlaps with the first organic layer and contains a material the same as a material of the second organic layer. An end portion of the first organic layer and an end portion of the first layer face each other in the region between the light-emitting element and the light-receiving element. An end portion of the second organic layer and an end portion of the second layer face each other in the region between the light-emitting element and the light-receiving element.

7 Claims, 28 Drawing Sheets

(51) Int. Cl.

| | |
|---|---|
| ***H10K 50/19*** | (2023.01) |
| ***H10K 59/65*** | (2023.01) |
| ***H10K 59/80*** | (2023.01) |

(52) U.S. Cl.
CPC ......... *H10K 59/871* (2023.02); *H10K 59/873* (2023.02); *H10K 59/8792* (2023.02)

(58) Field of Classification Search
CPC .... H10K 59/8792; H10K 65/00; H10K 30/60; H10K 30/81; H10K 59/121; H10K 59/122; H10K 59/32; H10K 59/8051; H10K 59/8052; G09F 9/00; G09F 9/30; H05B 33/02; H05B 33/12; H05B 33/22; H10F 39/12
See application file for complete search history.

(56) References Cited

U.S. PATENT DOCUMENTS

| | | | | |
|---|---|---|---|---|
| 8,138,502 | B2 | 3/2012 | Nakamura et al. | |
| 8,497,512 | B2 | 7/2013 | Nakamura et al. | |
| 8,536,569 | B2 | 9/2013 | Yamazaki et al. | |
| 9,088,006 | B2 | 7/2015 | Yamazaki et al. | |
| 9,627,648 | B2 | 4/2017 | Yamazaki et al. | |
| 9,805,659 | B2 | 10/2017 | Ikeda et al. | |
| 10,003,047 | B2 | 6/2018 | Yamazaki et al. | |
| 10,381,599 | B2 | 8/2019 | Yamazaki et al. | |
| 10,727,285 | B2 | 7/2020 | Chung et al. | |
| 10,903,453 | B2 | 1/2021 | Yamazaki et al. | |
| 11,469,277 | B2 | 10/2022 | Chung et al. | |
| 11,621,407 | B2 | 4/2023 | Yamazaki et al. | |
| 11,804,065 | B2 | 10/2023 | Li | |
| 11,839,106 | B2 | 12/2023 | Yamazaki et al. | |
| 2007/0029554 | A1 | 2/2007 | Nakamura et al. | |
| 2009/0146552 | A1* | 6/2009 | Spindler ................ | H10K 50/19 313/504 |
| 2012/0168776 | A1 | 7/2012 | Nakamura et al. | |
| 2015/0022515 | A1 | 1/2015 | Ikeda et al. | |
| 2017/0278909 | A1 | 9/2017 | Jeon et al. | |
| 2019/0006440 | A1 | 1/2019 | Sun et al. | |
| 2020/0334439 | A1 | 10/2020 | Sun et al. | |
| 2021/0158751 | A1 | 5/2021 | Cha et al. | |
| 2021/0233975 | A1 | 7/2021 | Bouthinon et al. | |
| 2021/0327979 | A1 | 10/2021 | Kamada et al. | |
| 2024/0237414 | A1* | 7/2024 | Kubota ................ | H10K 59/351 |

FOREIGN PATENT DOCUMENTS

| | | | |
|---|---|---|---|
| CN | 107230691 | A | 10/2017 |
| CN | 108242453 | A | 7/2018 |
| CN | 110162203 | A | 8/2019 |
| CN | 111626195 | A | 9/2020 |
| CN | 112673488 | A | 4/2021 |
| EP | 3425670 | A | 1/2019 |
| JP | 2006-012793 | A | 1/2006 |
| JP | 2007-067381 | A | 3/2007 |
| JP | 2014-197522 | A | 10/2014 |
| JP | 2015-038605 | A | 2/2015 |
| JP | 2018-010829 | A | 1/2018 |
| JP | 2019-033071 | A | 2/2019 |
| KR | 2007-0017073 | A | 2/2007 |
| KR | 2013-0053433 | A | 5/2013 |
| KR | 2016-0032099 | A | 3/2016 |
| KR | 2017-0113794 | A | 10/2017 |
| KR | 2021-0055699 | A | 5/2021 |
| TW | 200711181 | | 3/2007 |
| TW | 201513079 | | 4/2015 |
| TW | 201933318 | | 8/2019 |
| TW | 202013783 | | 4/2020 |
| WO | WO-2005/115059 | | 12/2005 |
| WO | WO-2015/008680 | | 1/2015 |
| WO | WO-2018/113207 | | 6/2018 |
| WO | WO-2019/234340 | | 12/2019 |
| WO | WO-2020/034726 | | 2/2020 |
| WO | WO-2020/053692 | | 3/2020 |
| WO | WO-2021/238972 | | 12/2021 |

OTHER PUBLICATIONS

Written Opinion (Application No. PCT/IB2022/054558), dated Aug. 9, 2022.

* cited by examiner

9101

9102

9200

9201

9201

9201

ORGANIC DISPLAY APPARATUS HAVING CO-ADJACENT LIGHT-EMITTING AND LIGHT SENSING ELEMENTS WITH SHARED COMMON ELECTRODE

This application is a 371 of international application PCT/IB2022/054558 filed on May 17, 2022, which is incorporated herein by reference.

TECHNICAL FIELD

One embodiment of the present invention relates to a display apparatus. One embodiment of the present invention relates to an image capturing device. One embodiment of the present invention relates to a display apparatus having an image capturing function.

Note that one embodiment of the present invention is not limited to the above technical field. Examples of a technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, display apparatuses have been required to have higher resolution in order to display high-definition images. In addition, display apparatuses used in information terminal devices such as smartphones, tablet terminals, and notebook PCs (personal computers) have been required to have lower power consumption as well as higher resolution. Furthermore, display apparatuses have been required to have a variety of functions such as a touch panel function and a function of capturing images of fingerprints for authentication, in addition to a function of displaying images.

Light-emitting apparatuses including light-emitting elements have been developed, for example, as display apparatuses. Light-emitting elements (also referred to as EL elements) utilizing an electroluminescence (hereinafter referred to as EL) phenomenon have features such as ease of reduction in thickness and weight, high-speed response to an input signal, and driving with a direct-constant voltage source, and have been used in display apparatuses. For example, Patent Document 1 discloses a flexible light-emitting apparatus including an organic EL element.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display apparatus having an image capturing function. Another object is to provide an image capturing device or a display apparatus with high resolution. Another object is to provide a display apparatus or an image capturing device with a high aperture ratio. Another object is to provide an image capturing device or a display apparatus capable of performing image capturing with high sensitivity. Another object is to provide a display apparatus capable of obtaining biological information such as fingerprints. Another object is to provide a display apparatus that functions as a touch panel.

An object of one embodiment of the present invention is to provide a highly reliable display apparatus, a highly reliable image capturing device, or a highly reliable electronic device. An object of one embodiment of the present invention is to provide a display apparatus, an image capturing device, an electronic device, or the like that has a novel structure. An object of one embodiment of the present invention is to at least reduce at least one of problems of the conventional technique.

Note that the description of these objects does not preclude the existence of other objects. One embodiment of the present invention does not have to achieve all of these objects. Note that objects other than these can be derived from the descriptions of the specification, the drawings, the claims, and the like.

Means for Solving the Problems

One embodiment of the present invention is a display apparatus including a first light-emitting element and a light-receiving element. A first pixel electrode, a first organic layer, and a common electrode are stacked in this order in the first light-emitting element. A second pixel electrode, a second organic layer, and the common electrode are stacked in this order in the light-receiving element. The first organic layer includes a first light-emitting layer and a second light-emitting layer. The first light-emitting layer contains a first light-emitting substance. The second light-emitting layer contains a second light-emitting substance that is different from the first light-emitting substance. The second organic layer includes a photoelectric conversion layer. A first layer and a second layer are included in a region between the first light-emitting element and the light-receiving element. The first layer overlaps with the second organic layer and contains a material the same as a material of the first organic layer. The second layer overlaps with the first organic layer and contains a material the same as a material of the second organic layer. An end portion of the first organic layer and an end portion of the first layer face each other in the region between the first light-emitting element and the light-receiving element. An end portion of the second organic layer and an end portion of the second layer face each other in the region between the first light-emitting element and the light-receiving element. The first layer includes a region overlapping with the second pixel electrode and the second organic layer. The second layer includes a region overlapping with the first pixel electrode and the first organic layer.

In the above structure, the first light-emitting element preferably emits white light.

In the above structure, it is preferable that the first organic layer contain two light-emitting substances and colors of light emitted by the two light-emitting substances be complementary colors.

In the above structure, it is preferable that a second light-emitting element be included, a third pixel electrode, a third organic layer, and the common electrode be stacked in this order in the second light-emitting element, the third organic layer include a third light-emitting layer and a fourth light-emitting layer, the third light-emitting layer contain the first light-emitting substance, the fourth light-emitting layer contain the second light-emitting substance, a third layer and a fourth layer be included in a region between the second light-emitting element and the light-receiving element, the third layer overlap with the third organic layer and contain a material the same as a material of the second organic layer, the fourth layer overlap with the second organic layer and contain a material the same as a material of the third organic layer, an end portion of the second organic layer and an end portion of the third layer face each other in the region between the second light-emitting element and the light-receiving element, an end portion of the third organic layer and an end portion of the fourth layer face each other in the region between the second light-emitting element and the light-receiving element, the third layer include a region overlapping with the third pixel electrode and the third organic layer, and the fourth layer include a region overlapping with the second pixel electrode and the second organic layer.

In the above structure, the light-receiving element is preferably sandwiched between the first light-emitting element and the second light-emitting element in a plan view.

In the above structure, the second light-emitting element preferably emits white light.

In the above structure, it is preferable that a first coloring layer overlapping with the first light-emitting element and a second coloring layer overlapping with the second light-emitting element be included, and a wavelength range of light that the second coloring layer transmits be different from a wavelength range of light that the first coloring layer transmits. Different wavelength ranges mean that, for example, light passing through the first coloring layer has an intensity with respect to a wavelength range of one color selected from blue, violet, bluish violet, green, yellowish green, yellow, orange, and red, and light passing through the second coloring layer has an intensity with respect to a wavelength range of another color selected from blue, violet, bluish violet, green, yellowish green, yellow, orange, and red. Even in the case where the coloring layers have different wavelength ranges, the wavelength ranges have an overlapping region in some cases.

In the above structure, it is preferable that a first coloring layer overlapping with the first light-emitting element and a second coloring layer overlapping with the second light-emitting element be included, and the wavelength range of light that the first coloring layer transmits overlap with the wavelength range of light that the second coloring layer transmits. Furthermore, the wavelength range of light that the first coloring layer transmits is preferably the same as the wavelength range of light that the second coloring layer transmits. The same wavelength range refers to that, for example, light passing through the first coloring layer and light passing through the second coloring layer both have an intensity with respect to a wavelength range of one color selected from blue, violet, bluish violet, green, yellowish green, yellow, orange, and red. Even in the case where the coloring layers have the same wavelength range, the wavelength ranges may have regions not overlapping with each other.

In the above structure, it is preferable that a resin layer be included, the resin layer be positioned in the region between the first light-emitting element and the light-receiving element, the end portion of the first organic layer face the end portion of the first layer with the resin layer therebetween, and the end portion of the second organic layer face the end portion of the second layer with the resin layer therebetween.

In the above structure, it is preferable that a first insulating layer be included, the first insulating layer be positioned between the first light-emitting element and the light-receiving element, and the first insulating layer be in contact with the end portion of the first organic layer, the end portion of the second organic layer, the end portion of the first layer, and the end portion of the second layer.

Effect of the Invention

According to one embodiment of the present invention, a display apparatus having an image capturing function can be provided. An image capturing device or a display apparatus with high resolution can be provided. A display apparatus or an image capturing device with a high aperture ratio can be provided. An image capturing device or a display apparatus capable of performing high-sensitivity image capturing can be provided. A display apparatus capable of obtaining biological information such as fingerprints can be provided. A display apparatus functioning as a touch panel can be provided.

According to one embodiment of the present invention, a highly reliable display apparatus, a highly reliable image capturing device, or a highly reliable electronic device can be provided. A display apparatus, an image capturing device, an electronic device, or the like having a novel structure can be provided. At least one of problems of the conventional technique can be at least reduced.

Note that the description of these effects does not preclude the existence of other effects. One embodiment of the present invention does not need to have all of these effects. Note that effects other than these can be derived from the descriptions of the specification, the drawings, the claims, and the like.

MODE FOR CARRYING OUT THE INVENTION

Figure 1A:
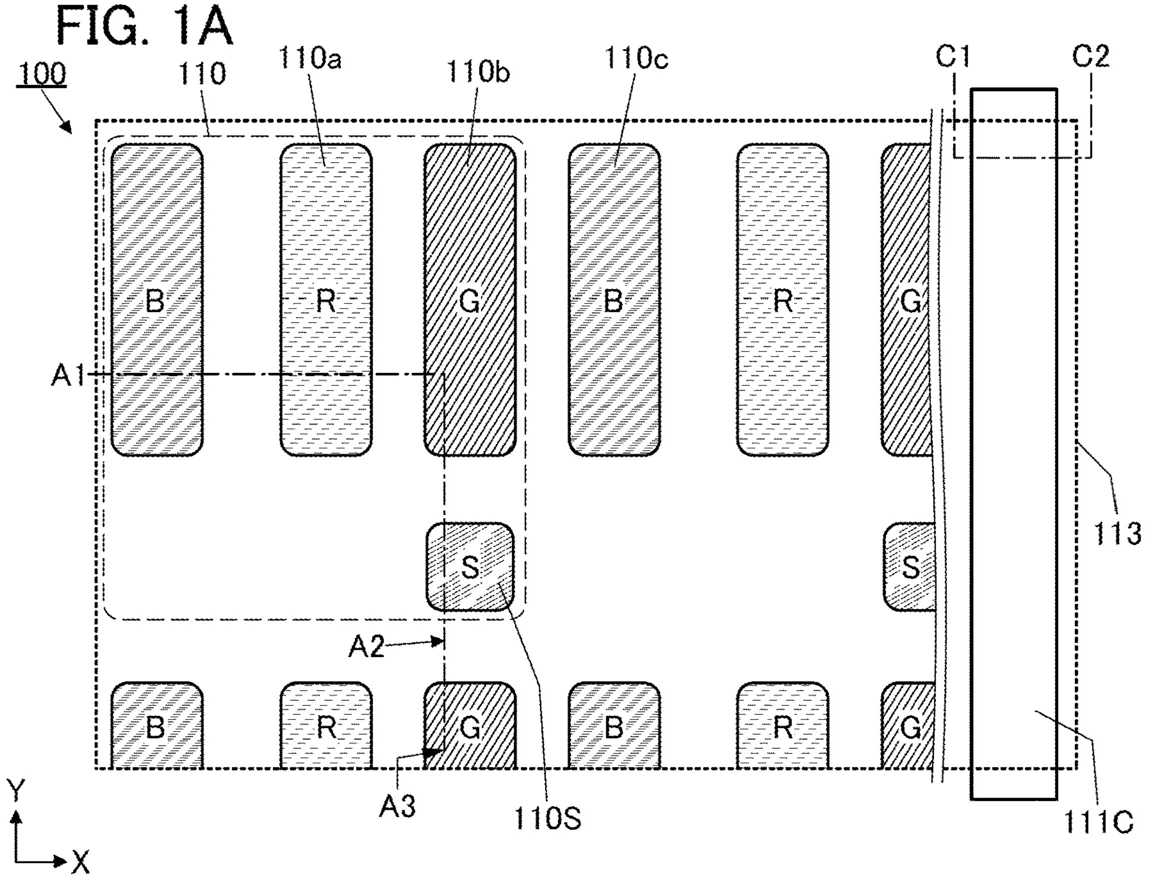
FIG. 1A to FIG. 1D are diagrams illustrating a structure example of a display apparatus.

Hereinafter, embodiments are described with reference to the drawings. Note that the embodiments can be implemented in many different modes, and it is readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number.

Hereinafter, the expressions indicating directions such as "over" and "under" are basically used to correspond to the directions of drawings. However, in some cases, the direction indicating "over" or "under" in the specification does not correspond to the direction in the drawings for the purpose of description simplicity or the like. For example, when a stacking order (or formation order) of a stack or the like is described, even in the case where a surface on which the stack is provided (e.g., a formation surface, a support surface, an adhesion surface, or a planar surface) is positioned above the stack in the drawings, the direction and the opposite direction are expressed using "under" and "over", respectively, in some cases.

In this specification and the like, the term "film" and the term "layer" can be interchanged with each other. For example, in some cases, the term "conductive layer" and the term "insulating layer" can be interchanged with the term "conductive film" and the term "insulating film", respectively.

Note that in this specification, an EL layer means a layer containing at least a light-emitting substance (also referred to as a light-emitting layer) or a stack including the light-emitting layer provided between a pair of electrodes of a light-emitting element.

In this specification and the like, a display panel that is one embodiment of a display apparatus has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, a structure example of a display apparatus of one embodiment of the present invention and an example of a method for manufacturing the display apparatus will be described.

One embodiment of the present invention is a display apparatus including a light-emitting element (also referred to as a light-emitting device) and a light-receiving element (also referred to as a light-receiving device). The light-emitting elements each include a pair of electrodes and an EL layer between them. The light-receiving element includes a pair of electrodes and an active layer between them. The light-emitting elements are preferably organic EL elements (organic electroluminescent elements). The light-receiving element is preferably an organic photodiode (an organic photoelectric conversion element).

The display apparatus preferably includes light-emitting elements including EL layers with the same structure and coloring layers that overlap with the light-emitting elements. The light-emitting element can emit white light, for example. Subpixels emitting light of different colors include coloring layers which transmit visible light of different colors. For example, three kinds of coloring layers emitting light of red (R), green (G), and blue (B) are used, whereby a full-color display apparatus can be achieved.

One embodiment of the present invention is capable of performing image capturing by a plurality of light-receiving elements and thus functions as an image capturing device. In this case, the light-emitting elements can be used as a light source for image capturing. Moreover, one embodiment of the present invention is capable of displaying an image with the plurality of light-emitting elements and thus functions as a display apparatus. Accordingly, one embodiment of the present invention can be regarded as a display apparatus that has an image capturing function or an image capturing device that has a display function.

For example, in the display apparatus of one embodiment of the present invention, light-emitting elements are arranged in a matrix in a display portion, and light-receiving elements are also arranged in a matrix in the display portion. Hence, the display portion has a function of displaying an image and a function of a light-receiving portion. An image can be captured by the plurality of light-receiving elements provided in the display portion, so that the display apparatus can function as, for example, an image sensor or a touch panel. That is, the display portion can capture an image or detect an object approaching or touching, for example. Furthermore, since the light-emitting elements provided in the display portion can be used as a light source at the time of receiving light, a light source does not need to be provided separately from the display apparatus; thus, a highly functional display apparatus can be provided without increasing the number of electronic components.

In one embodiment of the present invention, when an object reflects light emitted by the light-emitting element included in the display portion, the light-receiving element can detect the reflected light; thus, image capturing, touch (including non-contact touch) detecting, or the like can be performed even in a dark environment.

Furthermore, when a finger, a palm, or the like touches the display portion of the display apparatus of one embodiment of the present invention, an image of the fingerprint or the palm print can be captured. Thus, an electronic device including the display apparatus of one embodiment of the present invention can perform personal authentication by using the captured image of the fingerprint, the palm print, or the like. Accordingly, an image capturing device for the fingerprint authentication, the palm-print authentication, or the like does not need to be additionally provided, and the number of components of the electronic device can be reduced. Since the light-receiving elements are arranged in a matrix in the display portion, an image of a fingerprint, a palm print, or the like can be captured in any position in the display portion, which can provide a highly convenient electronic device.

In the case where the light-emitting element of each pixel is formed using an organic EL element that emits white light, separate formation of light-emitting layers in the pixels is not necessary. Thus, a layer other than a pixel electrode included in the light-emitting element (e.g., a light-emitting layer) can be shared by pixels. However, some layers included in the light-emitting element have relatively high conductivity; when a layer having high conductivity is shared by pixels, a leakage current might be generated between the pixels. Particularly when the increase in resolution or aperture ratio of a display apparatus reduces the distance between the pixels, the leakage current might become too large to ignore and cause a decrease in display quality of the display apparatus. In view of the above, in the display apparatus of one embodiment of the present invention, at least part of the light-emitting element in each pixel is formed in an island shape to achieve higher resolution of the display apparatus. Here, the island-shaped portion of the light-emitting element includes a light-emitting layer.

Note that in the light-emitting element that emits white light, it is not necessary to form all layers included in the EL layer to have an island shape, and some of the layers can be formed in the same step. In the method of manufacturing the display apparatus of one embodiment of the present invention, some of the layers included in the EL layer are formed to have an island shape in each pixel, and then, the sacrificial layer is removed and the other layer(s) included in the EL layer (e.g., a carrier-injection layer) and a common electrode (also referred to as an upper electrode) can be formed as shared layers.

Here, as a way of forming part or all of EL layers separately between light-emitting elements which emit light of different colors, an evaporation method using a shadow mask such as a fine metal mask (hereinafter also referred to as an FMM) is known. In the case where organic layers are formed separately between light-emitting elements and light-receiving elements, the organic layers can be formed with use of an FFM or the like. However, this method has difficulty in achieving high resolution and a high aperture ratio because in this method, a deviation from the designed shape and position of the island-shaped organic film is caused by various influences such as the accuracy of the FMM, the positional deviation between the FMM and a substrate, a warp of the FMM, and the vapor-scattering-induced expansion of the outline of the deposited film. Thus, a measure has been taken for pseudo improvement in resolution (also referred to as pixel density) by employing a unique pixel arrangement method such as a PenTile arrangement.

In the manufacturing method using an FMM, two adjacent island-shaped organic films can be formed to partly overlap with each other in order to achieve higher resolution and a higher aperture ratio as much as possible. Thus, the distance between a light-emitting region and a light-receiving region of adjacent elements can be significantly shortened compared with the case where the two adjacent island-shaped organic films do not overlap with each other. However, when the two adjacent island-shaped organic films are formed to overlap with each other, leakage current might be generated through the organic films formed to overlap with each other between a light-emitting element and a light-receiving element adjacent to each other and unintentional light emission might occur. This causes a decrease in luminance, a decrease in contrast, or the like, leading to a reduction in display quality. Furthermore, power efficiency, power consumption, or the like is adversely affected by the leakage current.

In addition, in the case where the leakage current is generated between the light-emitting element and the light-receiving element, the leakage current is a factor in causing noise in image capturing by the light-receiving element; thus, the sensitivity of the image capturing (a signal-noise ratio (S/N ratio)) might be reduced.

In view of the above, the organic films are separately formed using the FMM so as to partly overlap with each other between the light-emitting element and the light-receiving element adjacent to each other in one embodiment of the present invention. Specifically, a layer containing a light-emitting compound in the light-emitting element (also referred to as a light-emitting layer) and a layer containing a photoelectric conversion material in the light-receiving element (also referred to as an active layer or a photoelectric conversion layer) are separately formed using the FMM. In that case, the organic film that can be shared between the light-emitting element and the light-receiving element is not separately formed from other organic films and a film shared between the light-emitting elements and between the light-emitting element and the light-receiving element may be used. An organic stacked film in which a light-emitting layer, an active layer, and other organic films are stacked is positioned between the light-emitting element and the light-receiving element adjacent to each other. Next, part of the organic stacked film is etched by a photolithography method, so that the organic stacked film is divided. Accordingly, a current leakage path between the light-emitting element and the light-receiving element can be cut. Therefore, noise in image capturing using the light-receiving element can be reduced and high-sensitivity image capturing can be performed.

In this manner, a leakage current between the light-emitting element and the light-receiving element (also referred to as side leakage or a side leakage current) can be suppressed and image capturing with high accuracy whose S/N ratio is high can be performed. Thus, clear image capturing can be performed even under weak light. Accordingly, it is possible to decrease luminance of the light-emitting element used as a light source in image capturing, so that power consumption can be reduced.

Moreover, a current leakage path between the light-emitting element and the light-receiving element adjacent to each other can also be cut. Thus, it is possible to increase luminance, contrast, and power efficiency or to reduce power consumption, for example.

Furthermore, an insulating layer is preferably formed to protect a side surface of the organic stacked film that is exposed by etching. Thus, the reliability of the display apparatus can be increased.

The organic film formed using an FMM may be provided to overlap with not only the pixel electrode of a target element but also the pixel electrode of the element adjacent to the target element. Thus, pixel electrodes can be arranged with higher density. In this case, the pixel electrode of an element is overlapped with a separated part of the organic film of the adjacent element.

Hereinafter, structure examples and manufacturing method examples of a display apparatus of one embodiment of the present invention will be described with reference to drawings.

Structure Example 1

FIG. 1A illustrates a schematic top view of a display apparatus 100. The display apparatus 100 includes a display portion in which a plurality of pixels 110 are arranged in a matrix, and a connection portion 130 outside the display portion. The pixel 110 illustrated in FIG. 1A is composed of four subpixels 110*a*, 110*b*, 110*c*, and 110S.

Stripe arrangement is applied to the subpixel 110*a*, the subpixel 110*b*, and the subpixel 110*c* in the pixel 110 illustrated in FIG. 1A.

The subpixels 110*a*, 110*b*, and 110*c* include light-emitting elements 140*a*, 140*b* and 140*c* (hereinafter, they may be collectively referred to as a light-emitting device 140) that emit white light. Coloring layers 129*a*, 129*b*, and 129*c* (hereinafter collectively referred to as a coloring layer 129 in some cases) are provided to overlap with the light-emitting elements 140*a*, 140*b*, and 140*c*, respectively, whereby the subpixels emit light of different colors. As the subpixels 110*a*, 110*b*, and 110*c*, subpixels of three colors of red (R), green (G), and blue (B) or subpixels of three colors of yellow (Y), cyan (C), and magenta (M) can be given, for example. Note that a coloring layer is referred to as a "color filter" in some cases.

The subpixel 110S includes the light-receiving element 140S.

FIG. 1A illustrates an example in which the subpixels 110*a*, 110*b*, and 110*c* are subpixels of three colors of red (R), green (G), and blue (B) and reference numerals R, G, B, and S are given to light-emitting or light receiving regions of light-emitting elements and a light-receiving element included in each pixel in order to distinguish the subpixels easily, but the subpixels 110*a*, 110*b*, and 110*c* are not limited to the subpixels of three colors of red (R), green (G), and blue (B).

The subpixels 110*a*, 110*b*, 110*c*, and 110S are arranged in a matrix. FIG. 1A illustrates a structure in which the subpixels 110*a*, the subpixels 110*b*, and the subpixels 110*c* are arranged in a stripe pattern. Note that the subpixel arrangement method is not limited to this, and another arrangement method such as an S-stripe arrangement, a delta arrangement, a Bayer arrangement, or a zigzag arrangement may be employed, or a PenTile arrangement, a diamond arrangement, or the like may be used.

As the light-emitting elements 140*a*, 140*b*, and 140*c*, an EL element such as an OLED (Organic Light Emitting Diode) or a QLED (Quantum-dot Light Emitting Diode) is preferably used. As examples of a light-emitting substance contained in the EL element, a substance that emits fluorescent light (a fluorescent material), a substance that emits phosphorescent light (a phosphorescent material), an inorganic compound (e.g., a quantum dot material), a substance exhibiting thermally activated delayed fluorescence (a thermally activated delayed fluorescence (TADF) material), and the like can be given. Since such a TADF material enables a short emission lifetime (excitation lifetime), an efficiency decrease of a light-emitting element in a high-luminance region can be inhibited.

The light-emitting element includes an EL layer between a pair of electrodes. In this specification and the like, one of the pair of electrodes may be referred to as a pixel electrode and the other may be referred to as a common electrode.

One electrode of the pair of electrodes included in the light-emitting element functions as an anode, and the other electrode functions as a cathode. The case where the pixel electrode functions as an anode and the common electrode functions as a cathode is described below as an example.

The light-emitting element in this embodiment can have a single structure or a tandem structure. The light-emitting element preferably has a single structure. When the light-emitting element has a single structure, driving power of the light-emitting element can be reduced. Furthermore, the manufacturing process of the light-emitting element can be simplified. Note that the structure example of the light-emitting element will be described later in Embodiment 2.

As the light-receiving element 140S, a pn photodiode or a pin photodiode can be used, for example. The light-receiving element 140S functions as a photoelectric conversion element that detects light incident on the light-receiving element 140S and generates charge. The amount of generated charge in the photoelectric conversion element is determined depending on the amount of incident light. It is particularly preferable to use an organic photodiode including a layer containing an organic compound as the light-receiving element 140S. An organic photodiode, which is easily made thin, lightweight, and large in area and has a high degree of freedom for shape and design, can be used in a variety of devices.

FIG. 1A also illustrates a connection electrode 111C that is electrically connected to a common electrode 113. The connection electrode 111C is supplied with a potential (e.g., an anode potential or a cathode potential) that is to be supplied to the common electrode 113. The connection electrode 111C is provided outside a display region where the light-emitting elements 140*a* and the like are arranged. In FIG. 1A, the common electrode 113 is denoted by the dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface shape, a top surface shape of the connection electrode 111C can have a band shape, an L shape, a U shape (a square bracket shape), a rectangular shape, or the like.

Figure 1B:
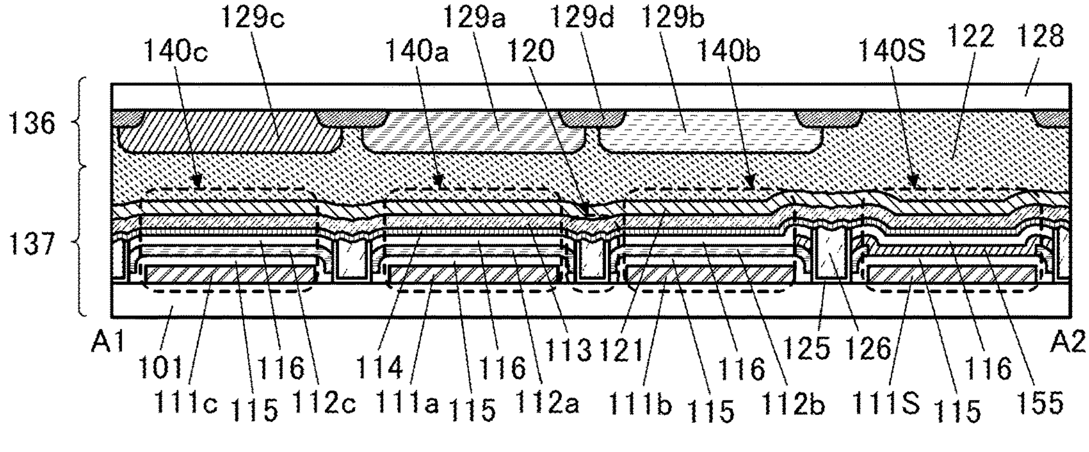
Figure 1C:
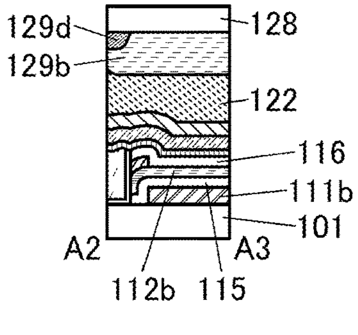
Figure 1D:
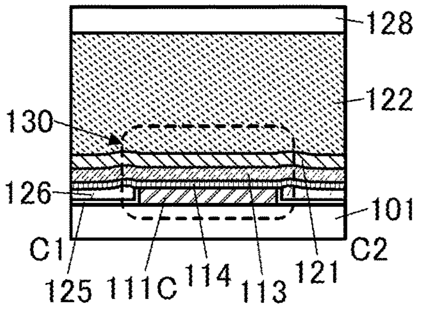

FIG. 1B, FIG. 1C, and FIG. 1D are schematic cross-sectional views taken along the dashed-dotted line A1-A2, the dashed-dotted line A2-A3, and the dashed-dotted line C1-C2 in FIG. 1A, respectively. FIG. 1B illustrates a schematic cross-sectional view of the light-emitting element 140*c*, the light-emitting element 140*b*, the light-emitting element 140*a*, and the light-receiving element 140S, and FIG. 1D illustrates a schematic cross-sectional view of the connection electrode 111C.

The display apparatus 100 illustrated in FIG. 1B includes a substrate 137 and a substrate 136. In FIG. 1B, the substrate 137 includes a layer 101, the light-emitting element 140*a*, the light-emitting element 140*b*, the light-emitting element 140*c*, the light-receiving element 140S, and a protective layer 121.

The layer 101 includes a transistor, for example.

The substrate 136 includes a substrate 128, the coloring layers 129*a*, 129*b*, and 129*c*, and a black matrix 129*d*.

A resin layer 122 is provided between the substrate 137 and the substrate 136. The resin layer 122 has a function of bonding the substrate 137 and the substrate 136.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

The coloring layer 129*a*, the coloring layer 129*b*, and the coloring layer 129*c* have functions of transmitting light of different colors from one another. For example, a wavelength range of light that the coloring layer 129*a* transmits is different from a wavelength range of light that the coloring layer 129*b* transmits. For example, a wavelength range of light that the coloring layer 129*b* transmits is different from a wavelength range of light that the coloring layer 129*c* transmits. For example, a wavelength range of light that the coloring layer 129*c* transmits is different from a wavelength range of light that the coloring layer 129*a* transmits. For example, the coloring layer 129*a* has a function of transmitting red light, the coloring layer 129*b* has a function of transmitting green light, and the coloring layer 129*c* has a function of transmitting blue light. Thus, the display apparatus 100 is capable of full-color display. Note that the coloring layer 129*a*, the coloring layer 129*b*, and the coloring layer 129*c* may each have a function of transmitting light of any of cyan, magenta, and yellow.

Here, the adjacent coloring layers 129 sometimes include an overlapping region in a region not overlapping with the light-emitting element 140, for example. When the coloring layers 129 that transmit light of different colors overlap with each other, the coloring layers 129 in the region where the coloring layers 129 overlap with each other can function as light-blocking layers. Thus, light emitted from the light-emitting element 140 can be inhibited from leaking to an adjacent subpixel. For example, light emitted from the light-emitting element 140*a* overlapping with the coloring layer 129*a* can be inhibited from entering the coloring layer 129*b*. Consequently, the contrast of images displayed on the display apparatus can be increased to achieve a display apparatus with high display quality.

Note that the adjacent coloring layers 129 may include no overlapping region. In that case, the black matrix 129*d* is preferably provided in a region not overlapping with the light-emitting element 140. The black matrix 129*d* can be provided on a surface of the substrate 128 on the resin layer 122 side, for example. The coloring layer 129 may be provided on a surface of the substrate 128 on the resin layer 122 side.

The black matrix is sometimes called a black layer.

In the subpixel 110*a*, the subpixel 110*b*, and the subpixel 110*c* in FIG. 1B, the coloring layers 129*a*, 129*b*, and 129*c* (hereinafter collectively called the coloring layer 129 in some cases) are provided to overlap with the light-emitting element 140*a*, the light-emitting element 140*b*, and the light-emitting element 140*c*. In addition, the subpixel 110S includes the light-receiving element 140S.

In FIG. 1B, the substrate 136 in which the coloring layers 129*a*, 129*b*, and 129*c* which have functions of transmitting light of different colors and the black matrix 129*d* are provided on the substrate 128 is bonded to the substrate 137 such that the light-emitting elements 140*a*, 140*b*, and 140*c* are positioned in the respective coloring layers, whereby the subpixel 110*a*, the subpixel 110*b*, and the subpixel 110*c* can emit light of different colors.

The subpixel may have a structure in which white light is extracted to the outside without having a coloring layer. In addition, the light-emitting layer may further include a subpixel configured to extract white light to the outside without having a coloring layer. Note that FIG. 1B illustrates an example in which the thicknesses of the coloring layers 129*a*, 129*b*, and 129*c* are the same, but the thicknesses are not limited to this; the thicknesses of the coloring layers 129*a*, 129*b*, and 129*c* are preferably adjusted as appropriate in accordance with the transmittance of the respective colors and may be different.

Figure 2:
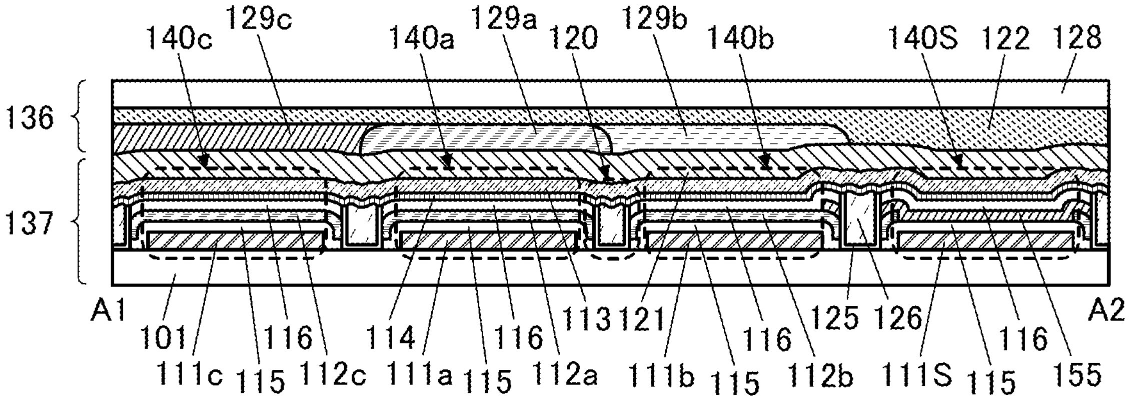
FIG. 2 is a diagram illustrating a structure example of a display apparatus.

In the structure illustrated in FIG. 2, the coloring layers 129*a*, 129*b*, and 129*c* are provided to overlap with the light-emitting elements 140*a*, 140*b*, and 140*c*, respectively. The resin layer 122 is provided between the substrate 128 and the coloring layers 129*a*, 129*b*, and 129*c*. In the structure illustrated in FIG. 1C, for example, each of the coloring layers 129*a*, 129*b*, and 129*c* includes a region in contact with a top surface of the protective layer 121 in some cases.

The positional alignment of the light-emitting elements 140 and the coloring layers 129 is easier in the case where the coloring layers 129 are formed over the protective layer 121 as in the structure illustrated in FIG. 2 than in the case where the coloring layers 129 are formed over the substrate 128, so that a display apparatus with extremely high resolution can be achieved.

The light-emitting element 140*a* includes a pixel electrode 111*a*, an organic layer 115, an organic layer 112*a*, an organic layer 116, an organic layer 114, and the common electrode 113. The light-emitting element 140*b* includes a pixel electrode 111*b*, the organic layer 115, the organic layer 112*b*, the organic layer 116, the organic layer 114, and the common electrode 113. The light-emitting element 140*c* includes a pixel electrode 111*c*, the organic layer 115, the organic layer 112*c*, the organic layer 116, the organic layer 114, and the common electrode 113. The light-emitting element 140S includes a pixel electrode 111S, the organic layer 115, the organic layer 155, the organic layer 116, the organic layer 114, and the common electrode 113. The organic layer 114 and the common electrode 113 are shared by the light-emitting element 140*a*, the light-emitting element 140*b*, the light-emitting element 140*c*, and the light-receiving element 140S. The organic layer 114 can also be referred to as a common layer.

Each of the organic layers 112*a*, 112*b*, and 112*c* included in the light-emitting elements 140*a*, 140*b*, and 140*c* contains a light-emitting organic compound. Each of the organic layers 112*a*, 112*b*, and 112*c* can be referred to as a light-emitting layer.

Each of the organic layers 112*a*, 112*b*, and 112*c* is preferably configured to emit white light. Here, the organic layer 112*a*, the organic layer 112*b*, and the organic layer 112*c* preferably contain the same material. That is, the island-shaped organic layer 112*a*, the island-shaped organic layer 112*b*, and the island-shaped organic layer 112*c* are preferably formed by patterning of a film formed in the same step.

The light-emitting layer is a layer containing a light-emitting substance. The light-emitting layer can contain one or more kinds of light-emitting substances. As the light-emitting substance, a substance that exhibits an emission color of blue, violet, bluish violet, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

The organic layer 155 included in the light-receiving element 140S contains a photoelectric conversion material having sensitivity in a wavelength range of visible light or infrared light. A wavelength range to which the photoelectric conversion material contained in the organic layer 155 is sensitive preferably includes one or more of the wavelength range of light emitted from the subpixel 110*a*, the wavelength range of light emitted from the subpixel 110*b*, and the wavelength range of light emitted from the subpixel 110*c*. Alternatively, a photoelectric conversion material having sensitivity to infrared light, which has a longer wavelength than light emitted from the subpixel 110*a* and the like, may be used. The organic layer 155 can also be referred to as an active layer or a photoelectric conversion layer.

Hereafter, in the description common to the light-emitting element 140*a*, the light-emitting element 140*b*, and the light-emitting element 140*c*, the term "light-emitting element 140" is used in some cases. In the same manner, in the description common to the components that are distinguished by alphabets, such as the organic layer 112*a*, the organic layer 112*b*, and the organic layer 112*c*, reference numerals without alphabets are sometimes used. For example, in the case of description common to the organic layer 112*a*, the organic layer 112*b*, and the organic layer 112*c*, the term "organic layer 112" is used for the description in some cases. In the description common to the pixel electrode 111*a*, the pixel electrode 111*b*, the pixel electrode 111*c*, and the pixel electrode 111S, the term "pixel electrode 111" is used in some cases.

In each light-emitting element, a stacked film positioned between the pixel electrode and the common electrode 113 can be referred to as an EL layer. In the light-receiving element 140S, a stacked film positioned between the pixel electrode 111S and the common electrode 113 can be referred to as a PD layer.

In each light-emitting element or the light-receiving element 140S, the organic layer 115 is positioned between the pixel electrode 111 and the organic layer 112 or the organic layer 155. The organic layer 116 is positioned between the organic layer 114 and the organic layer 112 or the organic layer 155. The organic layer 114 is positioned between the organic layer 116 and the common electrode 113.

The organic layer 115, the organic layer 116, and the organic layer 114 can each independently include one or more of an electron-injection layer, an electron-transport layer, an electron-blocking layer, a hole-blocking layer, a hole-injection layer, and a hole-transport layer. For example, it is possible to employ a structure in which the organic layer 115 includes a stacked-layer structure of a hole-injection layer and a hole-transport layer from the pixel electrode 111 side, the organic layer 116 includes an electron-transport layer, and the organic layer 114 includes an electron-injection layer. Alternatively, it is possible to employ a structure in which the organic layer 115 has a stacked-layer structure of an electron-injection layer and an electron-transport layer from the pixel electrode 111 side, the organic layer 116 includes a hole-transport layer, and the organic layer 114 includes a hole-injection layer.

Note that as for a layer positioned between a pair of electrodes of the light-emitting element or the light-receiving element 140S, such as the organic layer 112, the organic layer 114, the organic layer 115, the organic layer 116, or the organic layer 155, the name "organic layer" implies a "layer that constitutes an organic EL element or an organic photoelectric conversion element" and does not necessarily mean that an organic layer contains an organic compound. For example, a film not containing an organic compound but containing only an inorganic compound or an inorganic substance can be used for the organic layer 112, the organic layer 114, the organic layer 115, and the organic layer 116.

The pixel electrode 111*a*, the pixel electrode 111*b*, and the pixel electrode 111*c* are provided for the respective light-emitting elements. The common electrode 113 and the organic layer 114 are provided as continuous layers shared by the light-emitting elements and the light-receiving element 140S. A conductive film having a light-transmitting property with respect to visible light is used for either the respective pixel electrodes or the common electrode 113, and a conductive film having a reflective property is used for the other. When the pixel electrodes are light-transmitting electrodes and the common electrode 113 is a reflective electrode, a bottom-emission display apparatus can be obtained; in contrast, when the respective pixel electrodes are reflective electrodes and the common electrode 113 is a light-transmitting electrode, a top-emission display apparatus can be obtained. Note that when both the pixel electrodes and the common electrode 113 have a light-transmitting property, a dual emission display apparatus can be obtained.

The light-emitting elements preferably employ a micro-optical resonator (microcavity) structure. Therefore, one of the pair of electrodes of the light-emitting elements is preferably an electrode having properties of transmitting and reflecting visible light (transflective electrode), and the other is preferably an electrode having a property of reflecting visible light (reflective electrode). When the light-emitting elements have a microcavity structure, light obtained from the light-emitting layers can be resonated between the electrodes, whereby light emitted from the light-emitting elements can be intensified.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting elements. The visible light reflectance of the transflective electrode is higher than or equal to 10% and lower than or equal to 95%, preferably higher than or equal to 30% and lower than or equal to 80%. The visible light reflectance of the reflective electrode is higher than or equal to 40% and lower than or equal to 100%, preferably higher than or equal to 70% and lower than or equal to 100%. These electrodes preferably have a resistivity of $1\times10^{-2}$ $^{02}$ cm or lower.

As a material that forms the pair of electrodes (the pixel electrode and the common electrode) of the light-emitting element, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

A protective layer 121 is provided over the common electrode 113 so as to cover the light-emitting element 140*a*, the light-emitting element 140*b*, the light-emitting element 140*c*, and the light-receiving element 140S. The protective layer 121 has a function of preventing diffusion of impurities such as water into the light-emitting elements from above.

A slit 120 is provided between the light-emitting element and the light-receiving element 140S adjacent to each other or between two adjacent light-emitting elements. The slit 120 corresponds to a portion where the organic layer 115, the organic layer 116, and the organic layer 112 or the organic layer 155 positioned between the light-emitting element and the light-receiving element 140S adjacent to each other or between the two adjacent light-emitting elements are etched.

In the slit 120, an insulating layer 125 and a resin layer 126 are provided. The insulating layer 125 is provided along the sidewalls and bottom surface of the slit 120. The resin layer 126 is provided over the insulating layer 125 and has a function of filling a depressed portion positioned in the slit 120 and planarizing the top surface. The depressed portion of the slit 120 is filled with the resin layer 126 for planarization, whereby coverage with the organic layer 114, the common electrode 113, and the protective layer 121 can be improved.

The slit 120 can be formed at the same time as the formation of an opening portion for an external connection terminal such as the connection electrode 111C; thus, they can be formed without increasing the number of steps. Since the slit 120 includes the insulating layer 125 and the resin layer 126, an effect of preventing a short circuit between the pixel electrode 111 and the common electrode 113 is produced. The resin layer 126 has an effect of improving adhesion of the organic layer 114. That is, providing the resin layer 126 improves adhesion of the organic layer 114, so that film separation of the organic layer 114 can be inhibited.

The insulating layer 125 is provided in contact with a side surface of the organic layer (e.g., the organic layer 115); thus, a structure where the organic layer and the resin layer 126 are not in contact with each other can be obtained. When the organic layer and the resin layer 126 are in contact with each other, the organic layer might be dissolved by an organic solvent or the like included in the resin layer 126. In view of this, the insulating layer 125 is provided between the organic layer and the resin layer 126 as described in this embodiment, the side surface of the organic layer can be protected. Note that the slit 120 can have a structure that allows division of at least any one or more of a hole-injection layer, a hole-transport layer, an electron-blocking layer, a light-emitting layer, an active layer, a hole-blocking layer, an electron-transport layer, and an electron-injection layer.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, a metal oxide film such as an aluminum oxide film or a hafnium oxide film or an inorganic insulating film such as a silicon oxide film, which is formed by an ALD method is used for the insulating layer 125, whereby the insulating layer 125 can have few pinholes and an excellent function of protecting the EL layer.

Note that in this specification and the like, oxynitride refers to a material that contains more oxygen than nitrogen, and nitride oxide refers to a material that contains more nitrogen than oxygen. For example, in the case where silicon oxynitride is described, it refers to a material that contains more oxygen than nitrogen in its composition. In the case where silicon nitride oxide is described, it refers to a material that contains more nitrogen than oxygen in its composition.

The insulating layer 125 can be formed by a sputtering method, a CVD method, a PLD method, an ALD method, or the like. The insulating layer 125 is preferably formed by an ALD method with favorable coverage.

As the resin layer 126, an insulating layer containing an organic material can be suitably used. For the resin layer 126, an acrylic resin, a polyimide resin, an epoxy resin, an imide resin, a polyamide resin, a polyimide-amide resin, a silicone resin, a siloxane resin, a benzocyclobutene-based resin, a phenol resin, a precursor of any of these resins, or the like can be used, for example. For the resin layer 126, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin may be used.

A photosensitive resin can also be used for the resin layer 126. A photoresist may be used for the photosensitive resin. As the photosensitive resin, a positive photosensitive material or a negative photosensitive material can be used.

The resin layer 126 may be formed using a colored material (e.g., a material containing a black pigment) to have a function of blocking stray light from adjacent pixels and inhibiting color mixture.

A reflective film (e.g., a metal film containing one or more selected from silver, palladium, copper, titanium, aluminum, and the like) may be provided between the insulating layer 125 and the resin layer 126 so that light emitted from the light-emitting layer is reflected by the reflective film; hence, the function of increasing the light extraction efficiency may be added.

Although the top surface of the resin layer 126 is preferably as flat as possible, its surface has a gently curved surface shape in some cases. FIG. 1B and the like illustrate an example in which the top surface of the resin layer 126 has a wave shape with a depressed portion and a projected portion; however, one embodiment of the present invention is not limited thereto. For example, the top surface of the resin layer 126 may be a convex surface, a concave surface, or a flat surface.

As the protective layer 121, a stacked film of an inorganic insulating film and an organic insulating film can be used. For example, a structure in which an organic insulating film is interposed between a pair of inorganic insulating films is preferable. Furthermore, the organic insulating film preferably functions as a planarization film. With this, the top surface of the organic insulating film can be flat, and accordingly, coverage with the inorganic insulating film thereover is improved, leading to an improvement in barrier properties. Moreover, the top surface of the protective layer 121 is flat; therefore, when a component (e.g., a color filter, an electrode of a touch sensor, a lens array, or the like) is provided above the protective layer 121, the component can be less affected by an uneven shape caused by the lower structure.

The protective layer 121 can have, for example, a single-layer structure or a stacked-layer structure including at least an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

FIG. 1D illustrates a connection portion 130 in which the connection electrode 111C is electrically connected to the common electrode 113. In the connection portion 130, the common electrode 113 is provided over the connection electrode 111C with the organic layer 114 therebetween. The insulating layer 125 is provided in contact with a side surface of the connection electrode 111C, and the resin layer 126 is provided over the insulating layer 125.

Note that the organic layer 114 is not necessarily provided in the connection portion 130. In this case, in the connection portion 130, the common electrode 113 is provided over and in contact with the connection electrode 111C and the protective layer 121 is provided to cover the common electrode 113.

Figure 3A:
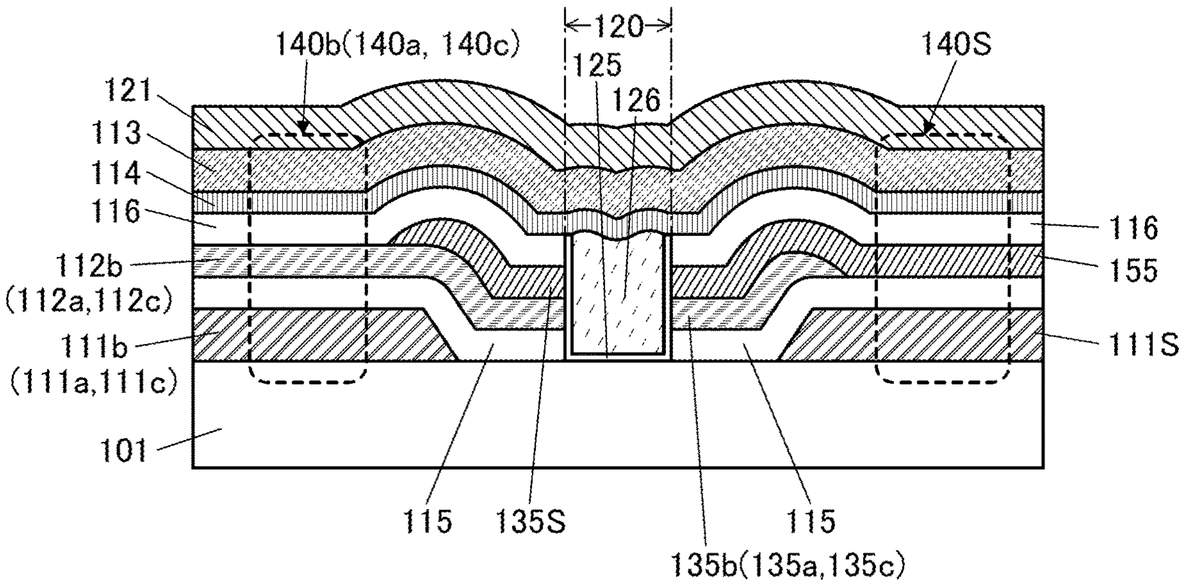
FIG. 3A and FIG. 3B are diagrams illustrating structure examples of a display apparatus.

Next, a preferable structure of the slit 120 and its vicinity is described in detail. FIG. 3A is a schematic cross-sectional view including part of the light-emitting element 140*b*, part of the light-receiving element 140S, and a region therebetween in FIG. 1B.

As illustrated in FIG. 3A, an end portion of the pixel electrode 111 preferably has a tapered shape. This can improve the step coverage with the organic layer 115 and the like. Note that in this specification and the like, an end portion of an object having a tapered shape indicates that the end portion of the object has a cross-sectional shape in which the angle between a surface of the object and a surface on which the object is formed is greater than 0° and less than 90° in a region of the end portion, and the thickness continuously increases from the end portion. The pixel electrode 111*b* and the like illustrated here have a single-layer structure but may include a plurality of layers stacked.

The organic layer 115 is provided to cover the pixel electrode 111*b*. The organic layer 115 is provided to cover the pixel electrode 111S. These organic layers 115 are formed by dividing a continuous film with the slit 120.

The organic layer 112*b* is provided to cover the organic layer 115 on the light-emitting element 140*b* side with respect to the slit 120. A layer 135*b* is provided over the organic layer 115 on the light-receiving element 140S side with respect to the slit 120. The layer 135*b* can also be referred to as a cut piece formed when part of a film to be the organic layer 112*b* is divided by the slit 120 and remains on the light-receiving element 140S side. The layer 135*b* and the organic layer 112*b* are provided to be apart from each other with the slit 120 therebetween.

The organic layer 155 is provided to cover the organic layer 115 on the light-receiving element 140S side with respect to the slit 120. A layer 135S is provided over the organic layer 112*b* on the light-emitting element 140*b* side with respect to the slit 120. The layer 135S can also be referred to as a cut piece formed when part of a film to be the organic layer 155 is divided by the slit 120 and remains on the light-emitting element 140*b* side. The layer 135S and the organic layer 155 are provided to be apart from each other with the slit 120 therebetween.

An end portion (a side surface) of the organic layer 112*b* and an end portion of the layer 135*b* face each other with the slit 120 therebetween. Similarly, an end portion of the organic layer 155 and an end portion of the layer 135S face each other with the slit 120 therebetween.

Note that one or both of the layer 135*b* and the layer 135S are not formed in some cases owing to the position and the width of the slit 120, the formation position of the organic layer 112*b*, the formation position of the organic layer 155, and the like. Specifically, the layer 135*b* is not formed in some cases in the case where the end portion of the organic layer 112*b* before the formation of the slit 120 overlaps with the formation position of the slit 120.

The organic layer 116 is provided to cover the organic layer 112*b* and the layer 135S. The organic layer 116 is provided to cover the organic layer 155 and the layer 135*b*. These organic layers 116 are formed by dividing a continuous film with the slit 120 like the organic layers 115.

The insulating layer 125 is provided inside the slit 120 and in contact with side surfaces of a pair of organic layers 115, a side surface of the organic layer 112*b*, a side surface of the organic layer 155, a side surface of the layer 135*b*, a side surface of the layer 135S, and side surfaces of a pair of organic layers 116. The insulating layer 125 is provided to cover the top surface of the layer 101.

The resin layer 126 is provided in contact with the top and side surfaces of the insulating layer 125. The resin layer 126 has a function of filling a depressed portion of the formation surface of the organic layer 114 for planarization.

The organic layer 114, the common electrode 113, and the protective layer 121 are formed in this order to cover the top surfaces of the organic layer 116, the insulating layer 125, and the resin layer 126. Note that the organic layer 114 is not necessarily provided when not needed.

Here, the layer 135*b* and the layer 135S are positioned at end portions of the film to be the organic layer 112*b* and the film to be the organic layer 155. In a deposition method using an FMM, the thickness of the organic film tends to be gradually smaller in a portion closer to its end portion; thus, the layer 135*b* and the layer 135S have portions with smaller thicknesses than the organic layer 112*b* and the organic layer 155. The layer 135*b* and the layer 135S may each have a thickness that is small enough not to be observed in a cross-sectional observation. Although the layer 135*b* or the layer 135S exists, the boundary between the layer 135*b* and the organic layer 155 or the boundary between the layer 135S and the organic layer 112*b* is difficult to observe in a cross-sectional observation in some cases.

In contrast, since a light-emitting compound (e.g., a fluorescent material, a phosphorescent material, or a quantum dot) is contained in each of the layer 135*b* and the layer 135S, light emission through photoluminescence can be obtained by irradiation with light such as ultraviolet light or visible light in a plan view. By observation of this light emission with an optical microscope or the like, it is possible to confirm the existence of the layer 135*b* and the layer 135S. Specifically, since the layer 135*b* and the organic layer 155 overlap with each other in a portion where the layer 135*b* is positioned, both of light from the layer 135*b* and light from the organic layer 155 can be observed when the portion is irradiated with ultraviolet light or the like. Furthermore, it can be confirmed that the layer 135*b* and the layer 135S contain the same materials as the organic layer 112*b* and the organic layer 155, respectively from the emission spectra, the wavelengths, the emission colors, and the like of light emitted from the layer 135*b* and the layer 135S. The compound contained in the layer 135*b* or the layer 135S can also be estimated in some cases.

The end portion of the layer 135*b* on the side opposite to the slit 120 extends to a region overlapping with the pixel electrode 111S. That is, the layer 135*b* includes a portion overlapping with both of the pixel electrode 111S and the organic layer 155. Similarly, the layer 135S includes a portion overlapping with both of the pixel electrode 111*b* and the organic layer 112*b*. Here, although an example is illustrated in which the organic layer 112*b* and the organic layer 155 are separately formed using an FMM and the other organic layers (the organic layer 115 and the organic layer 116) are formed as continuous films, one embodiment of the present invention is not limited thereto. For example, one or both of the organic layer 115 and the organic layer 116 may also be separately formed using an FMM. In that case, a cut piece of the organic layer 115 or the organic layer 116 remains in the vicinity of the slit 120 as in the layer 135*b* and the like in some cases.

The structure illustrated in FIG. 3A can be obtained by, for example, forming an organic film to be the organic layer 155 after the formation of the organic layer 112*b* in the process of manufacturing the display apparatus 100. On the other hand, the structure illustrated in FIG. 3B can be obtained by, for example, forming an organic film to be the organic layer 112*b* after the formation of the organic layer 155.

Figure 3B:
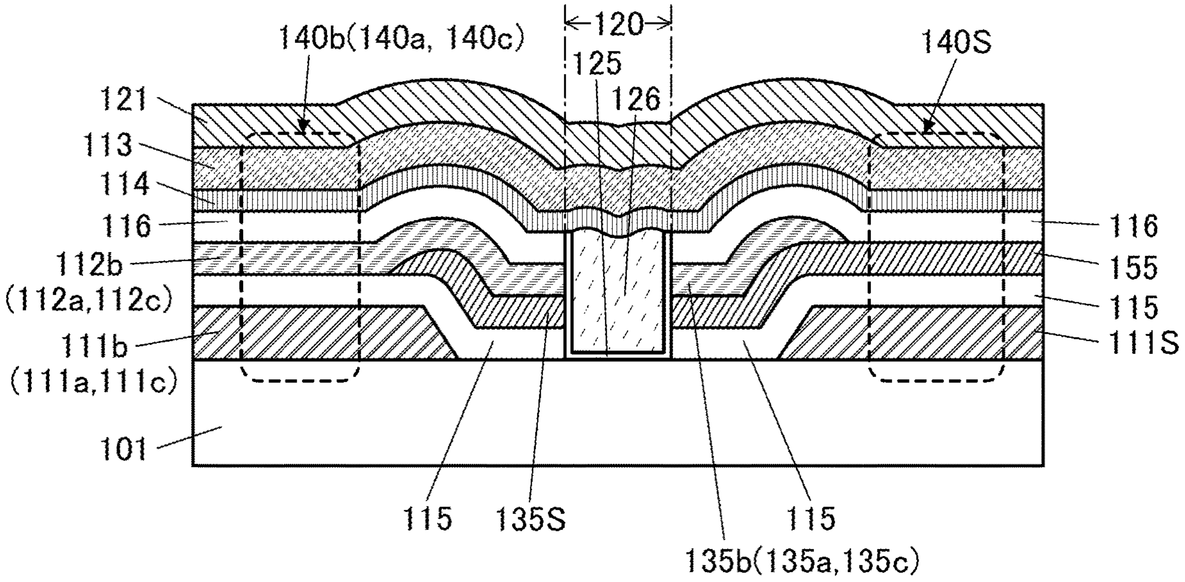

In FIG. 3B, the organic layer 155 is provided to cover the organic layer 115 on the light-receiving element 140S side with respect to the slit 120. The layer 135S is provided over the organic layer 115 on the light-emitting element 140*b* side with respect to the slit 120. The layer 135S can also be referred to as a cut piece formed when part of a film to be the organic layer 155 is divided by the slit 120 and remains on the light-emitting element 140*b* side. The layer 135S and the organic layer 155 are provided to be apart from each other with the slit 120 therebetween.

In FIG. 3B, the organic layer 112*b* is provided to cover the organic layer 115 on the light-emitting element 140*b* side with respect to the slit 120. The layer 135*b* is provided over the organic layer 155 on the light-receiving element 140S side with respect to the slit 120. The layer 135*b* can also be referred to as a cut piece formed when part of a film to be the organic layer 112*b* is divided by the slit 120 and remains on the light-receiving element 140S side. The layer 135*b* and the organic layer 112*b* are provided to be apart from each other with the slit 120 therebetween.

A region between the light-emitting element 140*b* and the light-receiving element 140S is described with reference to the enlarged views of FIG. 3A and FIG. 3B, and the same applies to a region between the light-emitting element 140*a* and the light-receiving element 140S and a region between the light-emitting element 140*c* and the light-receiving element 140S in some cases.

For example, in the case where the light-emitting element 140*a* and the light-receiving element 140S are provided in adjacent subpixels or in the case where the light-emitting element 140*a* and the light-receiving element 140S are provided near to each other, the display apparatus of one embodiment of the present invention in FIG. 3A and FIG. 3B may have a structure in which the light-emitting element 140*b*, the pixel electrode 111*b*, the organic layer 112*b*, and the layer 135*b* are replaced with the light-emitting element 140*a*, the pixel electrode 111*a*, the organic layer 112*a*, and the layer 135*a*. Here, the layer 135*a* and the organic layer 112*a* are separated by the slit 120. The layer 135*a* can be referred to as a cut piece formed when part of a film to be the organic layer 112*a* is divided by the slit 120 and remains on the light-receiving element 140S side.

For example, in the case where the light-emitting element 140*c* and the light-receiving element 140S are provided in adjacent subpixels or in the case where the light-emitting element 140*c* and the light-receiving element 140S are provided near to each other, the display apparatus of one embodiment of the present invention in FIG. 3A and FIG. 3B may have a structure in which the light-emitting element 140*b*, the pixel electrode 111*b*, the organic layer 112*b*, and the layer 135*b* are replaced with the light-emitting element 140*c*, the pixel electrode 111*c*, the organic layer 112*c*, and the layer 135*c*. Here, the layer 135*c* and the organic layer 112*c* are separated by the slit 120. The layer 135*c* can be referred to as a cut piece formed when part of a film to be the organic layer 112*c* is divided by the slit 120 and remains on the light-receiving element 140S side.

As the distance between adjacent subpixels is closer, the organic layers separated by the slit 120 have larger thicknesses in some cases.

Figure 4A:
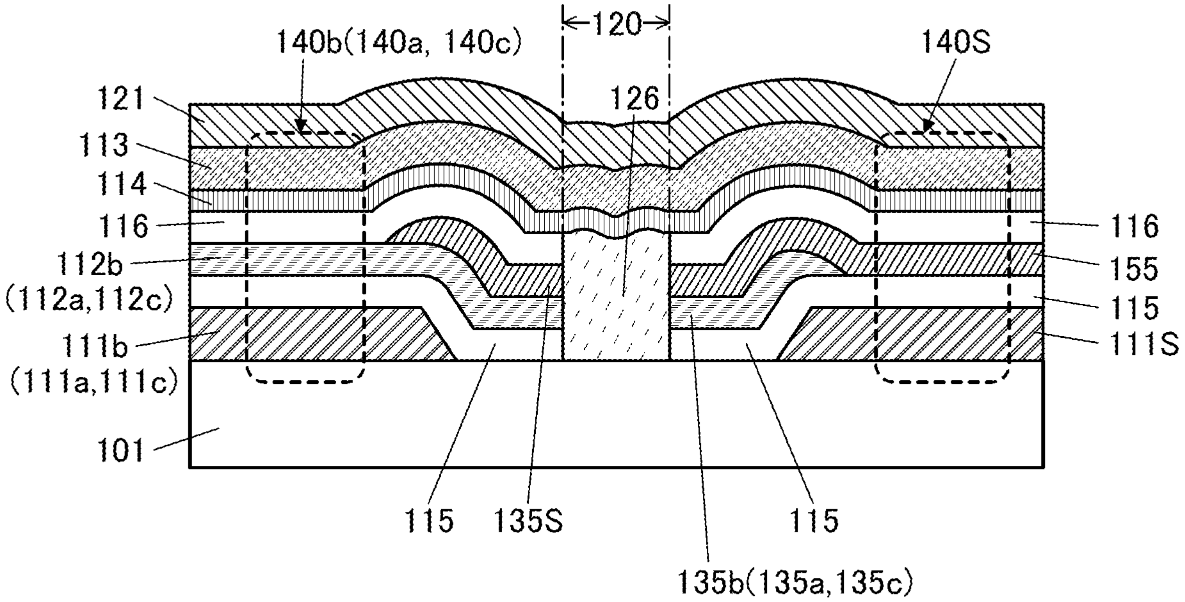
FIG. 4A and FIG. 4B are diagrams illustrating structure examples of a display apparatus.
Figure 4B:
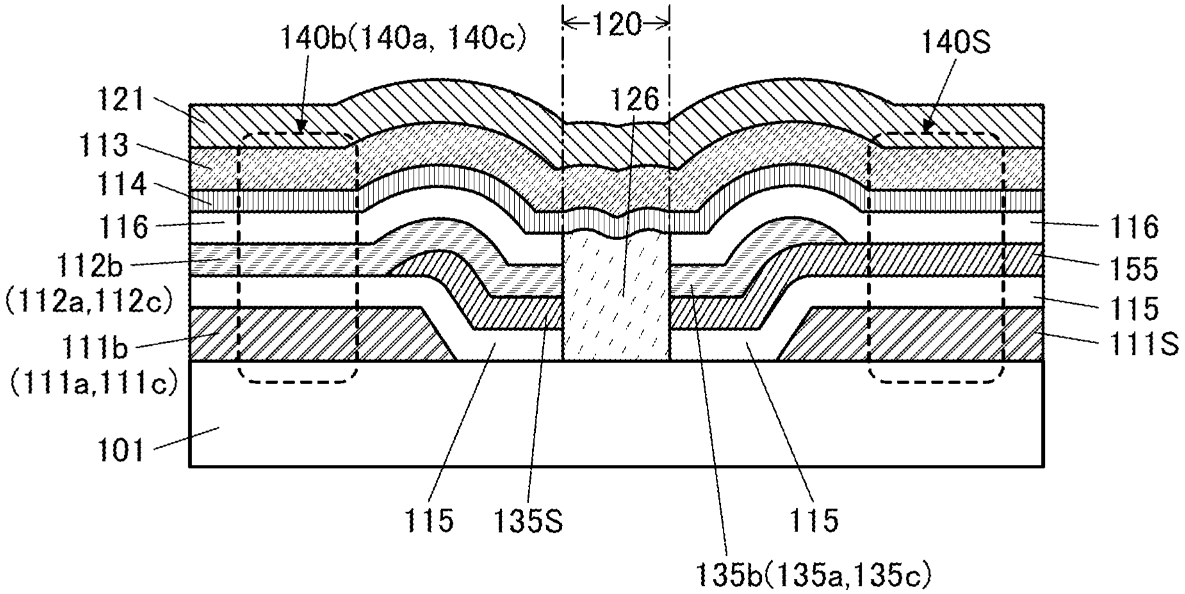

FIG. 4A and FIG. 4B are schematic cross-sectional views not including the insulating layer 125. In FIG. 4A and FIG. 4B, the resin layer 126 is provided in contact with the side surfaces of the pair of organic layers 115, the side surface of the organic layer 112*b*, the side surface of the organic layer 155, the side surface of the layer 135*b*, the side surface of the layer 135S, and the side surfaces of the pair of organic layers 116.

In this case, part of the EL layer or part of the PD layer is dissolved by a solvent used for forming a film to be the resin layer 126 in some cases. Therefore, water or alcohol such as ethyl alcohol, methyl alcohol, isopropyl alcohol (IPA), or glycerin is preferably used as the solvent for the resin layer 126 in the case where the insulating layer 125 is not provided. Note that without limitation to this, a solvent that does not dissolve or does not easily dissolve the EL layer and the PD layer may be used.

In this manner, the display apparatus of one embodiment of the present invention can have a structure in which an insulator covering an end portion of the pixel electrode is not provided. In other words, the display apparatus can have a structure in which an insulator is not provided between the pixel electrode and the EL layer. With such a structure, light can be efficiently extracted from the EL layer, leading to extremely low viewing angle dependence. For example, in the display apparatus of one embodiment of the present invention, the viewing angle (the maximum angle with a certain contrast ratio maintained when the screen is seen from an oblique direction) can be greater than or equal to 100° and less than 180°, preferably greater than or equal to 150° and less than or equal to 170°. Note that the viewing angle refers to that in both the vertical direction and the horizontal direction. The display apparatus of one embodiment of the present invention can have improved viewing angle dependence and high image visibility.

Manufacturing Method Example

An example of a manufacturing method of the display apparatus of one embodiment of the present invention will be described below with reference to drawings. Here, description is made using the display apparatus described in FIG. 1A to FIG. 1C as an example. FIG. 5A to FIG. 7D are schematic cross-sectional views in steps of the manufacturing method example of the display apparatus described below as an example.

Note that thin films included in the display apparatus (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. An example of the thermal CVD method is a metal organic chemical vapor deposition (MOCVD: Metal Organic CVD) method.

Alternatively, thin films included in the display apparatus (insulating films, semiconductor films, conductive films, or the like) can be formed by a method such as spin coating, dipping, spray coating, ink-jetting, dispensing, screen printing, offset printing, a doctor knife method, a slit coater, a roll coater, a curtain coater, or a knife coater.

The thin films included in the display apparatus can be processed by a photolithography method or the like. Besides, a nanoimprinting method, a sandblasting method, a lift-off method, or the like may be used for the processing of the thin films. Alternatively, island-shaped thin films may be directly formed by a deposition method using a shielding mask such as a metal mask.

There are the following two typical methods of a photolithography method. In one of the methods, a resist mask is formed over a thin film that is to be processed, the thin film is processed by etching or the like, and then the resist mask is removed. In the other method, a photosensitive thin film is deposited and then processed into a desired shape by light exposure and development.

For light used for light exposure in a photolithography method, for example, it is possible to use light with the i-line (wavelength: 365 nm), light with the g-line (wavelength: 436 nm), light with the h-line (wavelength: 405 nm), or combined light of any of them. Alternatively, ultraviolet light, KrF laser light, ArF laser light, or the like can be used. Light exposure may be performed by liquid immersion exposure technique. For light used for the light exposure, extreme ultraviolet (EUV) light, X-rays, or the like may be used. Furthermore, instead of light used for the light exposure, an electron beam can also be used. It is preferable to use extreme ultraviolet light, X-rays, or an electron beam because extremely minute processing can be performed. Note that a photomask is not needed when light exposure is performed by scanning with a beam such as an electron beam.

For etching of the thin film, a dry etching method, a wet etching method, a sandblast method, or the like can be used.

[Preparation for Layer 101]

For the layer 101, a substrate having at least heat resistance high enough to withstand the following heat treatment can be used. In the case where an insulating substrate is used for the layer 101, a glass substrate, a quartz substrate, a sapphire substrate, a ceramic substrate, an organic resin substrate, or the like can be used. Alternatively, a single crystal semiconductor substrate or a polycrystalline semiconductor substrate using silicon or silicon carbide as a material, a compound semiconductor substrate of silicon germanium or the like, or a semiconductor substrate such as an SOI substrate can be used.

For the layer 101, it is particularly preferable to use the semiconductor substrate or the insulating substrate where a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of Pixel Electrode 111 and Organic Layer 115]

A conductive film is formed over the layer 101, and part of the conductive film is removed by etching, whereby the pixel electrode 111 is formed.

Figure 5A:
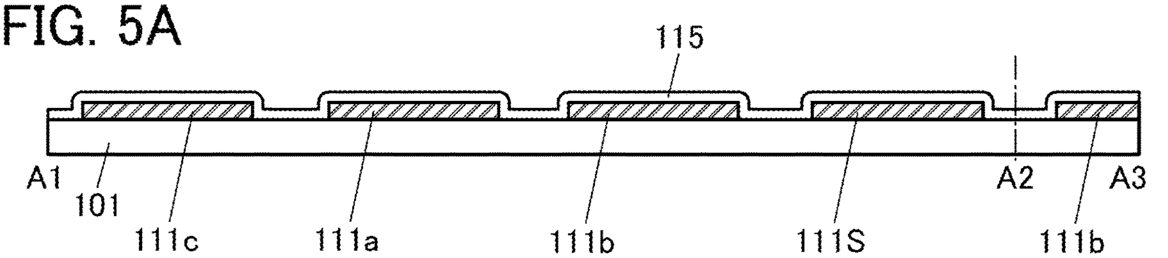
FIG. 5A to FIG. 5E are diagrams illustrating an example of a method of manufacturing a display apparatus.

Next, the organic layer 115 is deposited over the pixel electrode 111 (FIG. 5A). The organic layer 115 is preferably deposited without using an FMM.

Note that the organic layer 115 may be separately formed using an FMM. In that case, the description of the organic layer 112*a* and the like below can be referred to.

The organic layer 115 can be preferably formed by a vacuum evaporation method. Note that without limitation to this, the organic layer 115 can be formed by a sputtering method, an inkjet method, or the like. The above-described deposition method can be used as appropriate.

[Formation of Organic Layer 112*a*, Organic Layer 112*b*, Organic Layer 112*c*, and Organic Layer 155]

Next, an organic layer 112W is formed over the organic layer 115. The organic layer 112W is processed in a process to be described later, whereby the organic layer 112*a*, the organic layer 112*b*, and the organic layer 112*c* can be obtained. The organic layer 112*a* is formed over the organic layer 115 to include a region overlapping with the pixel electrode 111*a*. The organic layer 112*b* is formed over the organic layer 115 to include a region overlapping with the pixel electrode 111*b*. The organic layer 112*c* is formed over the organic layer 115 to include a region overlapping with the pixel electrode 111*c*.

The organic layer 112W is preferably formed by a vacuum evaporation method using an FMM. Note that the island-shaped organic layer 112W may be formed by a sputtering method using an FMM or an inkjet method.

Figure 5B:
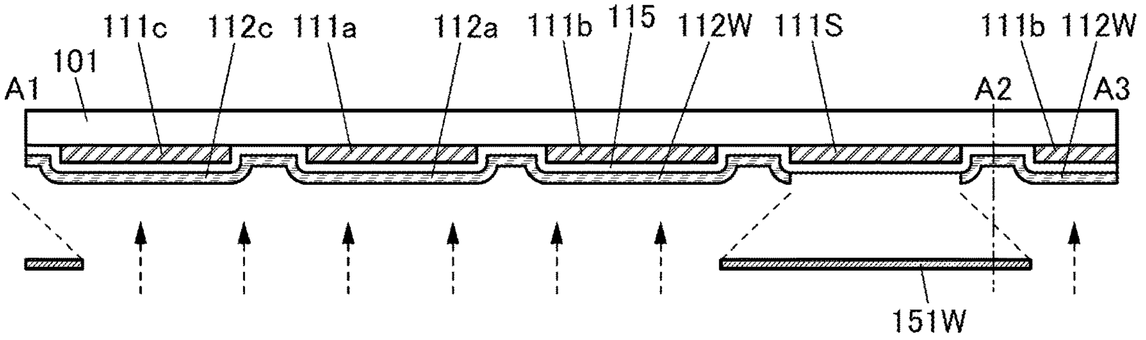

FIG. 5B illustrates a state in which the organic layer 112W is formed through an FMM 151W. In one embodiment of the present invention, the organic layer 112*a*, the organic layer 112*b*, and the organic layer 112*c* are formed by patterning a film formed in the same step, here, the organic layer 112W.

The FMM 151W has a function of a mask for forming an opening in a region in a light-emitting element where an organic layer is to be provided and shielding a region to be a light-receiving element, for example. FIG. 5B illustrates a state where film formation is performed under a condition that the substrate is inverted so that a film formation surface faces downward, i.e., film formation is performed with a face-down system.

By shortening the distance between pixel electrodes, the light-emitting elements and the light-receiving elements can be arranged with high density. At this time, the organic layer 112W is sometimes formed to overlap with the pixel electrode 111S of an adjacent pixel. In the display apparatus of one embodiment of the present invention, by providing the slit 120, a leakage path between the organic layer 112 included in a subpixel where a light-emitting element is provided and the organic layer 155 included in a subpixel which is adjacent to the subpixel and in which a light-receiving element is provided can be divided.

In an evaporation method or the like using an FMM, an area wider than an opening pattern of the FMM is subjected to evaporation in many cases. Thus, as indicated by a dashed line in FIG. 5B, the organic layer 112W can be formed in a wider area than an opening pattern of the FMM 151W. In the example illustrated in FIG. 5C, the organic layer 112W is formed also over the pixel electrode 111S even though the pixel electrode 111S that is a pixel electrode of a light-receiving element and an opening portion of the FMM 151W do not overlap with each other.

Figure 5C:
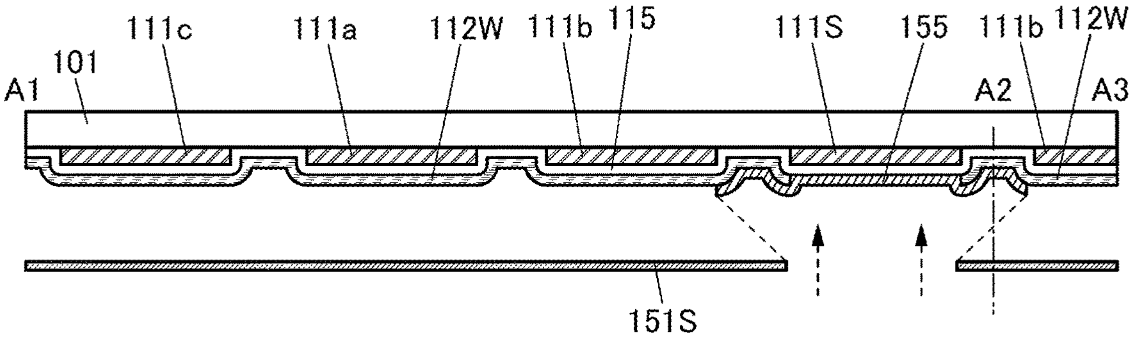

Next, the organic layer 155 is formed so as to overlap with the pixel electrode 111S with use of the FMM 151S (FIG. 5C). Here, the organic layer 155 extends to the outside of the pixel electrode 111S to be located also over the adjacent pixel electrodes 111*b*. As a result, a portion where the organic layer 155 is stacked is formed over the organic layer 112W.

Note that although the organic layer 112W and the organic layer 155 are formed in this order here, the formation order is not limited thereto.

[Formation of Organic Layer 116]

Figure 5D:
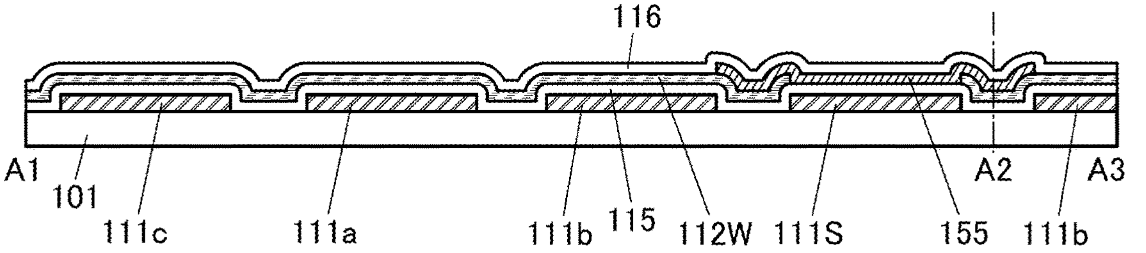

Next, the organic layer 116 is formed to cover the organic layer 112W and the organic layer 155 (FIG. 5D). The organic layer 116 can be formed in a manner similar to that of the organic layer 115.

[Formation of Sacrificial Film 144]

Subsequently, a sacrificial film 144 is formed to cover the organic layer 116.

As the sacrificial film 144, it is possible to use a film highly resistant to etching treatment performed on the organic layer 115, the organic layer 112, the organic layer 155, and the organic layer 116, i.e., a film having high etching selectivity. Furthermore, as the sacrificial film 144, it is possible to use a film having high etching selectivity with respect to a sacrificial film such as a sacrificial film 146 described later. Moreover, as the sacrificial film 144, it is particularly preferable to use a film that can be removed by a wet etching method less likely to cause damage to the organic layer 115, the organic layer 112W, the organic layer 155, and the organic layer 116.

As the sacrificial film 144, for example, an inorganic film such as a metal film, an alloy film, a metal oxide film, a semiconductor film, an organic insulating film, or an inorganic insulating film can be suitably used. The sacrificial film 144 can be formed by any of a variety of deposition methods such as a sputtering method, an evaporation method, a CVD method, and an ALD method.

Specifically, the sacrificial film 144, which is directly formed on the organic layer 116, is preferably formed by an ALD method that gives less deposition damage to a formation layer.

For the sacrificial film 144, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

Alternatively, for the sacrificial film 144, a metal oxide such as an indium gallium zinc oxide (In—Ga—Zn oxide, also referred to as IGZO) can be used. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon or the like can also be used.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) can be employed instead of gallium. Specifically, M is preferably one or more kinds selected from gallium, aluminum, and yttrium.

Alternatively, for the sacrificial film 144, oxide such as aluminum oxide, hafnium oxide, or silicon oxide, nitride such as silicon nitride or aluminum nitride, or oxynitride such as silicon oxynitride can be used. Such an inorganic insulating material can be formed by a deposition method such as a sputtering method, a CVD method, or an ALD method.

Alternatively, for the sacrificial film 144, a material that can be dissolved in a solvent chemically stable with respect to at least the uppermost organic layer 116 of the EL layer may be used. Specifically, a material that can be dissolved in water or alcohol can be suitably used for the sacrificial film 144. In deposition of the sacrificial film 144, it is preferable that application of such a material dissolved in a solvent such as water or alcohol be performed by a wet deposition method and then heat treatment for evaporating the solvent be performed. In that case, the heat treatment is preferably performed in a reduced-pressure atmosphere, in which case the solvent can be removed at a low temperature in a short time, so that thermal damage to the EL layer can be reduced.

Examples of the wet deposition methods that can be used for formation of the sacrificial film 144 include spin coating, dipping, spray coating, ink-jetting, dispensing, screen printing, offset printing, a doctor knife method, slit coating, roll coating, curtain coating, and knife coating.

For the sacrificial film 144, an organic resin such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used. A fluorine resin such as perfluoro polymer may be used for the sacrificial film 144 and the sacrificial film 146.

For example, an organic film (e.g., a PVA film) formed by an evaporation method or any of the above wet deposition methods can be used as the sacrificial film 144, and an inorganic film (e.g., a silicon oxide film or a silicon nitride film) formed by a sputtering method can be used as the sacrificial film 146.

[Formation of Sacrificial Film 146]

Next, the sacrificial film 146 is formed over the sacrificial film 144.

The sacrificial film 146 is a film used for a hard mask when the sacrificial film 144 is etched later. In a later step of processing the sacrificial film 146, the sacrificial film 144 is exposed. Thus, the combination of films capable of having high etching selectivity therebetween is selected for the sacrificial film 144 and the sacrificial film 146. It is thus possible to select a film that can be used for the sacrificial film 146 depending on an etching condition of the sacrificial film 144 and an etching condition of the sacrificial film 146.

A material of the sacrificial film 146 can be selected from a variety of materials depending on an etching condition of the sacrificial film 144 and an etching condition of the sacrificial film 146. For example, any of the films that can be used for the sacrificial film 144 can be used.

For example, as the sacrificial film 146, an oxide film can be used. Typically, a film of oxide or a film of oxynitride such as silicon oxide, silicon oxynitride, aluminum oxide, aluminum oxynitride, hafnium oxide, or hafnium oxynitride can also be used.

As the sacrificial film 146, a film of nitride can be used, for example. Specifically, it is possible to use nitride such as silicon nitride, aluminum nitride, hafnium nitride, titanium nitride, tantalum nitride, tungsten nitride, gallium nitride, or germanium nitride.

For example, it is preferable that an inorganic insulating material such as aluminum oxide, hafnium oxide, or silicon oxide formed by an ALD method be used for the sacrificial film 144, and a metal oxide containing indium such as an indium gallium zinc oxide (an In—Ga—Zn oxide, also referred to as IGZO) formed by a sputtering method be used for the sacrificial film 146. Alternatively, it is preferable to use a metal such as tungsten, molybdenum, copper, aluminum, titanium, or tantalum or an alloy containing the metal for the sacrificial film 146.

Alternatively, as the sacrificial film 146, an organic film that can be used for the organic layer 115, the organic layer 112, the organic layer 155, the organic layer 116, and the like may be used. For example, the same film as the organic film that is used for the organic layer 115, the organic layer 112, the organic layer 155, or the organic layer 116 can be used for the sacrificial film 146. The use of such an organic film is preferable, in which case the deposition apparatus for the sacrificial film 146 can be used for the organic layer 115, the organic layer 112, the organic layer 155, the organic layer 116, and the like. In addition, when the organic layer 115, the organic layer 112, the organic layer 155, the organic layer 116, and the like are etched using a layer to be a sacrificial layer as a mask, the organic film can be removed at the same time, so that the process can be simplified.

[Formation of Resist Mask 143]

Figure 5E:
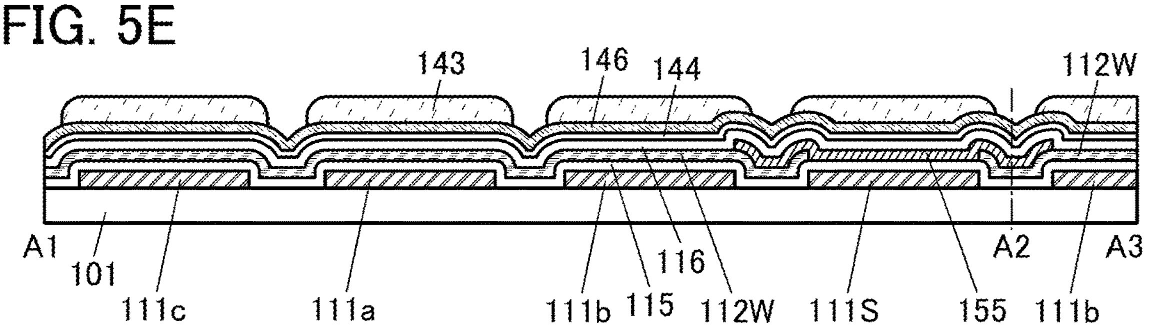

Then, a resist mask 143 is formed over the sacrificial film 146 in a position overlapping with the pixel electrode 111*a*, the pixel electrode 111*b*, the pixel electrode 111*c*, and the pixel electrode 111S (FIG. 5E).

For the resist mask 143, a resist material containing a photosensitive resin such as a positive type resist material or a negative type resist material can be used.

Here, in the case where the sacrificial film 146 is not provided and the resist mask 143 is formed over the sacrificial film 144, if a defect such as a pinhole exists in the sacrificial film 144, there is a risk of dissolving the organic layer 115, the organic layer 112, the organic layer 155, the organic layer 116, and the like due to a solvent of the resist material. Such a defect can be prevented by using the sacrificial film 146.

Note that in the case where a material which does not dissolve the organic layer 115, the organic layer 112, the organic layer 155, and the organic layer 116 is used for a solvent of the resist material, for example, the resist mask 143 may be formed directly over the sacrificial film 144 without using the sacrificial film 146 in some cases.

[Etching of Sacrificial Film 146]

Next, part of the sacrificial film 146 that is not covered by the resist mask 143 is removed by etching, so that a sacrificial layer 147 is formed.

In the etching of the sacrificial film 146, an etching condition with high selectivity is preferably employed so that the sacrificial film 144 is not removed by the etching. Either wet etching or dry etching can be performed for the etching of the sacrificial film 146; with use of dry etching, a reduction in a pattern of the sacrificial layer 147 can be inhibited.

[Removal of Resist Mask 143]

Next, the resist mask 143 is removed.

The removal of the resist mask 143 can be performed by wet etching or dry etching. It is particularly preferable to perform dry etching (also referred to as plasma ashing) using an oxygen gas as an etching gas to remove the resist mask 143.

In that case, the removal of the resist mask 143 is performed in a state where the organic layer 116 is covered by the sacrificial film 144; thus, the organic layer 115, the organic layer 112, the organic layer 155, and the organic layer 116 are less likely to be affected by the removal. Specifically, when the organic layer 115, the organic layer 112, the organic layer 155, and the organic layer 116 are exposed to oxygen, the electrical characteristics are adversely affected in some cases; therefore, it is preferable that the organic layer 115, the organic layer 112, the organic layer 155, and the organic layer 116 be covered by the sacrificial film 144 when etching using an oxygen gas, such as plasma ashing, is performed. Even in the case where the resist mask 143 is removed by wet etching, the organic layer 116 and the like can be prevented from being dissolved because the organic layer 116 and the like are not exposed to a chemical solution.

[Etching of Sacrificial Film 144]

Figure 6A:
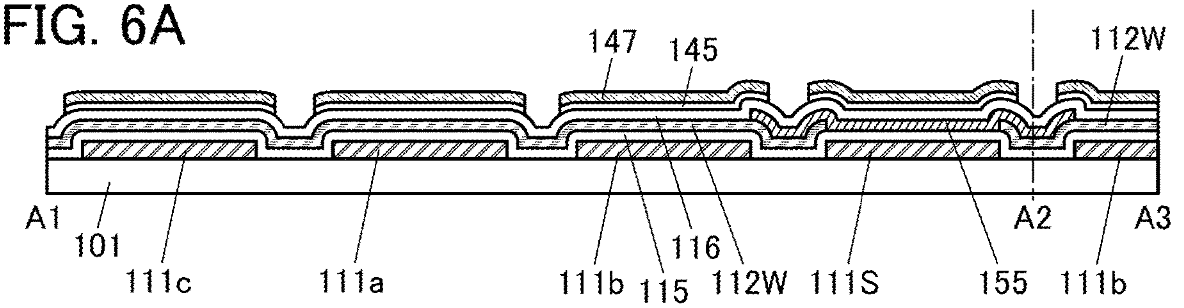
FIG. 6A to FIG. 6E are diagrams illustrating an example of a method of manufacturing a display apparatus.

Next, part of the sacrificial film 144 is removed by etching with use of the sacrificial layer 147 as a hard mask, so that the sacrificial layer 145 is formed (FIG. 6A).

Either wet etching or dry etching can be performed for the etching of the sacrificial film 144; the use of dry etching is preferable, in which case a reduction in a pattern can be inhibited.

[Etching of Organic Layer 116, Organic Layer 112W, Organic Layer 155, and Organic Layer 115]

Next, part of the organic layer 116, part of the organic layer 112W, part of the organic layer 155, and part of the organic layer 115, which are not covered with the sacrificial layer 145, are removed by etching, so that the slit 120 is formed. Part of the organic layer 112W is removed by the etching for forming the slit 120, so that the organic layer 112*a*, the organic layer 112*b*, and the organic layer 112*c* are formed.

At this time, part of the organic layer 112W and part of the organic layer 155 are divided by etching, whereby the layer 135R, the layer 135G, and a layer 135B which are cut pieces of the organic layer 112W and the layer 135S that is a cut piece of the organic layer 155 are formed in some cases.

Specifically, for the etching of the organic layer 116, the organic layer 112, the organic layer 155, and the organic layer 115, it is preferable to perform dry etching using an etching gas that does not contain oxygen as its main component. This can inhibit the alteration of the organic layer 116, the organic layer 112, the organic layer 155, and the organic layer 115 to achieve a highly reliable display apparatus. Examples of the etching gas that does not contain oxygen as its main component include $CF_4$, $C_4F_8$, $SF_6$, $CHF_3$, $Cl_2$, $H_2O$, $BCl_3$, $H_2$, and a noble gas such as He. Alternatively, a mixed gas of the above gas and a dilute gas that does not contain oxygen can be used for the etching gas.

Note that etching of the organic layer 116, the organic layer 112, the organic layer 155, and the organic layer 115 are not limited to the above and may be performed by dry etching using another gas or wet etching.

In addition, when dry etching using, as an etching gas, an oxygen gas or a mixed gas containing an oxygen gas is used for the etching of the organic layer 116, the organic layer 112, the organic layer 155, and the organic layer 115, the etching rate can be increased. Thus, etching under a low-power condition can be performed while the etching rate is kept adequately high; hence, damage due to the etching can be reduced. Furthermore, a defect such as attachment of a reaction product generated at the etching can be inhibited. For example, a mixed gas obtained by adding an oxygen gas to the etching gas not containing oxygen as its main component can be used as the etching gas.

The layer 101 is exposed when the organic layer 116, the organic layer 112, the organic layer 155, and the organic layer 115 are etched. An insulating layer is preferably formed on a top surface of the layer 101, for example. The insulating layer includes an exposed region at the top surface of the layer 101, for example. It is preferable to use a film highly resistant to etching of the organic layer 115 as the insulating layer. Note that at the time of etching the organic layer 115, an upper portion of the insulating layer is etched and a portion not covered with the organic layer 115 is thinned in some cases.

Note that at the time of etching of the organic layer 116, the organic layer 112, the organic layer 155, and the organic layer 115, the sacrificial layer 147 may also be etched at the same time. The organic layer 116, the organic layer 112, the organic layer 155, or the organic layer 115, and the sacrificial layer 147 are preferably etched by the same treatment because the process can be simplified to reduce the manufacturing cost of the display apparatus.

[Removal of Sacrificial Layer]

Figure 6B:
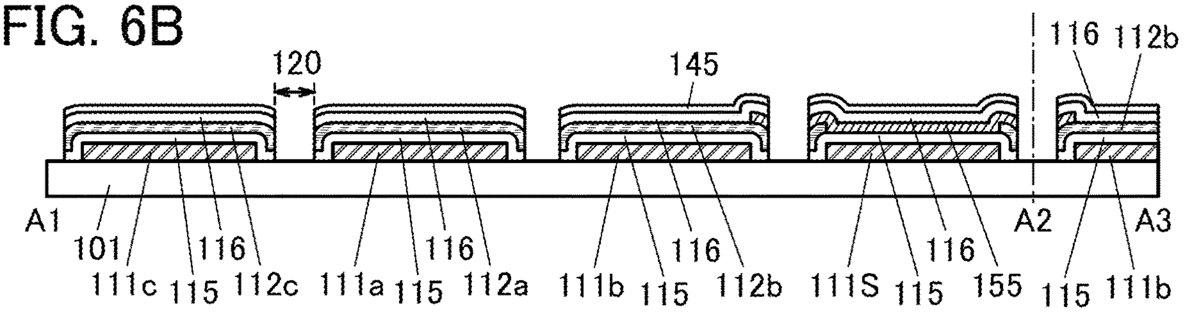

Next, the sacrificial layer 147 is removed, so that the top surface of the sacrificial layer 145 is exposed (FIG. 6B). At this time, the sacrificial layer 145 preferably remains. Note that the sacrificial layer 147 is not necessarily removed at this time.

[Formation of Insulating Film 125*f*]

Subsequently, an Insulating Film 125*f* is Formed to Cover the Sacrificial Layer 145 and the Slit 120.

The insulating film 125*f* functions as a barrier layer that prevents diffusion of impurities such as water into the EL layer. The insulating film 125*f* is preferably formed by an ALD method with excellent step coverage so as to suitably cover a side surface of the EL layer.

It is preferable that the insulating film 125*f* be formed using the same film as the sacrificial layer 145 because they can be etched at the same time in a later step. For example, an inorganic insulating material such as aluminum oxide, hafnium oxide, or silicon oxide, which is formed by an ALD method, is preferably used for the insulating film 125*f* and the sacrificial layer 145.

Note that the materials that can be used for the insulating film 125*f* are not limited to this, and the above-described materials that can be used for the sacrificial film 144 can be used as appropriate.

[Formation of Resin Layer 126]

Figure 6C:
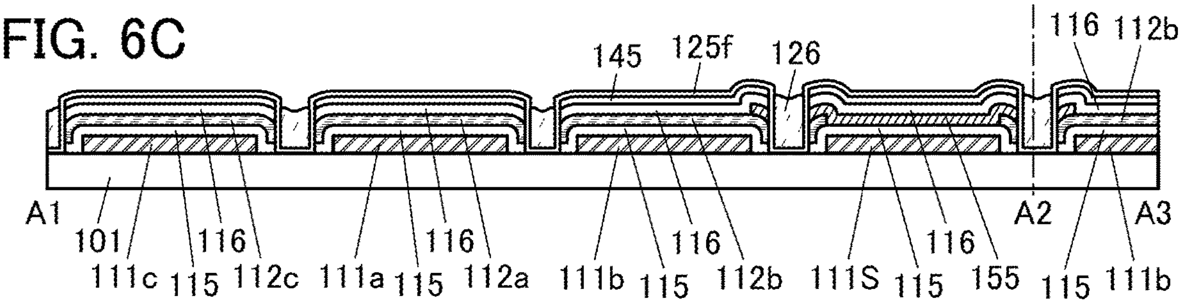

Next, the resin layer 126 is formed in the region overlapping with the slit 120 (FIG. 6C). The resin layer 126 can be formed by a method similar to that of the resin layer 163. For example, the resin layer 126 can be formed by forming a photosensitive resin, and then performing light exposure and development. The resin layer 126 may be formed by forming a resin over the entire surface, and then etching part of the resin by ashing or the like.

Here, an example in which the resin layer 126 is formed to have the same width as the slit 120 is illustrated.

[Etching of Insulating Film 125*f* and Sacrificial Layer 145]

Figure 6D:
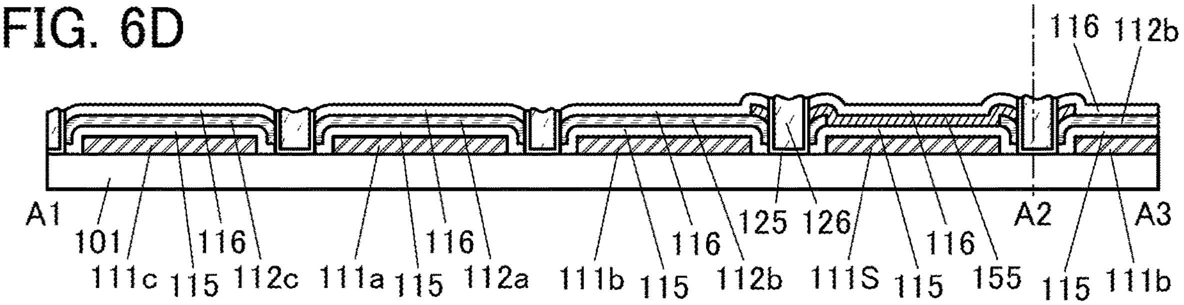

Next, portions of the insulating film 125*f* and the sacrificial layer 145 not covered with the resin layer 126 are removed by etching to expose the top surface of the organic layer 116. In this manner, the insulating layer 125 and the sacrificial layer 145 are formed in a region covered with the resin layer 126 (FIG. 6D).

The insulating film 125*f* and the sacrificial layer 145 are preferably etched in the same step. It is particularly preferable that the etching of the sacrificial layer 145 be performed by wet etching that gives less etching damage to the organic layer 116. For example, wet etching using an aqueous solution of tetramethylammonium hydroxide (TMAH), diluted hydrofluoric acid, oxalic acid, phosphoric acid, acetic acid, nitric acid, or a mixed solution of any of these acids is preferably performed.

Alternatively, an organic material may be used for one or both of the insulating film 125*f* and the sacrificial layer 145. For example, as the organic material, a material that can be dissolved in a solvent chemically stable with respect to at least the uppermost film of the light-emitting layer may be used. In particular, it is preferable to remove the organic material by being dissolved in a solvent such as water or alcohol. For the alcohol in which the sacrificial film 125*f* or the sacrificial layer 145 can be dissolved, any of various alcohols such as ethyl alcohol, methyl alcohol, isopropyl alcohol (IPA), and glycerin can be used.

After the insulating film 125*f* and the sacrificial layer 145 are removed, drying treatment is preferably performed to remove water contained in the organic layer 115, the organic layer 112, the organic layer 155, the organic layer 116, and the like and water adsorbed on the surfaces thereof. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

By removing the insulating film 125*f* and the sacrificial layer 145, the top surface of the connection electrode 111C is exposed.

[Formation of Organic Layer 114]

Next, the organic layer 114 is formed to cover the organic layer 116, the insulating layer 125, the sacrificial layer 145, the resin layer 126, and the like.

The organic layer 114 can be formed in a manner similar to that of the organic layer 115 or the like. In the case where the organic layer 114 is formed by an evaporation method, the organic layer 114 may be formed using a shielding mask so as not to be formed over the connection electrode 111C.

Formation of Common Electrode 113

Next, the common electrode 113 is formed to cover the organic layer 114.

The common electrode 113 can be formed by a deposition method such as an evaporation method or a sputtering method. Alternatively, a film formed by an evaporation method and a film formed by a sputtering method may be stacked.

The common electrode 113 is preferably formed so as to cover a region where the organic layer 114 is formed. That is, a structure in which an end portion of the organic layer 114 overlap with the common electrode 113 can be obtained. The common electrode 113 may be formed using a shielding mask.

Note that in the connection portion 130, the organic layer 114 is interposed between the connection electrode 111C and the common electrode 113 as illustrated in FIG. 1D, for example. In this case, for the organic layer 114, a material with as low electric resistance as possible is preferably used. Alternatively, it is preferable to form the organic layer 114 as thin as possible, in which case the electric resistance of the organic layer 114 in the thickness direction is reduced. For example, when a material which has an electron-injection property or a hole-injection property and whose thickness is greater than or equal to 1 nm and less than or equal to 5 nm, preferably greater than or equal to 1 nm and less than or equal to 3 nm is used for the organic layer 114, the electric resistance between the connection electrode 111C and the common electrode 113 can be made small enough to be negligible in some cases.

A structure in which the organic layer 114 is not provided between the connection electrode 111C and the common electrode 113 may be employed. In such a structure, since the connection electrode 111C and the common electrode 113 are in contact with each other, the contact resistance between these electrodes can be extremely low, which leads to a reduction in power consumption.

[Formation of Protective Layer]

Figure 6E:
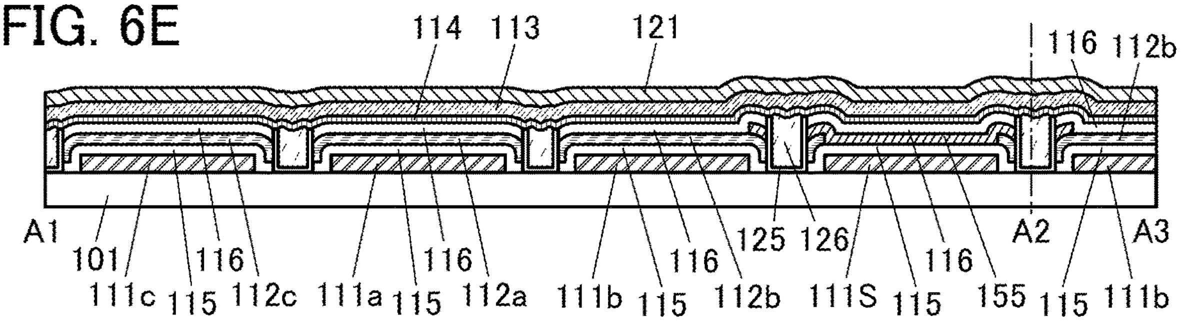

Next, the protective layer 121 is formed over the common electrode 113 (FIG. 6E). An inorganic insulating film used for the protective layer 121 is preferably deposited by a sputtering method, a PECVD method, or an ALD method. Specifically, an ALD method is preferable because it provides excellent step coverage and is less likely to cause a defect such as a pinhole. An organic insulating film is preferably deposited by an inkjet method because a uniform film can be formed in a desired area.

Through the above steps, the display apparatus illustrated in FIG. 1A to FIG. 1C can be manufactured.

Although the case where the resin layer 126 is formed to have the same width as the slit 120 is described above, the resin layer 126 may be formed to have a larger width than the slit 120.

Figure 7A:
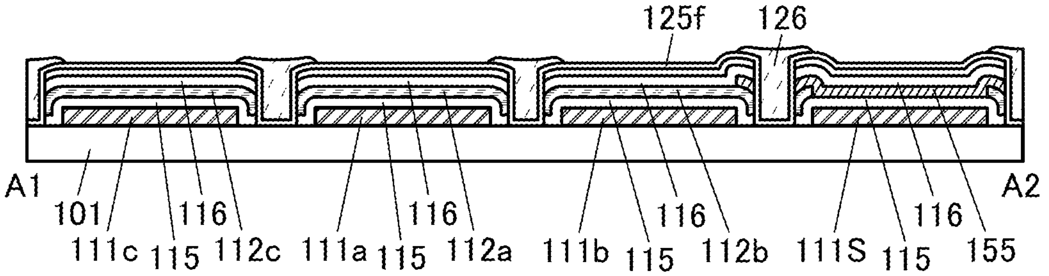
FIG. 7A and FIG. 7B are diagrams illustrating an example of a method of manufacturing a display apparatus.

FIG. 7A is a schematic cross-sectional view at the time when the resin layer 126 is formed after the insulating film 125*f* is formed.

Subsequently, the insulating film 125*f* and the sacrificial layer 145 are etched in a manner similar to the above. At this time, a portion of the sacrificial layer 145 covered with the resin layer 126 remains as a cut piece of the sacrificial layer 145.

Figure 7B:
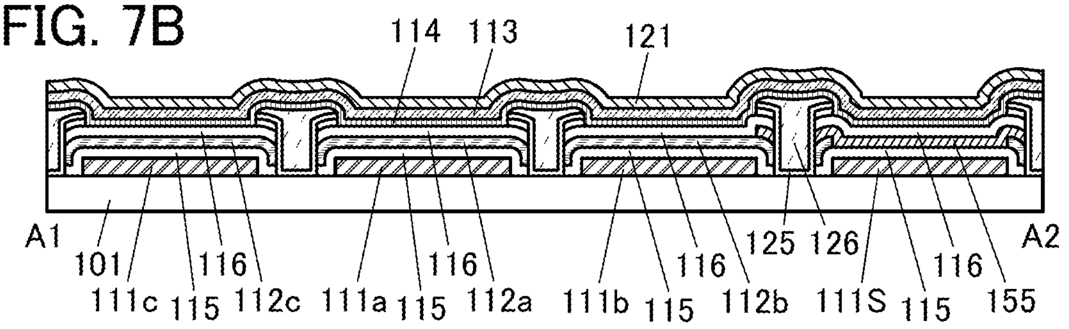

Then, the organic layer 114, the common electrode 113, and the protective layer 121 are formed in a manner similar to the above, whereby the display apparatus illustrated in FIG. 7B can be manufactured.

The resin layer 126 having a larger width than the slit 120 is formed and then the upper portion of the resin layer 126 is etched by ashing or the like, whereby the resin layer 126 can be formed only inside the slit 120. In that case, it is preferable that the levels of the top surface of the resin layer 126 and the top surface of the adjacent organic layer 116 be as close as possible to each other. Accordingly, the steps at both ends of a portion overlapping with the slit 120 can be reduced; thus, the step coverage with the organic layer 114 and the like can be improved.

Manufacturing Method Example 2

FIG. 5A to FIG. 6E illustrate an example in which the organic layer 155 is formed after the formation of the organic layer 112W, but the formation order is not limited to this. An example in which the organic layer 112W is formed after the formation of the organic layer 155 will be described with reference to FIG. 8A to FIG. 8D.

First, the pixel electrodes 111*a*, 111*b*, 111*c* and 111S are formed over the layer 101.

Next, the organic layer 115 is formed to cover the pixel electrodes 111*a*, 111*b*, 111*c*, and 111S.

Figure 8A:
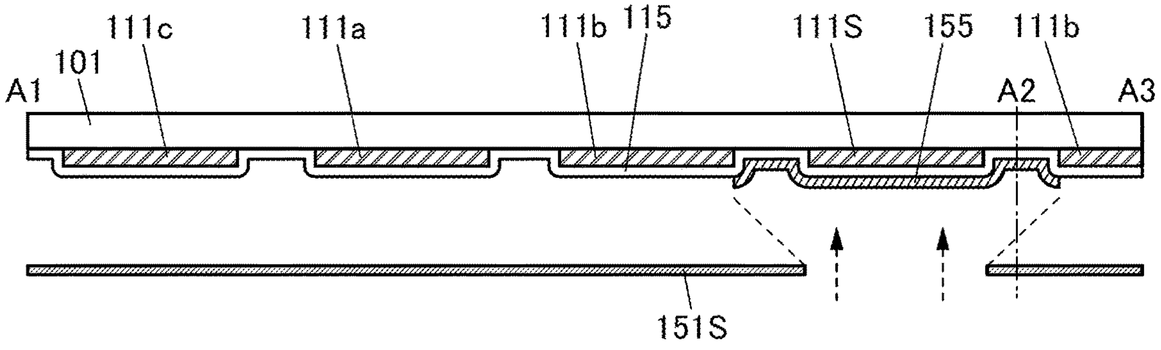
FIG. 8A to FIG. 8D are diagrams illustrating an example of a method of manufacturing a display apparatus.

Next, the organic layer 155 is formed over the organic layer 115. The organic layer 155 is formed to overlap with the pixel electrode 111S with the use of the FMM 151S (FIG. 8A). In FIG. 8A, the organic layer 155 extends to the outside of the pixel electrode 111S to be located also over the adjacent pixel electrodes 111*b*.

Figure 8B:
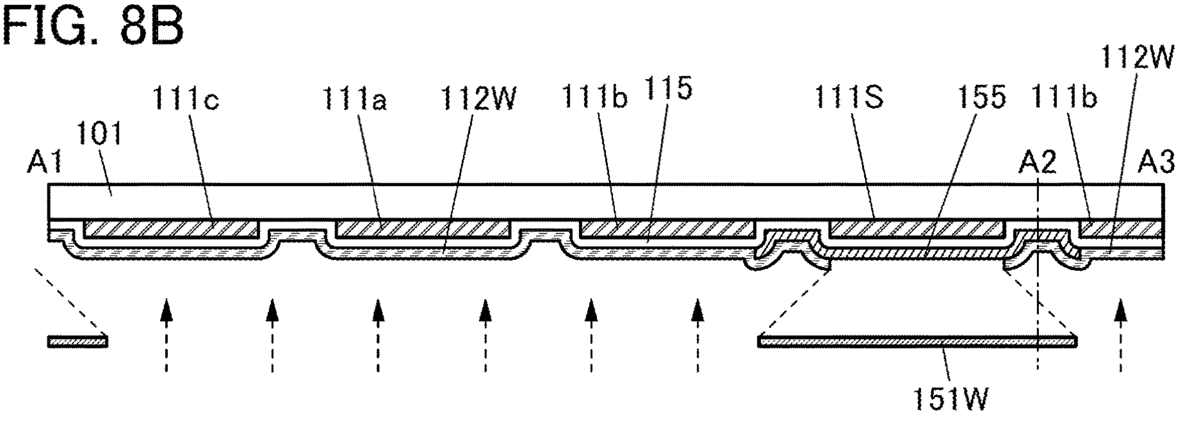

Then, the organic layer 112W is formed with use of the FMM 151W (FIG. 8B). In FIG. 8B, the organic layer 112W extends to the opening portion of the FMM 151W and is located also over the organic layer 155. As a result, a portion where the organic layer 112W is stacked is formed over the organic layer 155.

Figure 8C:
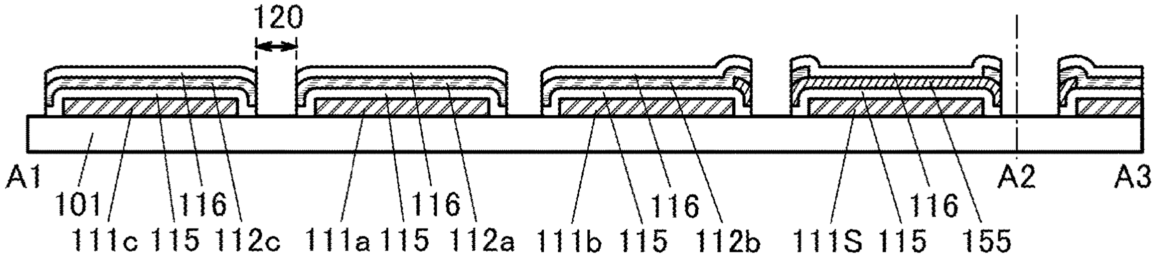
Figure 8D:
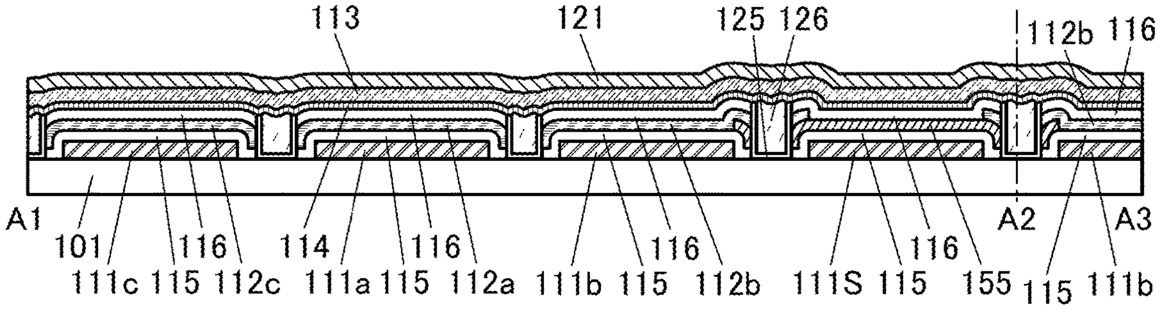

Next, the sacrificial layer 147 and the sacrificial layer 145 are formed, and part of the organic layer 116, part of the organic layer 112W, part of the organic layer 155, and part of the organic layer 115, which are not covered with the sacrificial layer 145, are removed by etching, so that the slit 120 is formed (FIG. 8C).

Next, the sacrificial layer 147 is removed to expose the top surface of the sacrificial layer 145. Subsequently, the insulating film 125*f* is formed to cover the sacrificial layer 145 and the slit 120. Next, the resin layer 126 is formed in the region overlapping with the slit 120. Next, portions of the insulating film 125*f* and the sacrificial layer 145 not covered with the resin layer 126 are removed by etching to expose the top surface of the organic layer 116. Then, the organic layer 114, the common electrode 113, and the protective layer 121 are formed, whereby the display apparatus illustrated in FIG. 8D can be manufactured.

The above is the description of an example of the method of manufacturing a display apparatus.

Structure Example 2

Another structure example of the display apparatus of one embodiment of the present invention will be described below.

Figure 9A:
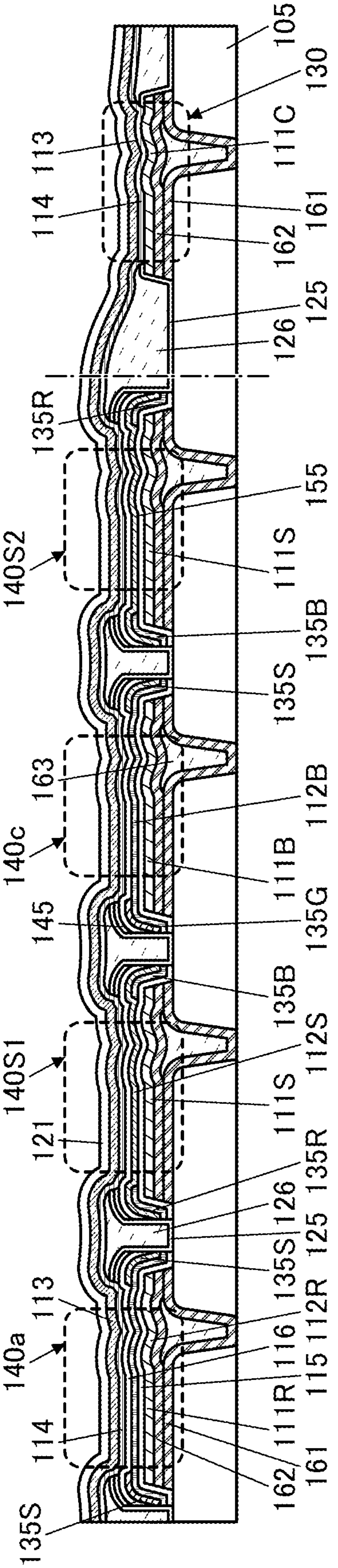
FIG. 9A is a diagram illustrating a structure example of a display apparatus.
Figure 9B:
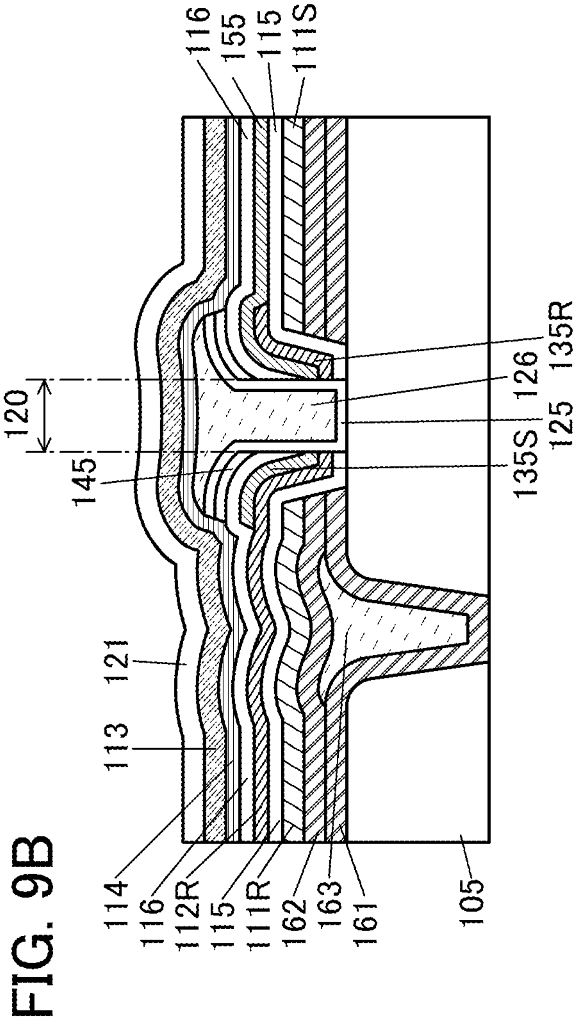
FIG. 9B is a diagram illustrating a structure example of a transistor.

FIG. 9A is a schematic cross-sectional view of the display apparatus. FIG. 9A illustrates a cross section in which the light-emitting element 140*a*, the light-receiving element 140S, the light-emitting element 140*c*, and the light-receiving element 140S are provided in this order and a cross section of a region including the connection portion 130. In FIG. 9A, the first light-receiving element 140S is represented by a light-receiving element 140S1 and the second light-receiving element 140S is represented by a light-receiving element 140S2. FIG. 9B is an enlarged schematic cross-sectional view of the slit 120 positioned between the light-emitting element 140*a* and the light-receiving element 140S1 and its vicinity.

The light-emitting element 140*c* includes the pixel electrode 111*c*, the organic layer 115, the organic layer 112*c*, the organic layer 116, the organic layer 114, and the common electrode 113. In FIG. 9A, a layer 135B that is part (a cut piece) of the organic layer 112*c* divided by the slit 120 is provided in the vicinity of the light-receiving element 140S1 and the vicinity of the light-receiving element 140S2.

A conductive layer 161, a conductive layer 162, and a resin layer 163 are provided below the pixel electrode 111.

The conductive layer 161 is provided over an insulating layer 105. The conductive layer 161 includes a portion penetrating the insulating layer 105 in an opening provided in the insulating layer 105. The conductive layer 161 functions as a wiring or an electrode electrically connecting the wiring, the transistor, the electrode, or the like (not illustrated), which are positioned below the insulating layer 105, to the pixel electrode 111.

A depressed portion is formed in a portion of the conductive layer 161 that is positioned in the opening in the insulating layer 105. The resin layer 163 is provided to fill the depressed portion and functions as a planarization film. Although the top surface of the resin layer 163 is preferably as flat as possible, its surface has a gently curved surface shape in some cases. Although FIG. 6A and the like illustrate an example in which the top surface of the resin layer 163 has a wave shape with a depressed portion and a projected portion; however, one embodiment of the present invention is not limited thereto. For example, the top surface of the resin layer 163 may be a convex surface, a concave surface, or a flat surface.

The conductive layer 162 is provided over the conductive layer 161 and the resin layer 163. The conductive layer 162 has a function as an electrode electrically connecting the conductive layer 161 and the pixel electrode 111.

Here, in the case where the light-emitting element 140 is a top-emission light-emitting element, a film having a reflective property with respect to visible light is used as the conductive layer 162 and a film having a transmitting property with respect to visible light is used as the pixel electrode 111, whereby the conductive layer 162 can serve as a reflective electrode. Furthermore, the conductive layer 162 and the pixel electrode 111 can also be provided over the opening portion (also referred to as a contact portion) of the insulating layer 105 with the resin layer 163 therebetween; thus, a portion overlapping with the contact portion can also be a light-emitting region. Therefore, the aperture ratio can be increased.

Similarly, in the case where the light-receiving element 140S is a photoelectric conversion element that receives light from above, a film having a reflective property can be used as the conductive layer 162 and a film having a transmitting property can be used as the pixel electrode 111. Furthermore, since the contact portion can also function as a light-receiving region, the light-receiving area is increased and the light-receiving sensitivity can be increased.

In addition, the thicknesses of the pixel electrodes 111 may be different. In that case, the pixel electrode 111 can be used as an optical adjustment layer for microcavity. In the case of using microcavity, a film having a transmitting property and a reflective property is used as the common electrode.

FIG. 9A and FIG. 9B illustrate an example in which the shape of the resin layer 126 is different from the above.

As illustrated in FIG. 9B, an upper portion of the resin layer 126 has a shape having a larger width than the slit 120. As described later, the insulating layer 125 is processed using the resin layer 126 as an etching mask; thus, a portion covered with the upper portion of the resin layer 126 remains. Moreover, part of a sacrificial layer 145 used in the manufacturing step of the display apparatus remains for the same reason. Specifically, the sacrificial layer 145 is provided over the organic layer 116 in the vicinity of the slit 120. Part of the insulating layer 125 is provided to cover the top surface of the sacrificial layer 145. In addition, the resin layer 126 is provided to cover the sacrificial layer 145 and the insulating layer 125.

At that time, an end portion of the insulating layer 125 and an end portion of the sacrificial layer 145 each preferably have a tapered shape. This can improve the step coverage with the organic layer 114 and the like.

As illustrated in FIG. 9A and FIG. 9B, the layer 135R, the layer 135B, and the layer 135S are in contact with the insulating layer 125 and each have a region overlapping with the insulating layer 125, the sacrificial layer 145, and the resin layer 126. The layer 135R, the layer 135B, and the layer 135S each have a portion overlapping with the pixel electrode of the adjacent light-emitting element or light-receiving element.

At least part of this embodiment can be implemented in combination with the other embodiments described in this specification as appropriate.

Embodiment 2

In this embodiment, a structure example of a display apparatus of one embodiment of the present invention will be described. Although a display apparatus capable of displaying an image is described here, when a light-emitting element is used as a light source, the display apparatus can be used as a display apparatus.

The display apparatus of this embodiment can be a high-definition display apparatus or a large-sized display apparatus. Accordingly, the display apparatus of this embodiment can also be used for display portions of electronic devices such as a digital camera, a digital video camera, a digital photo frame, a mobile phone, a portable game console, a smart phone, a wristwatch terminal, a tablet terminal, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

[Display Apparatus 400]

Figure 10:
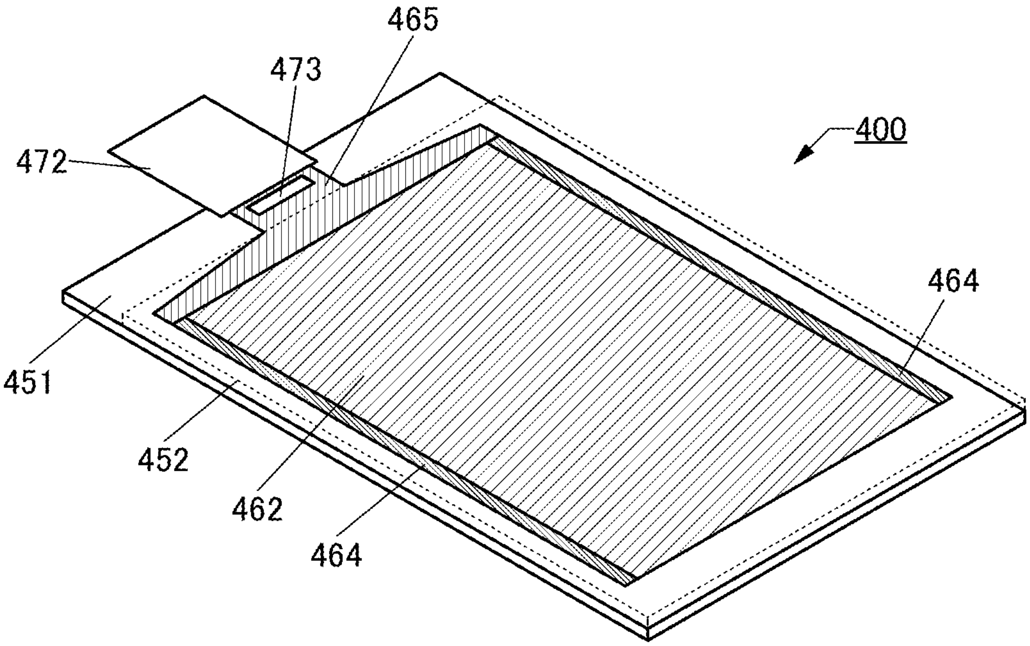
FIG. 10 is a diagram illustrating a structure example of a display apparatus.
Figure 11A:
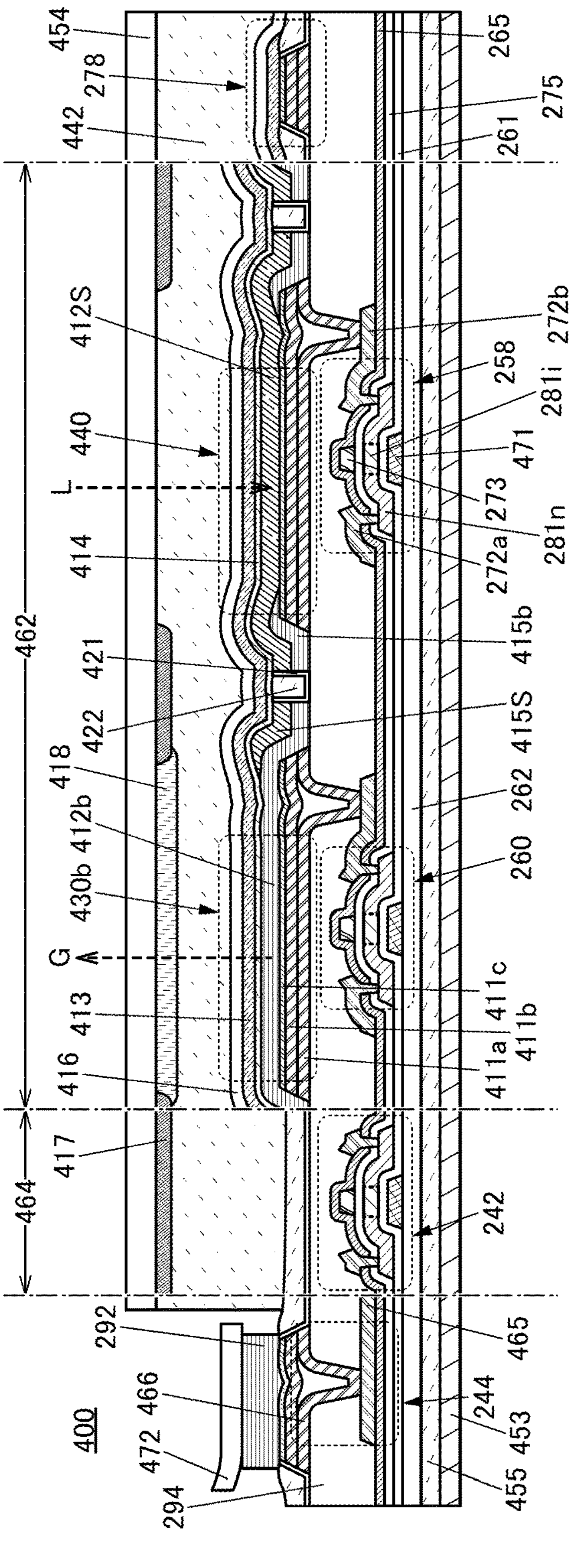
FIG. 11A is a diagram illustrating a structure example of a display apparatus.

FIG. 10 is a perspective view of a display apparatus 400, and FIG. 11A is a cross-sectional view of the display apparatus 400.

The display apparatus 400 has a structure in which a substrate 452 and a substrate 451 are bonded to each other. In FIG. 10, the substrate 452 is denoted by a dashed line.

The display apparatus 400 includes a display portion 462, a circuit 464, a wiring 465, and the like. FIG. 10 illustrates an example in which an IC 473 and an FPC 472 are integrated on the display apparatus 400. Thus, the structure illustrated in FIG. 11 can be regarded as a display module including the display apparatus 400, the IC (integrated circuit), and the FPC.

For the circuit 464, for example, a scan line driver circuit can be used.

The wiring 465 has a function of supplying a signal and electric power to the display portion 462 and the circuit 464. The signal and electric power are input to the wiring 465 from the outside through the FPC 472 or input to the wiring 465 from the IC 473.

FIG. 10 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display apparatus 400 and the display module are not necessarily provided with an IC. The IC may be mounted on the FPC by a COF method or the like.

FIG. 11A illustrates an example of cross sections of part of a region including the FPC 472, part of the circuit 464, part of the display portion 462, and part of a region including a connection portion in the display apparatus 400. FIG. 11A specifically illustrates an example of a cross section of a region including a light-emitting element 430*b* that emits green light (G) and a light-receiving element 440 that receives reflected light (L) of the display portion 462.

The display apparatus 400 illustrated in FIG. 11A includes a transistor 242, a transistor 260, a transistor 258, the light-emitting element 430*b*, the light-receiving element 440, and the like between a substrate 453 and a substrate 454.

The light-emitting element or the light-receiving element that are described above as examples can be applied to the light-emitting element 430*b* and the light-receiving element 440, respectively.

Here, in the case where the pixel of the display apparatus includes three kinds of subpixels including light-emitting elements that emit light of different colors, as the three subpixels, subpixels of three colors of red (R), green (G), and blue (B), subpixels of three colors of yellow (Y), cyan (C), and magenta (M), and the like can be given. In the case where four subpixels are included, as the four subpixels, subpixels of four colors of R, G, B, and white (W), subpixels of four colors of R, G, B, and Y, and the like can be given. Alternatively, the subpixel may include a light-emitting element emitting infrared light.

As the light-receiving element 440, a photoelectric conversion element having sensitivity to light in a red, green, or blue wavelength range or a photoelectric conversion element having sensitivity to light in an infrared wavelength range can be used.

The substrate 454 and a protective layer 416 are bonded to each other with an adhesive layer 442. The adhesive layer 442 is provided so as to overlap with each of the light-emitting element 430*b* and the light-receiving element 440, and the display apparatus 400 employs a solid sealing structure. The substrate 454 is provided with a coloring layer 418 and a light-blocking layer 417.

The light-emitting element 430*b* and the light-receiving element 440 each include a conductive layer 411*a*, a conductive layer 411*b*, and a conductive layer 411*c* as pixel electrodes. The conductive layer 411*b* has a reflective property with respect to visible light and functions as a reflective electrode. The conductive layer 411*c* has a transmitting property with respect to visible light and functions as an optical adjustment layer.

The conductive layer 411*a* included in the light-emitting element 430*b* is connected to a conductive layer 272*b* included in the transistor 260 through an opening provided in an insulating layer 294. The transistor 260 has a function of controlling the driving of the light-emitting element. In contrast, the conductive layer 411*a* included in the light-receiving element 440 is electrically connected to the conductive layer 272*b* included in the transistor 258. The transistor 258 has a function of controlling the timing of light exposure using the light-receiving element 440.

An EL layer 412*b* or a PD layer 412S is provided to cover the pixel electrode. An insulating layer 421 is provided in contact with a side surface of the EL layer 412*b* and a side surface of the PD layer 412S, and a resin layer 422 is provided to fill a depressed portion of the insulating layer 421. An organic layer 414, a common electrode 413, and the protective layer 416 are provided to cover the EL layer 412*b* and the PD layer 412S. With the protective layer 416 covering the light-emitting element, entry of impurities such as water into the light-emitting element can be inhibited, leading to an increase in the reliability of the light-emitting element.

A layer 415*b* and a layer 415S are provided in contact with the insulating layer 421. The layer 415*b* contains the same material as the EL layer 412*b*, and the layer 415S contains the same material as the PD layer 412S.

Part of the layer 415*b* includes a portion covering end portions of the conductive layer 411*a*, the conductive layer 411*b*, and the conductive layer 411*c* which are of the light-receiving element 440 and a portion overlapping with the PD layer 412S and the conductive layer 411*c*. Part of the layer 415S includes a portion covering end portions of the conductive layer 411*a*, the conductive layer 411*b*, and the conductive layer 411*c* which are of the light-emitting element 430*b* and a portion overlapping with the EL layer 412*b* and the conductive layer 411*c*.

Light emitted from the light-emitting element 430*b* is emitted as light G toward the substrate 452 side passing through the coloring layer 418. The light-receiving element 440 receives light L incident through the substrate 452 and converts the light L into an electric signal. For the substrate 452, a material having a high transmitting property with respect to visible light is preferably used.

The transistor 242, the transistor 260, and the transistor 258 are all formed over the substrate 451. These transistors can be manufactured using the same material in the same step.

Note that the transistor 242, the transistor 260, and the transistor 258 may be separately formed to have different structures. For example, it is possible to separately form a transistor having a back gate and a transistor having no back gate, or transistors having semiconductors, gate electrodes, gate insulating layers, source electrodes, and drain electrodes that are formed of different materials and/or have different thicknesses.

The substrate 453 and an insulating layer 262 are bonded to each other with an adhesive layer 455.

In a manufacturing method of the display apparatus 400, first, a formation substrate provided with the insulating layer 262, the transistors, the light-emitting elements, the light-receiving element, and the like is bonded to the substrate 454 provided with the light-blocking layer 417 and the coloring layer 418 with the adhesive layer 442. Then, the substrate 453 is attached to a surface exposed by separation of the formation substrate, whereby the components formed over the formation substrate are transferred onto the substrate 453. The substrate 453 and the substrate 454 preferably have flexibility. This can increase the flexibility of the display apparatus 400.

A connection portion 244 is provided in a region of the substrate 453 that does not overlap with the substrate 454. In the connection portion 244, the wiring 465 is electrically connected to the FPC 472 through a conductive layer 466 and a connection layer 292. The conductive layer 466 can be obtained by processing the same conductive film as the pixel electrode. Thus, the connection portion 244 and the FPC 472 can be electrically connected to each other through the connection layer 292.

Each of the transistor 242, the transistor 260, and the transistor 258 includes a conductive layer 471 functioning as a gate, an insulating layer 261 functioning as a gate insulating layer, a semiconductor layer 281 including a channel formation region 281*i* and a pair of low-resistance regions 281*n*, a conductive layer 272*a* connected to one of the pair of low-resistance regions 281*n*, the conductive layer 272*b* connected to the other of the pair of low-resistance regions 281*n*, an insulating layer 275 functioning as a gate insulating layer, a conductive layer 273 functioning as a gate, and an insulating layer 265 covering the conductive layer 273. The insulating layer 261 is positioned between the conductive layer 471 and the channel formation region 281*i*. The insulating layer 275 is positioned between the conductive layer 273 and the channel formation region 281*i*.

The conductive layer 272*a* and the conductive layer 272*b* are connected to the corresponding low-resistance regions 281*n* through openings provided in the insulating layer 265. One of the conductive layer 272*a* and the conductive layer 272*b* functions as a source, and the other functions as a drain.

FIG. 11A illustrates an example in which the insulating layer 275 covers the top surface and the side surface of the semiconductor layer. The conductive layer 272*a* and the conductive layer 272*b* are connected to the corresponding low-resistance regions 281*n* through openings provided in the insulating layer 275 and the insulating layer 265.

Figure 11B:
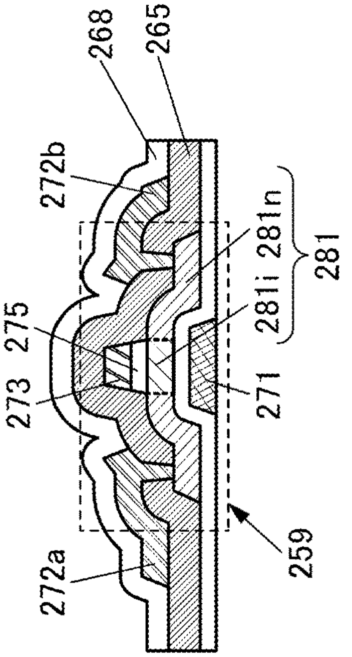
FIG. 11B is a diagram illustrating a structure example of a transistor.

Meanwhile, in a transistor 259 illustrated in FIG. 11B, the insulating layer 275 overlaps with the channel formation region 281*i* of the semiconductor layer 281 and does not overlap with the low-resistance regions 281*n*. The structure illustrated in FIG. 11B can be manufactured by processing the insulating layer 275 using the conductive layer 273 as a mask, for example. In FIG. 11B, the insulating layer 265 is provided to cover the insulating layer 275 and the conductive layer 273, and the conductive layer 272*a* and the conductive layer 272*b* are connected to the low-resistance regions 281*n* through the openings in the insulating layer 265. Furthermore, an insulating layer 268 covering the transistor may be provided.

There is no particular limitation on the structure of the transistors included in the display apparatus of this embodiment. For example, a planar transistor, a staggered transistor, an inverted staggered transistor, or the like can be used. A top-gate or a bottom-gate transistor structure may be employed. Alternatively, gates may be provided above and below the semiconductor layer in which a channel is formed.

The structure in which the semiconductor layer where a channel is formed is interposed between two gates is used for the transistor 242, the transistor 260, and the transistor 258. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the semiconductor layer of the transistor, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display apparatus of this embodiment.

The band gap of a metal oxide used for the semiconductor layer of the transistor is preferably 2 eV or more, further preferably 2.5 eV or more. With the use of a metal oxide having a wide bandgap, the off-state current of the OS transistor can be reduced.

A metal oxide contains preferably at least indium or zinc and further preferably indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and M is further preferably gallium. Hereinafter, a metal oxide containing indium, M, and zinc is referred to as an In-M-Zn oxide in some cases.

When a metal oxide is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio. By increasing the ratio of the number of indium atoms in the metal oxide, the on-state current, field-effect mobility, or the like of the transistor can be improved.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The atomic ratio of In may be less than the atomic ratio of M in the In-M-Zn oxide. Examples of the atomic ratio of the metal elements in such an In-M-Zn oxide include In:M:Zn=1:3:2 or a composition in the neighborhood thereof, In:M:Zn=1:3:3 or a composition in the neighborhood thereof, and In:M:Zn=1:3:4 or a composition in the neighborhood thereof. By increasing the ratio of the number of M atoms in the metal oxide, the band gap of the In-M-Zn oxide is further increased; thus, the resistance to a negative bias stress test with light irradiation can be improved. Specifically, the amount of change in the threshold voltage or the amount of change in the shift voltage (Vsh) measured in a NBTIS (Negative Bias Temperature Illumination Stress) test of the transistor can be decreased. Note that the shift voltage (Vsh) is defined as Vg at which, in a drain current (Id)-gate voltage (Vg) curve of a transistor, the tangent at a point where the slope of the curve is the steepest intersects the straight line of Id=1 pA.

Alternatively, the semiconductor layer of the transistor may contain silicon. Examples of silicon include amorphous silicon and crystalline silicon (e.g., low-temperature polysilicon (also referred to as LTPS) or single crystal silicon).

In particular, low-temperature polysilicon has relatively high mobility and can be formed over a glass substrate, and thus can be favorably used for a display apparatus. For example, a transistor including low-temperature polysilicon in a semiconductor layer (an LTPS transistor) can be used as the transistor 242 and the like included in the driver circuit, and a transistor including an oxide semiconductor in a semiconductor layer (an OS transistor) can be used as the transistor 260, the transistor 258, and the like provided in the pixel. When both an LTPS transistor and an OS transistor are used, the display apparatus can have low power consumption and high drive capability. A structure where an LTPS transistor and an OS transistor are used in combination is referred to as LTPO in some cases. As a favorable example, it is preferable to use an OS transistor as a transistor or the like functioning as a switch for controlling electrical continuity between wirings and an LTPS transistor as a transistor or the like for controlling current.

Alternatively, a semiconductor layer of a transistor may contain a layered material that functions as a semiconductor. The layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered materials include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

Note that the display apparatus illustrated in FIG. 11A includes an OS transistor and a common layer which is divided between the light-emitting elements. With this structure, the leakage current that might flow through the transistor and the leakage current that might flow between adjacent light-emitting elements (also referred to as a lateral leakage current, a side leakage current, or the like) can become extremely low. With the structure, a viewer can notice any one or more of the image crispness, the image sharpness, a high chroma, and a high contrast ratio in an image displayed on the display apparatus. With the structure where the leakage current that might flow through the transistor and the lateral leakage current that might flow between light-emitting elements are extremely low, display with little leakage of light at the time of black display (what is called black floating) (such display is also referred to as deep black display) can be achieved.

In particular, in the case where a light-emitting element having an MML structure employs a separate coloring structure (an SBS structure), a layer provided between light-emitting elements (for example, also referred to as an organic layer or a common layer which is commonly used between the light-emitting elements) is disconnected; accordingly, display with no or extremely low side leakage can be achieved.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A material through which impurities such as water and hydrogen do not easily diffuse is preferably used for at least one of the insulating layers that cover the transistors. This allows the insulating layer to function as a barrier layer. Such a structure can effectively inhibit diffusion of impurities into the transistors from the outside and increase the reliability of the display apparatus.

An inorganic insulating film is preferably used as each of the insulating layer 261, the insulating layer 262, the insulating layer 265, the insulating layer 268, and the insulating layer 275. As the inorganic insulating film, a silicon nitride film, a silicon oxynitride film, a silicon oxide film, a silicon nitride oxide film, an aluminum oxide film, an aluminum nitride film, or the like can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above inorganic insulating films may also be used.

Here, an organic insulating film often has a lower barrier property than an inorganic insulating film. Therefore, the organic insulating film preferably has an opening in the vicinity of an end portion of the display apparatus 400. This can inhibit entry of impurities from the end portion of the display apparatus 400 through the organic insulating film. Alternatively, the organic insulating film may be formed so that an end portion of the organic insulating film is positioned inward from the end portion of the display apparatus 400, to prevent the organic insulating film from being exposed at the end portion of the display apparatus 400.

An organic insulating film is suitable for the insulating layer 294 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

The light-blocking layer 417 is preferably provided on a surface of the substrate 454 on the substrate 453 side. A variety of optical members can be arranged on the outer side of the substrate 454. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorption layer, or the like may be provided on the outer side of the substrate 454.

FIG. 11A illustrates a connection portion 278. In the connection portion 278, the common electrode 413 is electrically connected to a wiring. FIG. 11A illustrates an example in which the wiring has the same stacked-layer structure as the pixel electrode.

For each of the substrate 453 and the substrate 454, glass, quartz, ceramic, sapphire, a resin, a metal, an alloy, a semiconductor, or the like can be used. The substrate on the side where light from the light-emitting element is extracted is formed using a material that transmits the light. When a flexible material is used for the substrate 453 and the substrate 454, the flexibility of the display apparatus can be increased. Furthermore, a polarizing plate may be used as the substrate 453 or the substrate 454.

For each of the substrate 453 and the substrate 454, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 453 and the substrate 454.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the films having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of a display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

For the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

For the connection layer 292, an anisotropic conductive film (ACF), an anisotropic conductive paste (ACP), or the like can be used.

Examples of materials that can be used for a gate, a source, and a drain of a transistor and conductive layers such as a variety of wirings and electrodes included in a display apparatus include metals such as aluminum, titanium, chromium, nickel, copper, yttrium, zirconium, molybdenum, silver, tantalum, or tungsten, and an alloy containing any of these metals as its main component. A film containing any of these materials can be used in a single layer or as a stacked-layer structure.

For a conductive material having a light-transmitting property, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked film of any of the above materials can be used as a conductive layer. For example, a stacked film of indium tin oxide and an alloy of silver and magnesium, or the like is preferably used for increased conductivity. These materials can also be used, for example, for the conductive layers such as a variety of wirings and electrodes included in a display apparatus, and conductive layers (conductive layers functioning as a pixel electrode or a common electrode) included in the light-emitting element.

For an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 3

In this embodiment, display apparatuses of one embodiment of the present invention will be described with reference to FIG. 12 to FIG. 17.

The display apparatus of this embodiment can be a high-resolution display apparatus. Accordingly, the display apparatus of this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Module]

Figure 12A:
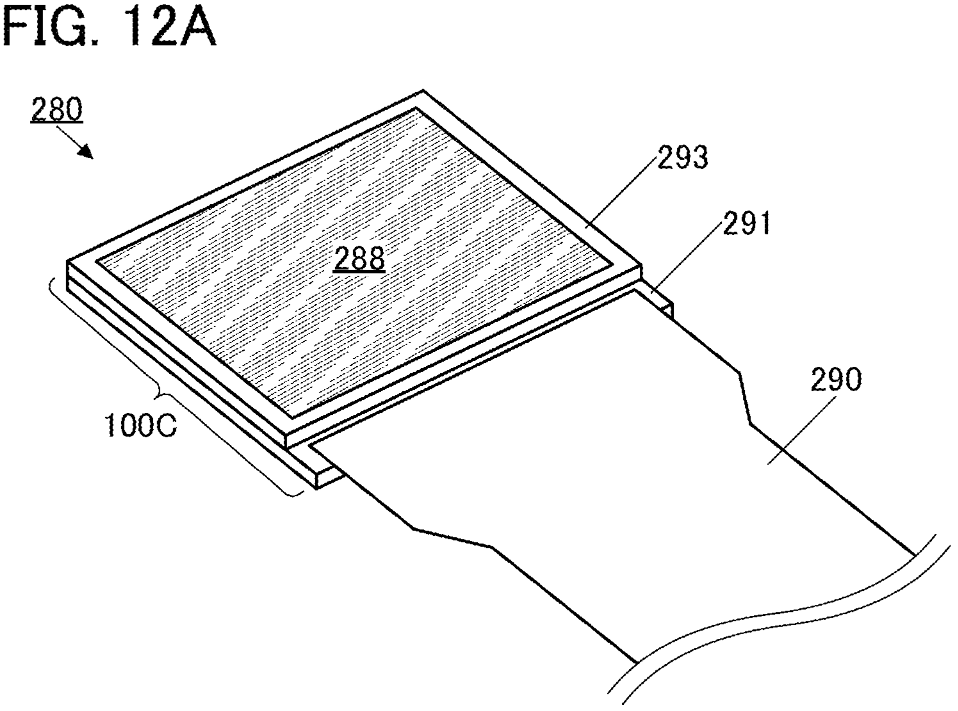
FIG. 12A and FIG. 12B are perspective views illustrating an example of a display module.

FIG. 12A is a perspective view of a display module 280. The display module 280 includes a display apparatus 100C and an FPC 290. Note that the display apparatus included in the display module 280 is not limited to the display apparatus 100C and may be any of a display apparatus 100D to a display apparatus 100G described later.

The display module 280 includes a substrate 291 and a substrate 293. The display module 280 includes a display portion 288. The display portion 288 is a region of the display module 280 where an image is displayed and is a region where light from pixels provided in a pixel portion 284 described later can be perceived.

Figure 12B:
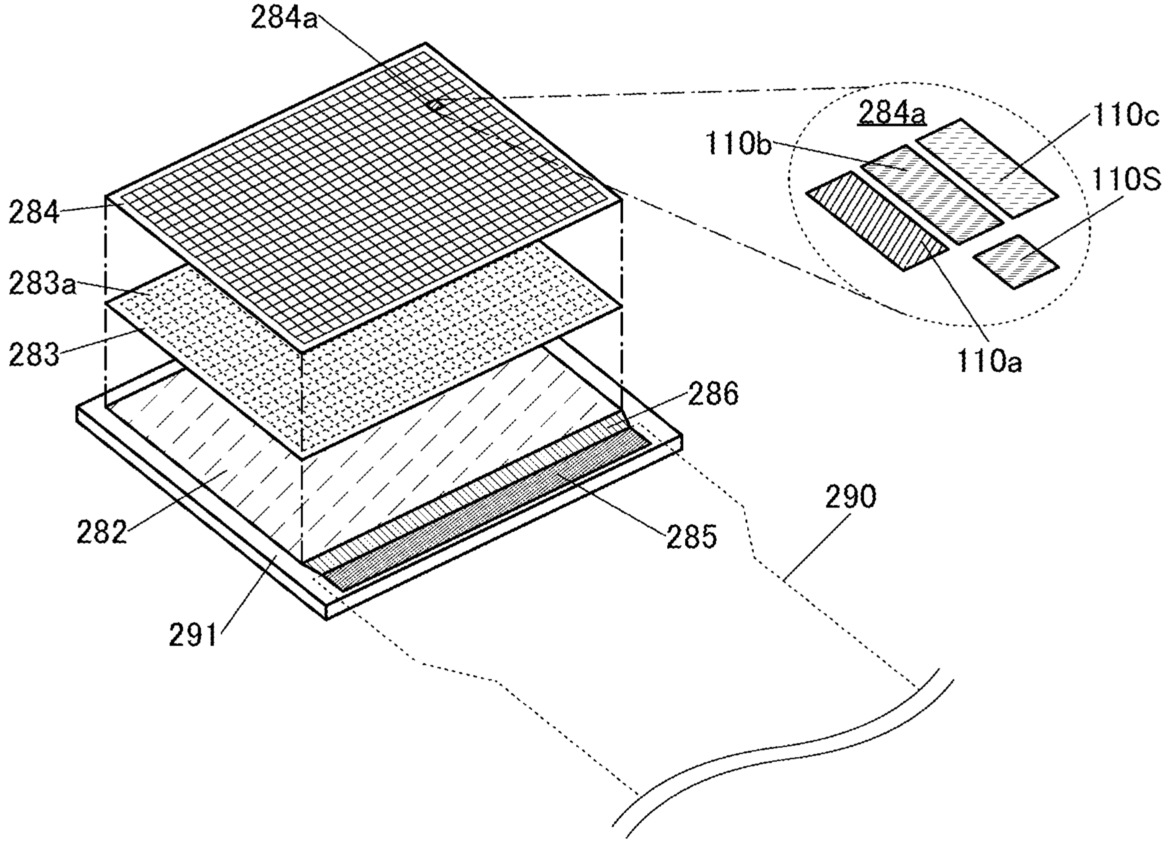

FIG. 12B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 12B. The pixel 284*a* includes the subpixel 110*a*, the subpixel 110*b*, and the subpixel 110*c*. The foregoing embodiment can be referred to for the structures of the subpixel 110*a*, the subpixel 110*b*, and the subpixel 110*c* and their surroundings. The plurality of subpixels can be arranged in stripe arrangement as illustrated in FIG. 12B. Alternatively, a variety of arrangement methods for light-emitting elements, such as delta arrangement or pentile arrangement, can be employed.

The pixel circuit portion 283 includes a plurality of pixel circuits 283*a* arranged periodically.

One pixel circuit 283*a* is a circuit that controls light emission of three light-emitting elements included in one pixel 284*a*. One pixel circuit 283*a* may be provided with three circuits for controlling light emission of the respective light-emitting elements. For example, the pixel circuit 283*a* for one light-emitting element can include at least one selection transistor, one current control transistor (driving transistor), and a capacitor. In this case, a gate signal is input to a gate of the selection transistor and a source signal is input to one of a source and a drain thereof. With such a structure, an active-matrix display apparatus is achieved.

The circuit portion 282 includes a circuit for driving the pixel circuits 283*a* in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, power supply potential, or the like to the circuit portion 282 from the outside. In addition, an IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 288 can be significantly high. For example, the aperture ratio of the display portion 288 can be higher than or equal to 40% and lower than 100%, preferably higher than or equal to 50% and lower than or equal to 95%, further preferably higher than or equal to 60% and lower than or equal to 95%. Furthermore, the pixels 284*a* can be arranged extremely densely and thus the display portion 288 can have extremely high resolution. For example, the pixels 284*a* are preferably arranged in the display portion 288 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high resolution, and thus can be suitably used for a device for VR such as a head-mounted display or a glasses-type device for AR. For example, even in the case of a structure in which the display portion of the display module 280 is perceived through a lens, pixels of the extremely-high-resolution display portion 288 included in the display module 280 are not perceived when the display portion is enlarged by the lens, so that display providing a high sense of immersion can be performed. Without limitation to the above, the display module 280 can also be suitably used for an electronic device having a relatively small display portion. For example, the display module 280 can be suitably used for a display portion of a wearable electronic device such as a wrist watch.

[Display Apparatus 100C]

Figure 13:
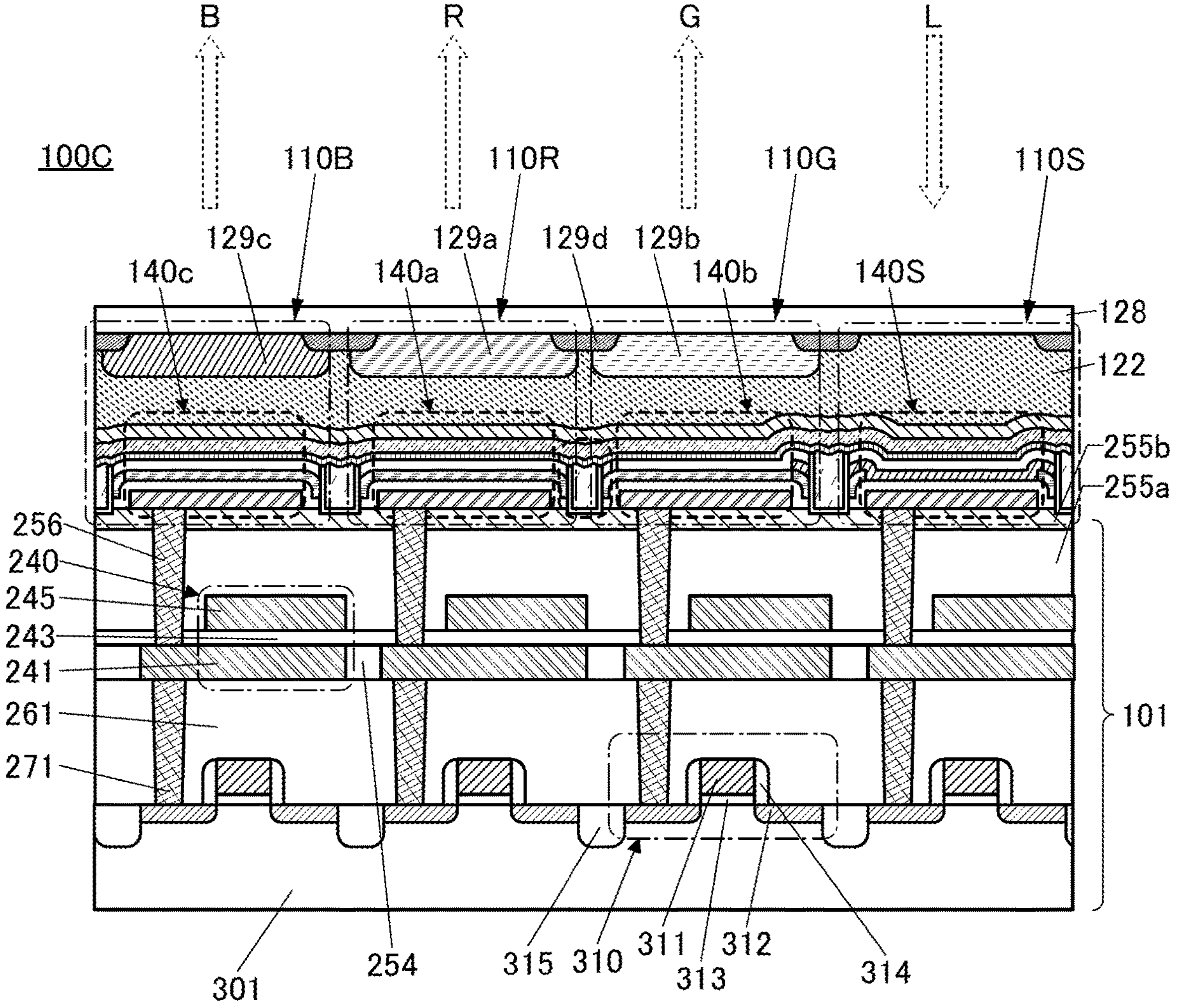
FIG. 13 is a cross-sectional view illustrating an example of a display apparatus.

The display apparatus 100C illustrated in FIG. 13 includes a substrate 301, the subpixels 110*a*, 110*b*, and 110*c*, a capacitor 240, and a transistor 310. The subpixel 110*a* includes the light-emitting element 140*a* and the coloring layer 129*a*, the subpixel 110*b* includes the light-emitting element 140*b* and the coloring layer 129*b*, and the subpixel 110*c* includes the light-emitting element 140*c* and the coloring layer 129*c*.

The substrate 301 corresponds to the substrate 291 in FIG. 12A and FIG. 12B. A stacked-layer structure including the substrate 301 and the components thereover up to an insulating layer 255*b* corresponds to the layer 101 including a transistor in Embodiment 1. FIG. 13 illustrates four transistors 310 included in the layer 101.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover the side surface of the conductive layer 311, and functions as an insulating layer.

In addition, an element isolation layer 315 is provided between two adjacent transistors 310 to be embedded in the substrate 301.

Furthermore, an insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of a source and a drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255*a* is provided to cover the capacitor 240, the insulating layer 255*b* is provided over the insulating layer 255*a*, and the light-emitting elements 140*a*, 140*b*, and 140*c* and the like are provided over the insulating layer 255*b*. In this embodiment, an example in which the stacked-layer structure illustrated in FIG. 1B is employed as the light-emitting elements 140*a*, 140*b*, and 140*c* and the resin layer 122, the coloring layers 129*a*, 129*b*, and 129*c*, the black matrix 129*d*, and the substrate 128 over the light-emitting elements 140*a*, 140*b*, and 140*c*. The substrate 128 corresponds to the substrate 293 in FIG. 12A.

As each of the insulating layers 255*a* and 255*b*, a variety of inorganic insulating films such as an oxide insulating film, a nitride insulating film, an oxynitride insulating film, and a nitride oxide insulating film can be suitably used. As the insulating layer 255*a*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferred that a silicon oxide film be used as the insulating layer 255*a* and a silicon nitride film be used as the insulating layer 255*b*. The insulating layer 255*b* preferably has a function of an etching protective film. Alternatively, a nitride insulating film or a nitride oxide insulating film may be used as the insulating layer 255*a*, and an oxide insulating film or an oxynitride insulating film may be used as the insulating layer 255*b*. Although this embodiment illustrates an example in which a recessed portion is provided in the insulating layer 255*b*, a recessed portion is not necessarily provided in the insulating layer 255*b*.

In FIG. 13, the pixel electrodes of the light-emitting elements 140*a*, 140*b*, and 140*c* and the pixel electrode of the light-receiving element 140S are electrically connected to different transistors 310. They are electrically connected to plugs embedded in the insulating layers 255*a* and 255*b*. The plugs embedded in the insulating layer 255*a* and the insulating layer 255*b*, for example, the plugs, are electrically connected to one of the source and the drain of the transistor 310 through a conductive layer embedded in the insulating layer 254 and a plug embedded in the insulating layer 261. In FIG. 12, a plug 256 embedded in the insulating layer 255*a* and the insulating layer 255*b* is electrically connected to one of the source and the drain of the transistor 310 through the conductive layer 241 embedded in the insulating layer 254 and the plug 271 embedded in the insulating layer 261. The top surface of the insulating layer 255*b* and the top surface of the plug 256 are level with or substantially level with each other. A variety of conductive materials can be used for the plugs.

[Display Apparatus 100D]

Figure 14:
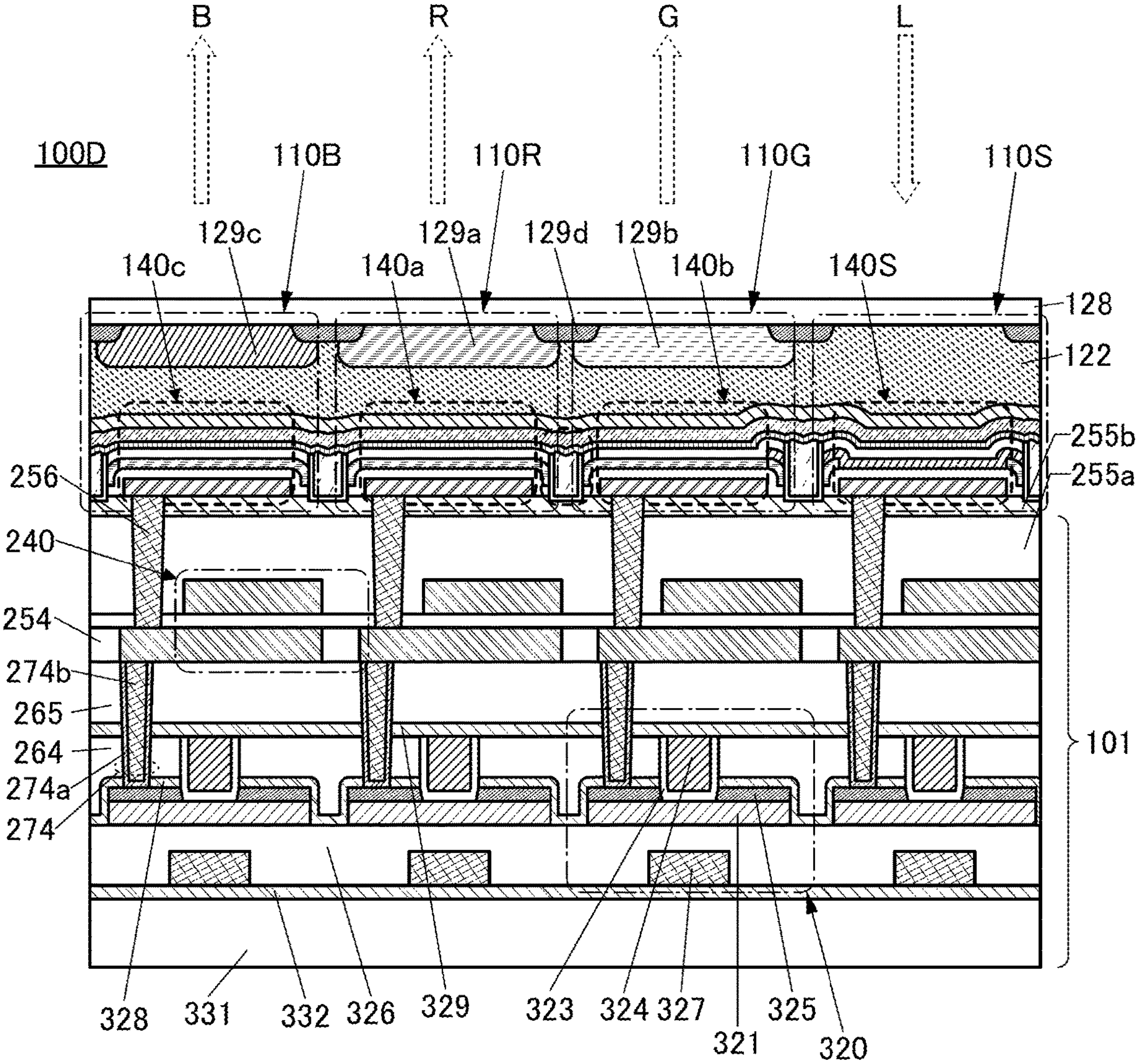
FIG. 14 is a cross-sectional view illustrating an example of a display apparatus.

The display apparatus 100D illustrated in FIG. 14 differs from the display apparatus 100C mainly in a structure of a transistor. Note that portions similar to those of the display apparatus 100C are not described in some cases.

A transistor 320 is a transistor (OS transistor) in which a metal oxide (also referred to as an oxide semiconductor) is used in a semiconductor layer in which a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 12A and FIG. 12B. A stacked-layer structure including the substrate 331 and components thereover up to the insulating layer 255*b* corresponds to the layer 101 including transistors in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to diffuse than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. For at least part of the insulating layer 326 that is in contact with the semiconductor layer 321, an oxide insulating film such as a silicon oxide film is preferably used. The top surface of the insulating layer 326 is preferably planarized.

The semiconductor layer 321 is provided over the insulating layer 326. The semiconductor layer 321 preferably includes a film of a metal oxide exhibiting semiconductor characteristics (also referred to as an oxide semiconductor). The material that can be suitably used for the semiconductor layer 321 will be described in detail later.

The pair of conductive layers 325 is provided over and in contact with the semiconductor layer 321, and functions as a source electrode and a drain electrode.

An insulating layer 328 is provided to cover the top surfaces and the side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 or the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that their heights are equal to or substantially equal to each other, and an insulating layer 329 and an insulating layer 265 are provided to cover these layers.

The insulating layer 264 and the insulating layer 265 function as interlayer insulating layers. The insulating layer 329 functions as a barrier layer that prevents diffusion of impurities such as water and hydrogen from the insulating layer 265 or the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers the side surface of an opening in the insulating layer 265, the insulating layer 329, the insulating layer 264, and the insulating layer 328 and part of the top surface of the conductive layer 325, and a conductive layer 274*b* in contact with the top surface of the conductive layer 274*a*. In this case, a conductive material in which hydrogen and oxygen are unlikely to diffuse is preferably used for the conductive layer 274*a*.

A structure including the insulating layer 254 and components thereover up to the substrate 128 in the display apparatus 100D is similar to that of the display apparatus 100C.

[Display Apparatus 100E]

Figure 15:
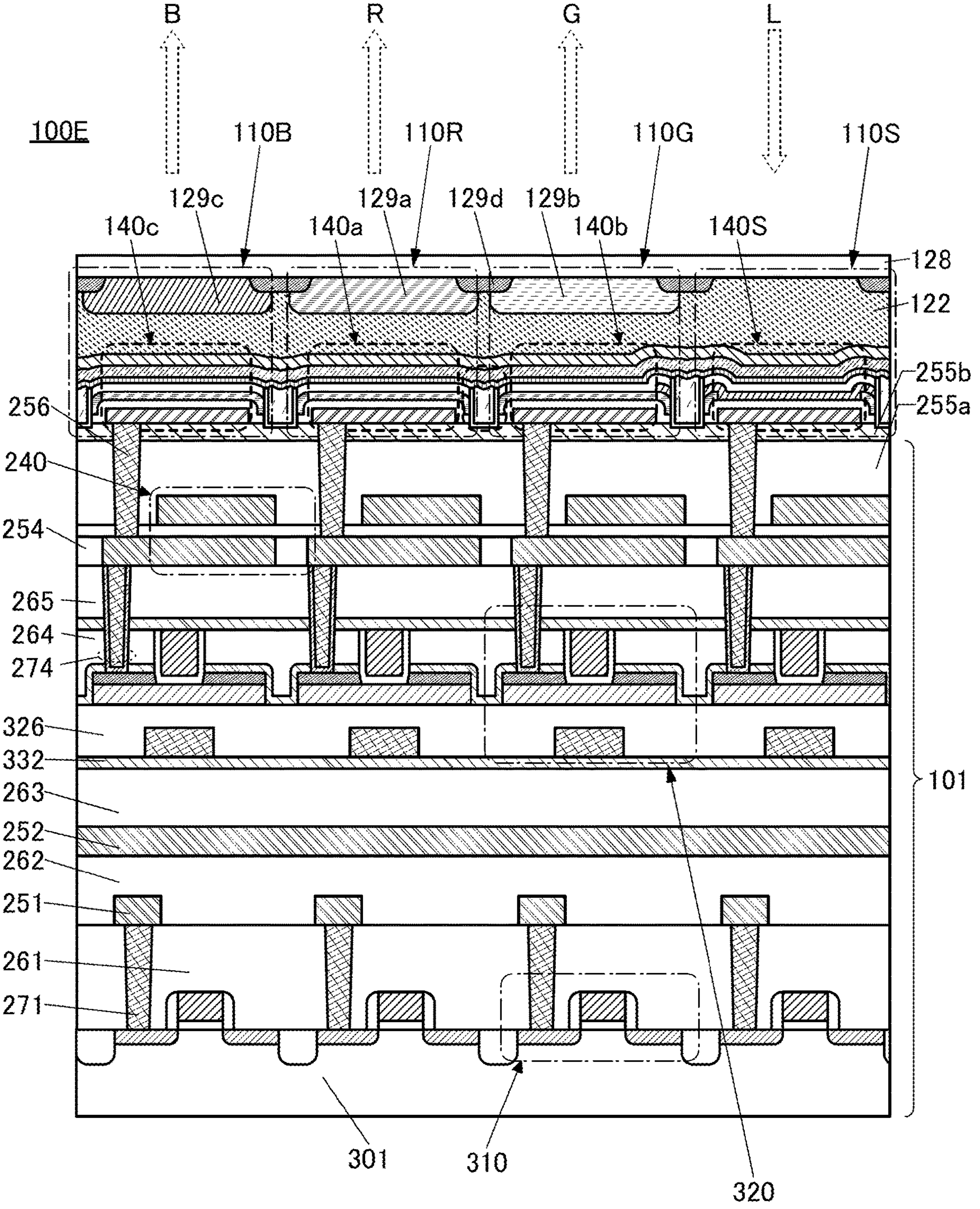
FIG. 15 is a cross-sectional view illustrating an example of a display apparatus.

A display apparatus 100E illustrated in FIG. 15 has a structure in which the transistor 310 whose channel is formed in the substrate 301 and the transistor 320 including a metal oxide in the semiconductor layer in which the channel is formed are stacked. Note that portions similar to those of the display apparatuses 100C and 100D are not described in some cases.

The insulating layer 261 is provided to cover the transistor 310, and a conductive layer 251 is provided over the insulating layer 261. In addition, an insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in a pixel circuit. The transistor 310 can also be used as a transistor included in a pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit or the like can be formed directly under the light-emitting element; thus, the display apparatus can be downsized as compared with the case where the driver circuit is provided around a display region.

[Display Apparatus 100F]

Figure 16:
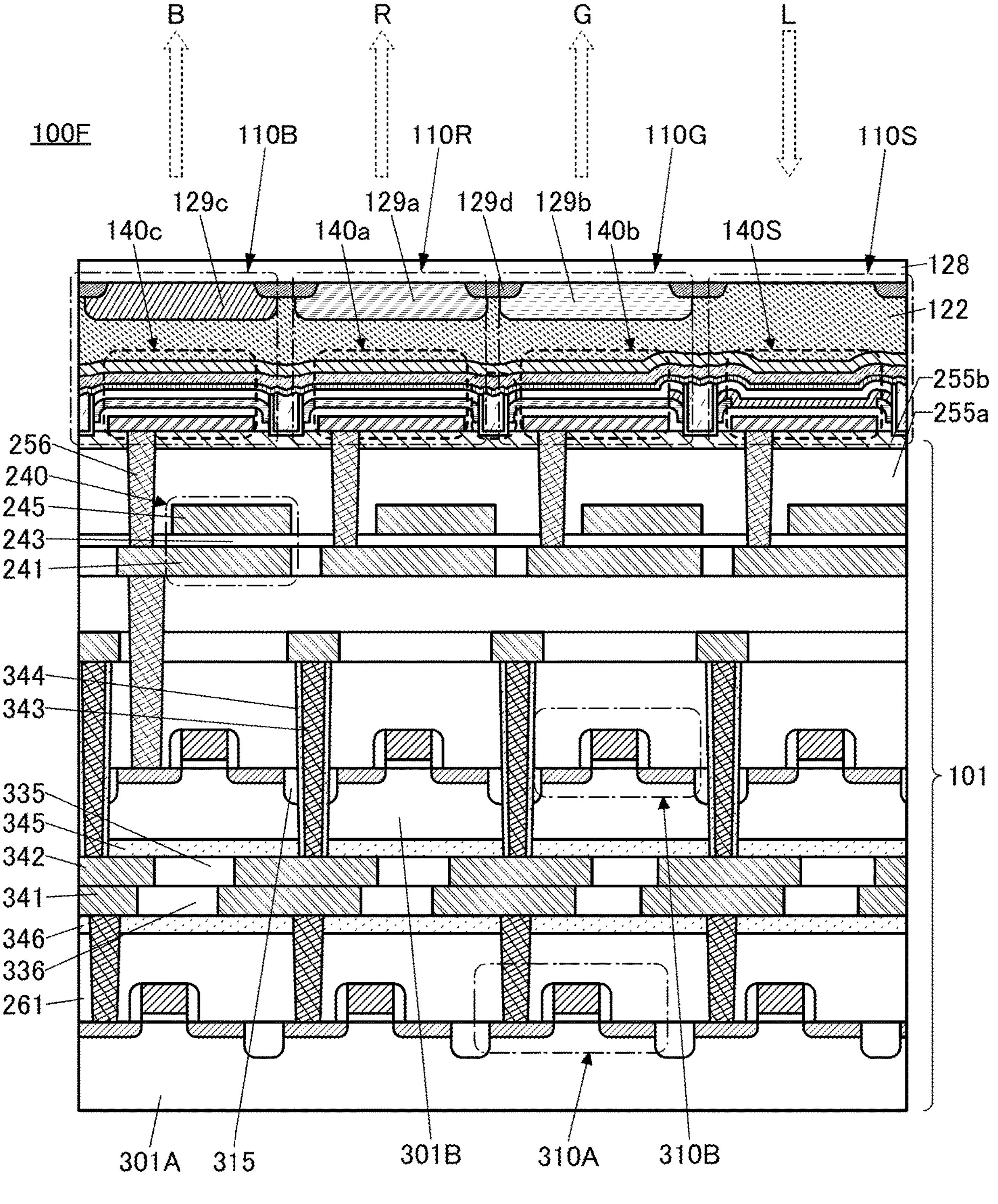
FIG. 16 is a cross-sectional view illustrating an example of a display apparatus.

A display apparatus 100F illustrated in FIG. 16 has a structure in which a transistor 310A and a transistor 310B in each of which a channel is formed in a semiconductor substrate are stacked.

The display apparatus 100F has a structure in which a substrate 301B provided with the transistor 310B, the capacitor 240, and the light-emitting elements is bonded to a substrate 301A provided with the transistor 310A.

Here, an insulating layer 345 is preferably provided on the bottom surface of the substrate 301B. An insulating layer 346 is preferably provided over the insulating layer 261 provided over the substrate 301A. The insulating layers 345 and 346 are insulating layers functioning as protective layers and can inhibit diffusion of impurities into the substrate 301B and the substrate 301A. As the insulating layers 345 and 346, an inorganic insulating film that can be used as the protective layer 121 or the insulating layer 332 can be used.

The substrate 301B is provided with a plug 343 that penetrates the substrate 301B and the insulating layer 345. An insulating layer 344 is preferably provided to cover the side surface of the plug 343. The insulating layer 344 is an insulating layer functioning as a protective layer and can inhibit diffusion of impurities into the substrate 301B. As the insulating layer 344, an inorganic insulating film that can be used as the protective layer 121 or the insulating layer 332 can be used.

A conductive layer 342 is provided under the insulating layer 345 on the rear surface of the substrate 301B (a surface opposite to the substrate 128). The conductive layer 342 is preferably provided to be embedded in the insulating layer 335. The bottom surfaces of the conductive layer 342 and the insulating layer 335 are preferably planarized. Here, the conductive layer 342 is electrically connected to the plug 343.

A conductive layer 341 is provided over the insulating layer 346 over the substrate 301A. The conductive layer 341 is preferably provided to be embedded in the insulating layer 336. The top surfaces of the conductive layer 341 and the insulating layer 336 are preferably planarized.

The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layer 341 and the conductive layer 342 to be bonded to each other favorably.

For the conductive layer 341 and the conductive layer 342, the same conductive material is preferably used. For example, it is possible to use a metal film containing an element selected from Al, Cr, Cu, Ta, Ti, Mo, and W, or a metal nitride film containing any of the above elements as a component (a titanium nitride film, a molybdenum nitride film, or a tungsten nitride film). Copper is particularly preferably used for the conductive layer 341 and the conductive layer 342. In that case, it is possible to employ Cu—Cu (copper-copper) direct bonding (a technique for achieving electrical continuity by connecting Cu (copper) pads). [Display apparatus 100G]

Figure 17:
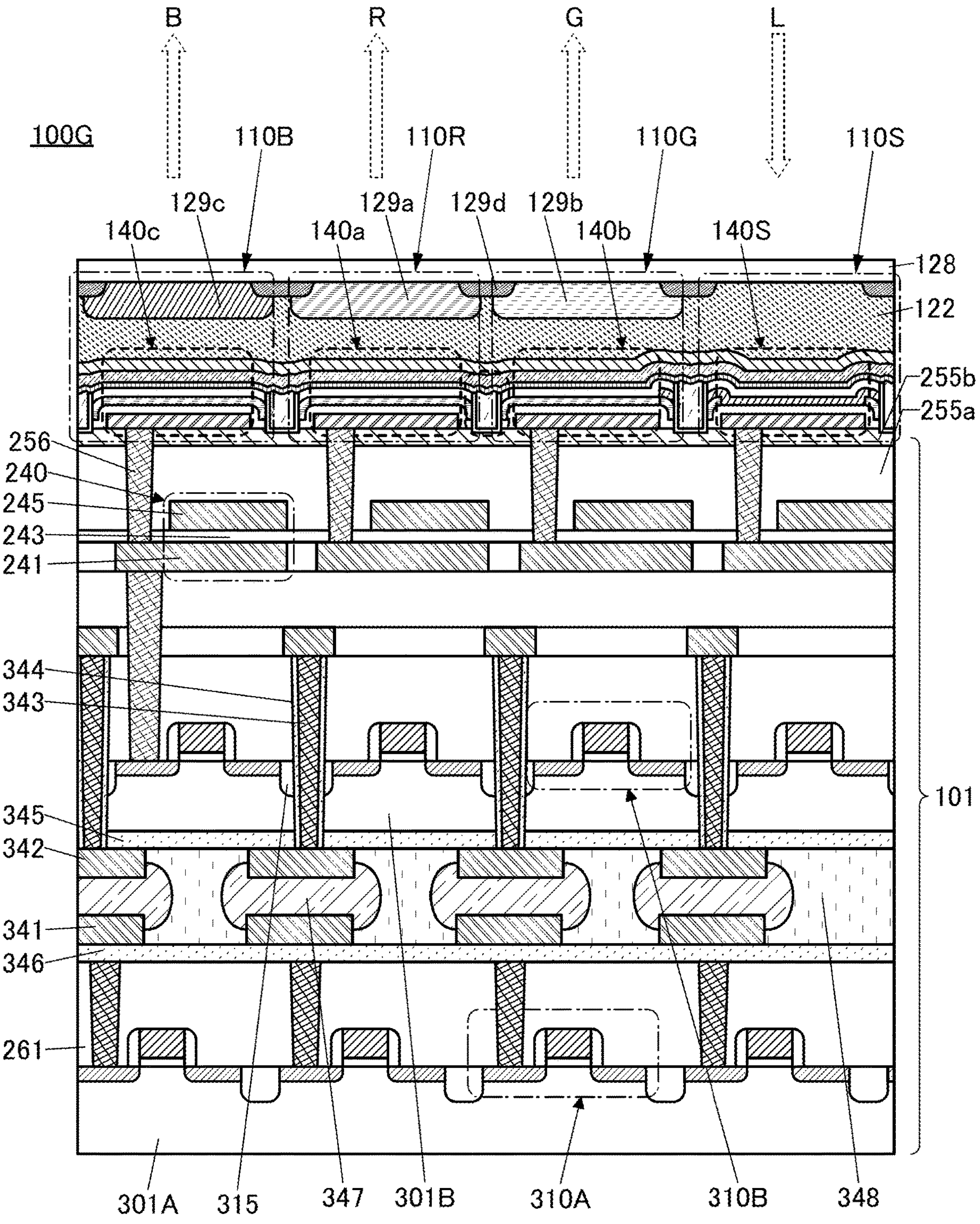
FIG. 17 is a cross-sectional view illustrating an example of a display apparatus.

Although FIG. 16 illustrates an example in which Cu—Cu direct bonding is used to bond the conductive layer 341 and the conductive layer 342, the present invention is not limited thereto. As illustrated in FIG. 17, the conductive layer 341 and the conductive layer 342 may be bonded to each other through a bump 347 in a display apparatus 100G.

As illustrated in FIG. 17, providing the bump 347 between the conductive layer 341 and the conductive layer 342 enables the conductive layer 341 and the conductive layer 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

This embodiment can be combined with the other embodiments as appropriate.

Embodiment 4

In this embodiment, a display apparatus of one embodiment of the present invention will be described.

The display apparatus of one embodiment of the present invention includes a light-receiving element (also referred to as a light-receiving element) and a light-emitting element (also referred to as a light-emitting element). Alternatively, the display apparatus of one embodiment of the present invention may include a light-emitting and light-receiving element (also referred to as a light-emitting and light-receiving element) and a light-emitting element.

First, a display apparatus including a light-receiving element and a light-emitting element is described.

The display apparatus of one embodiment of the present invention includes a light-receiving element and a light-emitting element in a light-emitting and light-receiving portion. In the display apparatus of one embodiment of the present invention, the light-emitting elements are arranged in a matrix in the light-emitting and light-receiving portion, and an image can be displayed on the light-emitting and light-receiving portion. Furthermore, the light-receiving elements are arranged in a matrix in the light-emitting and light-receiving portion, and the light-emitting and light-receiving portion has one or both of an image capturing function and a sensing function. The light-emitting and light-receiving portion can be used as an image sensor, a touch sensor, or the like. That is, by detecting light with the light-emitting and light-receiving portion, an image can be captured and touch operation of an object (e.g., a finger or a stylus) can be detected. Furthermore, in the display apparatus of one embodiment of the present invention, the light-emitting elements can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting element included in the light-emitting and light-receiving portion, the light-receiving element can detect the reflected light (or the scattered light); thus, image capturing, touch operation detection, or the like is possible even in a dark place.

The light-emitting element included in the display apparatus of one embodiment of the present invention functions as a display element (also referred to as a display device).

As the light-emitting element, an EL element (also referred to as an EL device) such as an OLED or a QLED is preferably used. Examples of a light-emitting substance contained in the EL element include a substance exhibiting fluorescence (a fluorescent material), a substance exhibiting phosphorescence (a phosphorescent material), inorganic compounds (e.g., quantum dot materials), and a substance exhibiting thermally activated delayed fluorescence (a thermally activated delayed fluorescent (TADF) material). An LED such as a micro LED can also be used as the light-emitting element.

The display apparatus of one embodiment of the present invention has a function of detecting light with the use of a light-receiving element.

When the light-receiving elements are used as an image sensor, the display apparatus can capture an image using the light-receiving elements. For example, the display apparatus can be used as a scanner.

An electronic device including the display apparatus of one embodiment of the present invention can obtain data related to biological information such as a fingerprint or a palm print by using a function of an image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the size and weight of the electronic device can be reduced.

When the light-receiving elements are used as the touch sensor, the display apparatus can detect touch operation of an object with the use of the light-receiving elements.

As the light-receiving element, a pn photodiode or a pin photodiode can be used, for example. The light-receiving element functions as a photoelectric conversion element (also referred to as a photoelectric conversion device) that detects light entering the light-receiving element and generates charge. The amount of charge generated from the light-receiving element depends on the amount of light entering the light-receiving element.

It is particularly preferable to use an organic photodiode including a layer containing an organic compound as the light-receiving element. An organic photodiode, which is easily made thin, lightweight, and large in area and has a high degree of freedom for shape and design, can be used in a variety of devices.

In one embodiment of the present invention, organic EL elements (also referred to as organic EL devices) are used as the light-emitting elements, and organic photodiodes are used as the light-receiving elements. The organic EL elements and the organic photodiodes can be formed over one substrate. Thus, the organic photodiodes can be incorporated in the display apparatus including the organic EL elements.

In the case where all the layers of the organic EL elements and the organic photodiodes are formed separately, the number of film formation steps becomes extremely large. However, a large number of layers of the organic photodiodes can have a structure in common with the organic EL elements; thus, concurrently forming the layers that can have a common structure can inhibit an increase in the number of film formation steps.

For example, one of a pair of electrodes (a common electrode) can be a layer shared by the light-receiving element and the light-emitting element. For example, at least one of a hole-injection layer, a hole-transport layer, an electron-transport layer, and an electron-injection layer may be a layer shared by the light-receiving element and the light-emitting element. When the light-receiving element and the light-emitting element include a common layer in such a manner, the number of film formation steps and the number of masks can be reduced, thereby reducing the number of manufacturing steps and the manufacturing cost of the display apparatus. Furthermore, the display apparatus including the light-receiving element can be manufactured using an existing manufacturing apparatus and an existing manufacturing method for the display apparatus.

Next, a display apparatus including light-emitting and light-receiving elements and light-emitting elements is described. Note that functions, behavior, effects, and the like similar to those in the above are not described in some cases.

In the display apparatus of one embodiment of the present invention, a subpixel exhibiting any color includes a light-emitting and light-receiving element instead of a light-emitting element, and subpixels exhibiting the other colors each include a light-emitting element.

The light-emitting and light-receiving element has both a function of emitting light (a light-emitting function) and a function of receiving light (a light-receiving function). For example, in the case where a pixel includes three subpixels of a red subpixel, a green subpixel, and a blue subpixel, at least one of the subpixels includes a light-emitting and light-receiving element, and the other subpixels each include a light-emitting element. Thus, the light-emitting and light-receiving portion of the display apparatus of one embodiment of the present invention has a function of displaying an image using both light-emitting and light-receiving elements and light-emitting elements.

The light-emitting and light-receiving element functions as both a light-emitting element and a light-receiving element, whereby the pixel can have a light-receiving function without an increase in the number of subpixels included in the pixel. Thus, the light-emitting and light-receiving portion of the display apparatus can be provided with one or both of an image capturing function and a sensing function while keeping the aperture ratio of the pixel (aperture ratio of each subpixel) and the resolution of the display apparatus. Accordingly, in the display apparatus of one embodiment of the present invention, the aperture ratio of the pixel can be more increased and the resolution can be increased more easily than in a display apparatus provided with a subpixel including a light-receiving element separately from a subpixel including a light-emitting element.

In the light-emitting and light-receiving portion of the display apparatus of one embodiment of the present invention, the light-emitting and light-receiving elements and the light-emitting elements are arranged in a matrix, and an image can be displayed on the light-emitting and light-receiving portion. The light-emitting and light-receiving portion can be used as an image sensor, a touch sensor, or the like. In the display apparatus of one embodiment of the present invention, the light-emitting elements can be used as a light source of the sensor. Thus, image capturing, touch operation detection, or the like is possible even in a dark place.

The light-emitting and light-receiving element can be manufactured by combining an organic EL element and an organic photodiode. For example, by adding an active layer of an organic photodiode to a stacked-layer structure of an organic EL element, the light-emitting and light-receiving element can be manufactured. Furthermore, in the light-emitting and light-receiving element manufactured by combining an organic EL element and an organic photodiode, concurrently forming layers that can be shared by the organic EL element can inhibit an increase in the number of film formation steps.

For example, one of a pair of electrodes (a common electrode) can be a layer shared by the light-emitting and light-receiving element and the light-emitting element. For example, at least one of a hole-injection layer, a hole-transport layer, an electron-transport layer, and an electron-injection layer may be a layer shared by the light-emitting and light-receiving element and the light-emitting element.

Note that a layer included in the light-emitting and light-receiving element might have a different function between the case where the light-emitting and light-receiving element functions as a light-receiving element and the case where the light-emitting and light-receiving element functions as a light-emitting element. In this specification, the name of a component is based on its function in the case where the light-emitting and light-receiving element functions as a light-emitting element.

The display apparatus of this embodiment has a function of displaying an image with the use of the light-emitting elements and the light-emitting and light-receiving elements. That is, the light-emitting elements and the light-emitting and light-receiving elements function as display elements.

The display apparatus of this embodiment has a function of detecting light with the use of the light-emitting and light-receiving elements. The light-emitting and light-receiving element can detect light having a shorter wavelength than light emitted from the light-emitting and light-receiving element itself.

When the light-emitting and light-receiving elements are used as an image sensor, the display apparatus of this embodiment can capture an image using the light-emitting and light-receiving elements. When the light-emitting and light-receiving elements are used as a touch sensor, the display apparatus of this embodiment can detect touch operation of an object with the use of the light-emitting and light-receiving elements.

The light-emitting and light-receiving element functions as a photoelectric conversion element. The light-emitting and light-receiving element can be manufactured by adding an active layer of the light-receiving element to the above-described structure of the light-emitting element. For the light-emitting and light-receiving element, an active layer of a pn photodiode or a pin photodiode can be used, for example.

It is particularly preferable to use, for the light-emitting and light-receiving element, an active layer of an organic photodiode including a layer containing an organic compound. An organic photodiode, which is easily made thin, lightweight, and large in area and has a high degree of freedom for shape and design, can be used in a variety of devices.

The display apparatus that is an example of the display apparatus of one embodiment of the present invention is specifically described below with reference to drawings.

Structure Example 1 of Display Apparatus

Structure Example 1-1

Figure 18A:
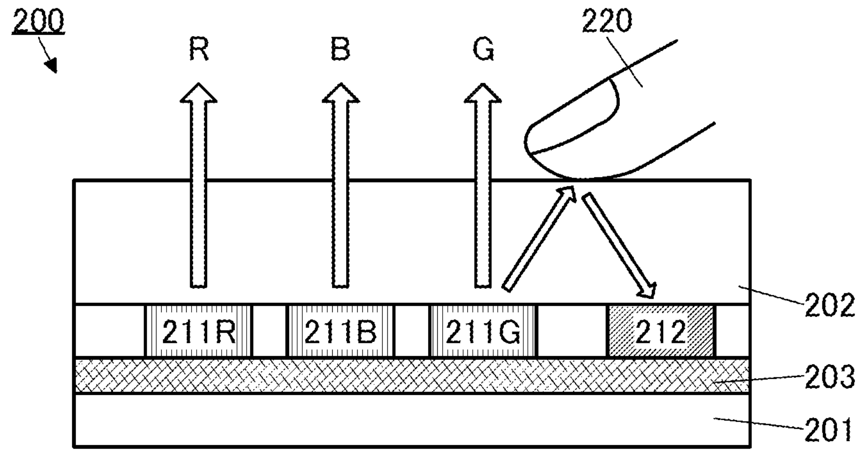
FIG. 18A, FIG. 18B, and FIG. 18D are cross-sectional views illustrating an example of a display apparatus.

FIG. 18A is a schematic view of a display panel 200. The display panel 200 includes a substrate 201, a substrate 202, a light-receiving element 212, a light-emitting element 211R, a light-emitting element 211G, a light-emitting element 211B, a functional layer 203, and the like.

The light-emitting element 211R, the light-emitting element 211G, the light-emitting element 211B, the light-receiving element 212 are provided between the substrate 201 and the substrate 202. The light-emitting element 211R, the light-emitting element 211G, and the light-emitting element 211B emit red (R) light, green (G) light, and blue (B) light, respectively. Note that in the following description, the term "light-emitting element 211" may be used when the light-emitting element 211R, the light-emitting element 211G, and the light-emitting element 211B are not distinguished from each other.

The display panel 200 includes a plurality of pixels arranged in a matrix. One pixel includes one or more subpixels. One subpixel includes one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes the light-receiving element 212. The light-receiving element 212 may be provided in all the pixels or may be provided in some of the pixels. In addition, one pixel may include a plurality of light-receiving elements 212.

FIG. 18A illustrates a finger 220 touching a surface of the substrate 202. Part of light emitted from the light-emitting element 211G is reflected at a contact portion of the substrate 202 and the finger 220. In the case where part of the reflected light is incident on the light-receiving element 212, the contact of the finger 220 with the substrate 202 can be detected. That is, the display panel 200 can function as a touch panel.

The functional layer 203 includes a circuit for driving the light-emitting element 211R, the light-emitting element 211G, and the light-emitting element 211B and a circuit for driving the light-receiving element 212. The functional layer 203 is provided with a switch, a transistor, a capacitor, a wiring, and the like. Note that in the case where the light-emitting element 211R, the light-emitting element 211G, the light-emitting element 211B, and the light-receiving element 212 are driven by a passive-matrix method, a structure not provided with a switch, a transistor, or the like may be employed.

Figure 18B:
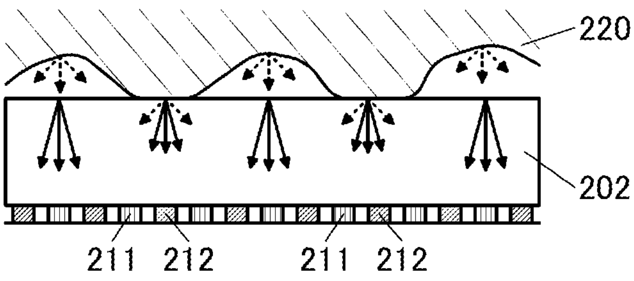

The display panel 200 preferably has a function of detecting a fingerprint of the finger 220. FIG. 18B schematically illustrates an enlarged view of the contact portion in a state where the finger 220 touches the substrate 202. FIG. 18B illustrates light-emitting elements 211 and the light-receiving elements 212 that are alternately arranged.

The fingerprint of the finger 220 is formed of depressed portions and projected portions. Therefore, as illustrated in FIG. 18B, the projected portions of the fingerprint touch the substrate 202.

Reflection of light from a surface, an interface, or the like is categorized into regular reflection and diffuse reflection. Regularly reflected light is highly directional light with an angle of reflection equal to the angle of incidence. Diffusely reflected light has low directionality and low angular dependence of intensity. As for regular reflection and diffuse reflection, diffuse reflection components are dominant in the light reflected from the surface of the finger 220. Meanwhile, regular reflection components are dominant in the light reflected from the interface between the substrate 202 and the air.

The intensity of light that is reflected from contact surfaces or non-contact surfaces between the finger 220 and the substrate 202 and is incident on the light-receiving elements 212 positioned directly below the contact surfaces or the non-contact surfaces is the sum of intensities of regularly reflected light and diffusely reflected light. As described above, regularly reflected light (indicated by solid arrows) is dominant near the depressed portions of the finger 220, where the finger 220 is not in contact with the substrate 202; whereas diffusely reflected light (indicated by dashed arrows) from the finger 220 is dominant near the projected portions of the finger 220, where the finger 220 is in contact with the substrate 202. Thus, the intensity of light received by the light-receiving element 212 positioned directly below the depressed portion is higher than the intensity of light received by the light-receiving element 212 positioned directly below the projected portion. Accordingly, a fingerprint image of the finger 220 can be captured.

In the case where an arrangement interval between the light-receiving elements 212 is smaller than a distance between two projected portions of a fingerprint, preferably a distance between a depressed portion and a projected portion adjacent to each other, a clear fingerprint image can be obtained. The distance between a depressed portion and a projected portion of a human's fingerprint is approximately 200 μm; thus, the arrangement interval between the light-receiving elements 212 is, for example, less than or equal to 400 μm, preferably less than or equal to 200 μm, further preferably less than or equal to 150 μm, still further preferably less than or equal to 100 μm, even still further preferably less than or equal to 50 μm and greater than or equal to 1 μm, preferably greater than or equal to 10 μm, further preferably greater than or equal to 20 μm.

Figure 18C:
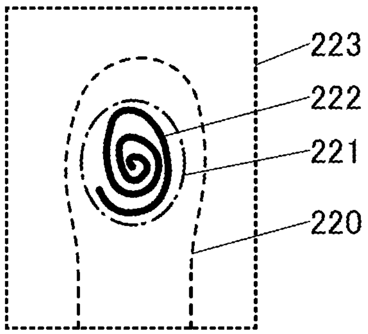
FIG. 18C and FIG. 18E are diagrams illustrating examples of images.

FIG. 18C illustrates an example of a fingerprint image captured by the display panel 200. In an image-capturing range 223 in FIG. 18C, the outline of the finger 220 is indicated by a dashed line and the outline of a contact portion 221 is indicated by a dashed-dotted line. In the contact portion 221, a high-contrast image of a fingerprint 222 can be captured owing to a difference in the amount of light incident on the light-receiving elements 212.

Figure 18D:
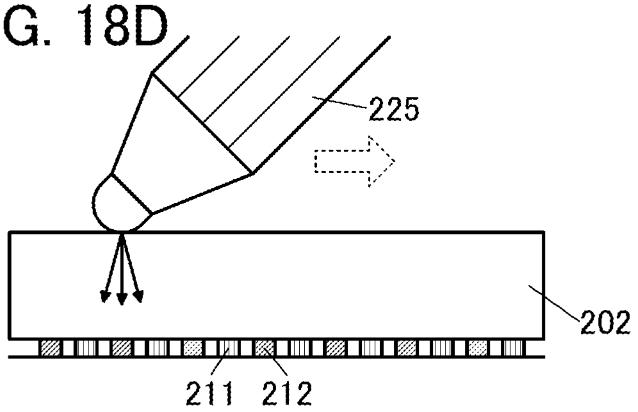

The display panel 200 can also function as a touch panel or a pen tablet. FIG. 18D illustrates a state where a tip of a stylus 225 slides in a direction indicated with a dashed arrow while the tip of the stylus 225 touches the substrate 202.

As illustrated in FIG. 18D, when diffusely reflected light that is diffused at the contact surface of the tip of the stylus 225 and the substrate 202 is incident on the light-receiving element 212 that overlaps with the contact surface, the position of the tip of the stylus 225 can be detected with high accuracy.

Figure 18E:
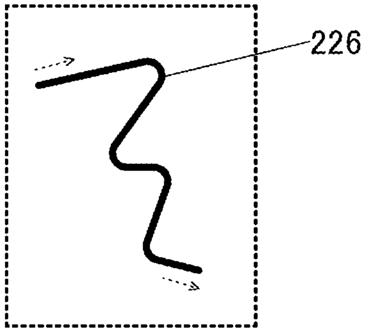

FIG. 18E illustrates an example of a path 226 of the stylus 225 that is detected by the display panel 200. The display panel 200 can detect the position of a detection target, such as the stylus 225, with high position accuracy, so that high-resolution drawing can be performed using a drawing application or the like. Unlike the case of using a capacitive touch sensor, an electromagnetic induction touch pen, or the like, the display panel 200 can detect even the position of a highly insulating object to be detected, the material of a tip portion of the stylus 225 is not limited, and a variety of writing materials (e.g., a brush, a glass pen, a quill pen, and the like) can be used.

Figure 18F:
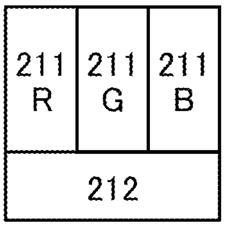
FIG. 18F to FIG. 18H are top views illustrating examples of a pixel.
Figure 18G:
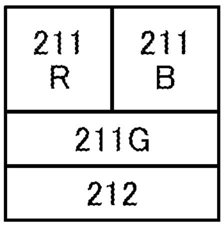
Figure 18H:
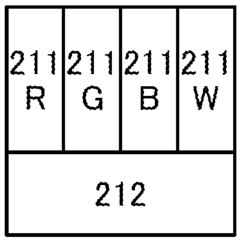

Here, FIG. 18F to FIG. 18H illustrate examples of a pixel that can be used in the display panel 200.

The pixels illustrated in FIG. 18F and FIG. 18G each include the light-emitting element 211R for red (R), the light-emitting element 211G for green (G), the light-emitting element 211B for blue (B), and the light-receiving element 212. The pixels each include a pixel circuit for driving the light-emitting element 211R, the light-emitting element 211G, the light-emitting element 211B, and the light-receiving element 212.

FIG. 18F illustrates an example in which three light-emitting elements are arranged in one line and one horizontally long light-receiving element 212 is provided below the three light-emitting elements. FIG. 18G illustrates an example in which two light-emitting elements are horizontally arranged in one line and one horizontally long light-receiving element and one horizontally long light-receiving element are provided below the two light-emitting elements.

The pixel illustrated in FIG. 18H is an example including a light-emitting element 211W for white (W). Here, four light-emitting elements are arranged in one line and the light-receiving element 212 is provided below the four light-emitting elements.

Note that the pixel structure is not limited to the above structure, and a variety of arrangement methods can be employed.

As described above, the display apparatus of this embodiment can employ any of various types of pixel arrangements.

At least part of this embodiment can be implemented in combination with the other embodiments described in this specification as appropriate.

Embodiment 5

In this embodiment, an example of a display apparatus including a light-receiving element and the like of one embodiment of the present invention will be described.

In the display apparatus of this embodiment, a pixel can include a plurality of types of subpixels including light-emitting elements that emit light of different colors. For example, the pixel can include three types of subpixels. The three subpixels can be of three colors of red (R), green (G), and blue (B) or of three colors of yellow (Y), cyan (C), and magenta (M), for example. Alternatively, the pixel can include four types of subpixels. The four subpixels can be of four colors of R, G, B, and white (W) or of four colors of R, G, B, and Y, for example.

There is no particular limitation on the arrangement of subpixels, and a variety of methods can be employed. Examples of the arrangement of subpixels include a stripe arrangement, an S-stripe arrangement, a matrix arrangement, a delta arrangement, a Bayer arrangement, and a PenTile arrangement.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting element.

In the display apparatus including light-emitting elements and a light-receiving element in each pixel, the pixel has a light-receiving function; thus, the display apparatus can detect a contact or approach of an object while displaying an image. For example, an image can be displayed by using all the subpixels included in the display apparatus; or light can be emitted by some of the subpixels as a light source and an image can be displayed by using the other subpixels.

FIG. 19A to FIG. 19E illustrate examples of arrangement of subpixels included in the pixel Px.

Each of the pixels Px illustrated in FIG. 19A to FIG. 19E includes a region 218 and a subpixel PS. The region 218 includes a subpixel R, a subpixel G, and a subpixel B. FIG. 19F to FIG. 19H illustrate examples of arrangement of the subpixel R, the subpixel G, and the subpixel B in the region 218.

In the pixel Px illustrated in FIG. 19A, the subpixel PS is provided below the region 218. A pixel Px adjacent to the pixel Px illustrated in FIG. 19A may be inverted up and down as illustrated in FIG. 19B, for example. Note that FIG. 20A and FIG. 20B illustrate examples in which a plurality of pixels Px are arranged. In the examples illustrated in FIG. 20A and FIG. 20B, the structure illustrated in FIG. 19F is applied to the region 218. In FIG. 20A and FIG. 20B, the subpixels R, G, and B in the pixel Px are arranged along an angle of 45° to the x-axis direction. Note that in FIG. 20, the x-axis and the y-axis are perpendicular to each other, and the x-axis is a direction along one side of a display portion of the display apparatus, for example. One of the x-axis and the y-axis is a long side direction of the display portion of the display apparatus, for example. FIG. 20A illustrates an example in which the pixels Px having the same layout are arranged, and FIG. 20B illustrates an example in which two pixels Px having line symmetrical structures are alternately arranged.

Figure 19A:
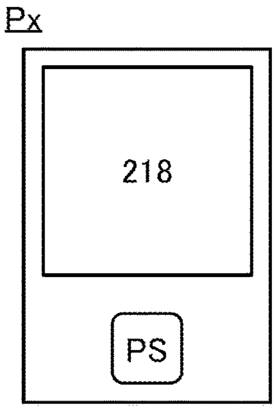
FIG. 19A to FIG. 19J are diagrams illustrating examples of a pixel.
Figure 19B:
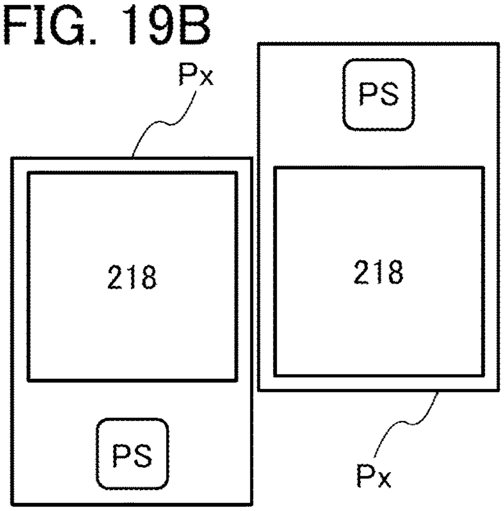
Figure 19C:
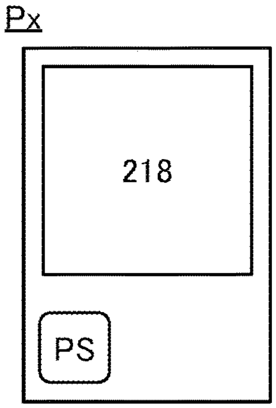
Figure 19D:
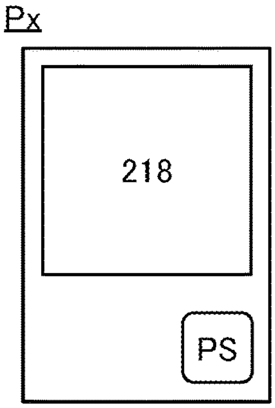
Figure 19E:
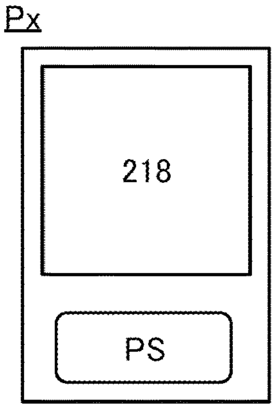
Figure 19F:
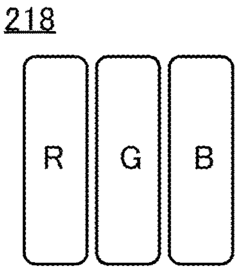
Figure 19G:
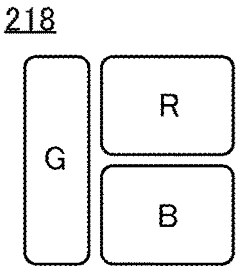
Figure 19H:
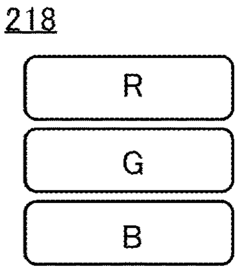
Figure 20A:
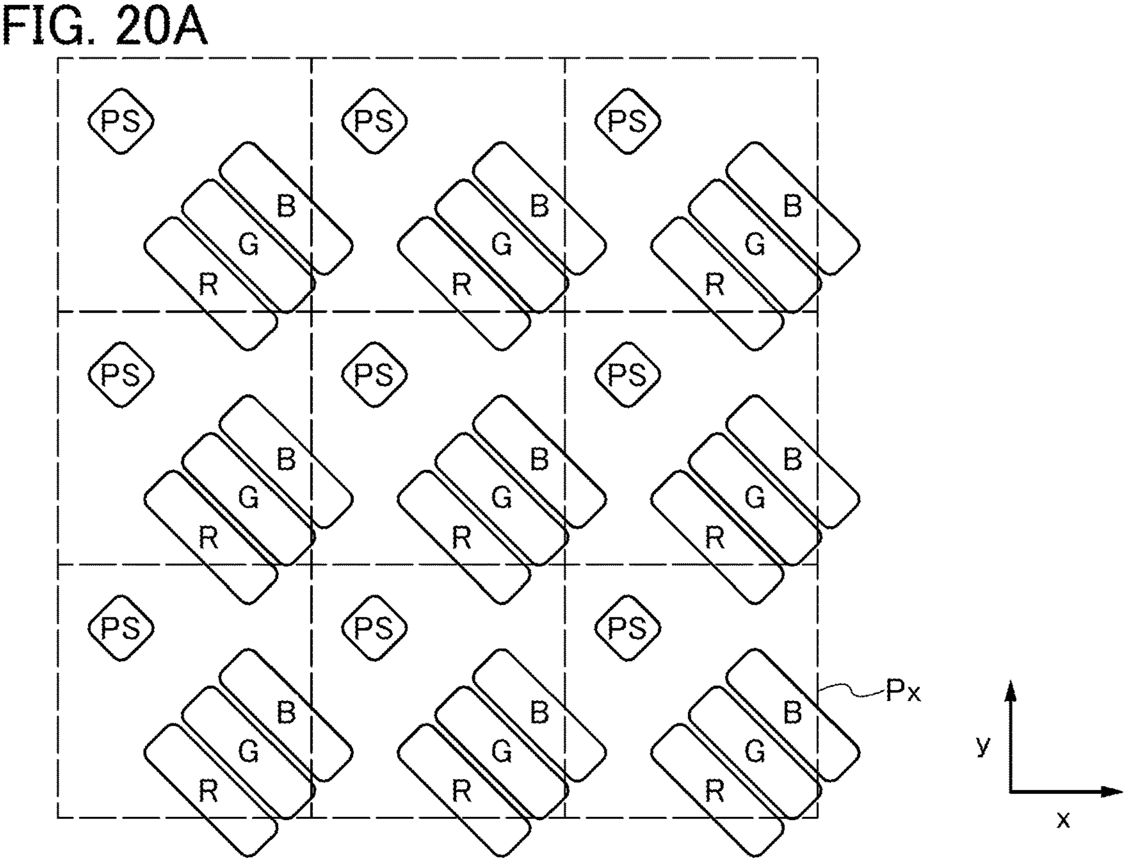
FIG. 20A and FIG. 20B are diagrams illustrating examples of a pixel.
Figure 20B:
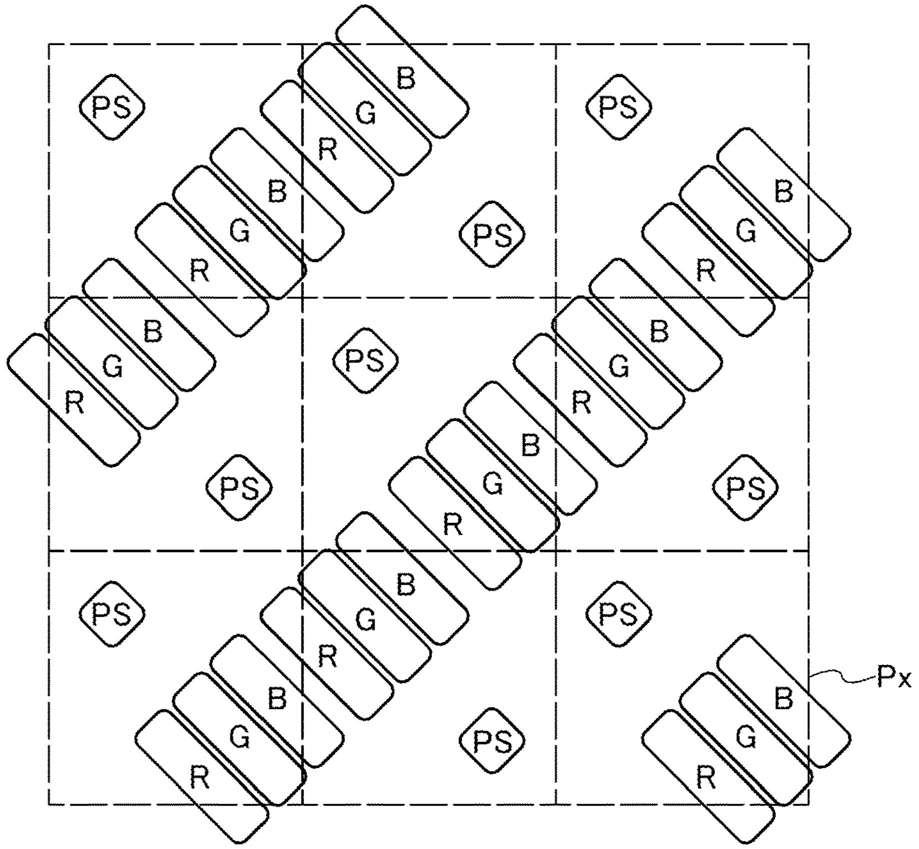

FIG. 19A illustrates an example in which the subpixel PS is placed near the center in the horizontal direction of the pixel Px, FIG. 19C illustrates an example in which the subpixel PS is placed on the left side, and FIG. 19D illustrates an example in which the subpixel PS is placed on the right side. FIG. 19E illustrates an example in which the subpixel PS has a horizontally long shape. In some cases, an image captured by the subpixel PS in each of FIG. 19A, FIG. 19C, and FIG. 19D has a higher definion than an image captured by the subpixel PS in FIG. 19E, for example. In some cases, an image captured by the subpixel PS in FIG. 19E has a higher sensitivity than an image captured by the subpixel PS in each of FIG. 19A, FIG. 19C, and FIG. 19D, for example.

The cases where the layout of the region 218 in FIG. 19F is applied to FIG. 19A, FIG. 19C, and FIG. 19D are described. In that case, in FIG. 19A, the subpixel G among the subpixel R, the subpixel G, and the subpixel B is placed closest to the subpixel PS. In FIG. 19C, the subpixel R among the subpixel R, the subpixel G, and the subpixel B is placed closest to the subpixel PS. In FIG. 19D, the subpixel B among the subpixel R, the subpixel G, and the subpixel B is placed closest to the subpixel PS.

FIG. 19F illustrates an example in which the vertically long subpixel R, subpixel G, and subpixel B are arranged laterally in stripes in the region 218. FIG. 19G illustrates an example in which the subpixel R, the subpixel G, and the subpixel B are arranged in two columns in the horizontal direction: the subpixel G is placed in the first column and the subpixel R and the subpixel B are placed above and below in the second column in the region 218. FIG. 19H illustrates an example in which the horizontally long subpixel R, subpixel G, and subpixel B are arranged vertically in stripes in the region 218.

Figure 19I:
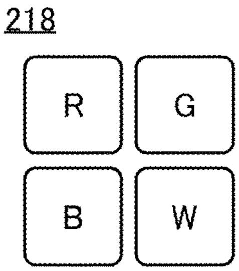
Figure 19J:
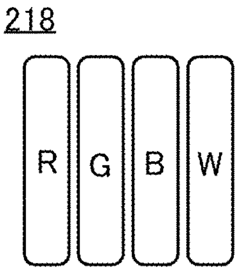

FIG. 19I and FIG. 19J illustrate examples in which the region 218 includes the subpixel R, the subpixel G, the subpixel B, and a subpixel W. FIG. 19I illustrates an example in which the subpixel R, the subpixel G, the subpixel B, and the subpixel W are arranged in a matrix in the region 218. FIG. 19J illustrates an example in which the horizontally long subpixel R, subpixel G, subpixel B, and subpixel W are arranged laterally in stripes in the region 218.

Here, white light emitted from the subpixel W may be light that instantaneously has high luminance, such as light emitted from a flashlight or a strobe light, or may be light with high rendering properties, such as light emitted from a reading light. In the case where white light is used for a reading light or the like, the color temperature of white light is set low. For example, when white light is made to have incandescent light color (e.g., higher than or equal to 2500 K and lower than 3250 K) or warm white (higher than or equal to 3250 K and lower than 3800 K), a light source that is easy on the user's eyes can be obtained.

A strobe light function can be obtained, for example, by repetition of light emission and non-light emission at short intervals. A flashlight function can be obtained, for example, with a structure where flash of light is caused by instantaneous discharge using principles of an electric double layer.

For example, when an electronic device has a camera function, the electronic device can take images at night by using a strobe light function or a flashlight function. Here, the display apparatus of the electronic device functions as a planar light source, so that a subject is less likely to be shadowed; thus, a clear image can be taken. Note that a strobe light function or a flashlight function can be used in any environment including night. In the case where the electronic device has a strobe light function or a flashlight function, the color temperature of white light can be set high. For example, the color temperature of light emitted from the electronic device can be set to white (higher than or equal to 3800 K and lower than 4500 K), neutral white (higher than or equal to 4500 K and lower than 5500 K), or daylight white (higher than or equal to 5500 K and lower than 7100 K).

When the intensity of light from a flash is excessively high, portions that originally have different brightnesses might be uniformly white in an image (i.e., blown-out highlights). On the other hand, when the intensity of light from a flash is too low, dark portions might be uniformly black in an image (i.e., blocked up shadows). In view of the above, a light-receiving element included in the display apparatus may sense brightness around a subject, whereby the amount of light from the light-emitting element included in the subpixel can be adjusted to be optimal. That is, the electronic device can be regarded as having a function of an exposure meter.

A strobe light function and a flashlight function can be used for crime prevention, self-defense, or the like.

To improve the color-rendering properties of light from the light-emitting element included in the subpixel W, it is preferable to increase the number of light-emitting layers included in the light-emitting element or the number of kinds of light-emitting substances contained in the light-emitting layer. Accordingly, a broad light emission spectrum having intensities in a wider wavelength range can be obtained; thus, light that is close to sunlight and has higher color-rendering properties can be emitted.

White light emission is preferred for the above lighting applications. However, there is no particular limitation on the light emission color for the lighting applications; the practitioner can appropriately select one or more optimal light emission colors from white, blue, violet, bluish violet, green, yellowish green, yellow, orange, red, and the like.

Figure 21A:
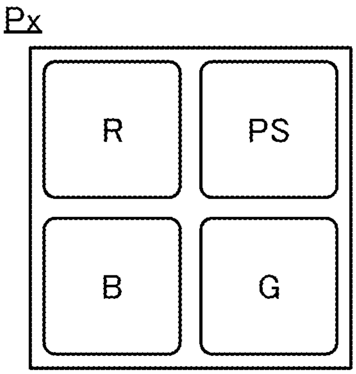
FIG. 21A to FIG. 21H are diagrams illustrating examples of a pixel.
Figure 21B:
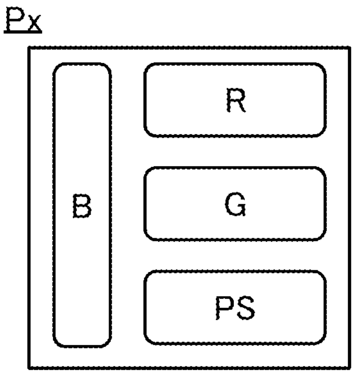

FIG. 21A and FIG. 21B illustrate examples of arrangement of the subpixel R, the subpixel G, the subpixel B, and the subpixel PS included in the pixel Px.

The pixel Px illustrated in FIG. 21A shows an example in which four subpixels (the subpixel R, the subpixel G, the subpixel B, and the subpixel PS) are arranged in a matrix.

In the pixel illustrated in FIG. 21B, three subpixels (the subpixel R, the subpixel G, and the subpixel S) are vertically arranged next to one subpixel (the subpixel B).

Figure 21C:
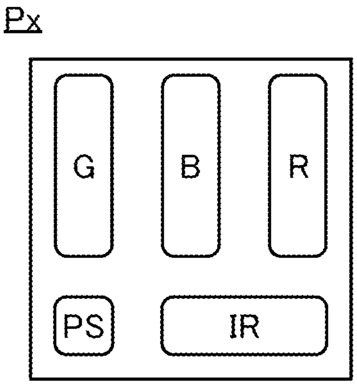
Figure 21D:
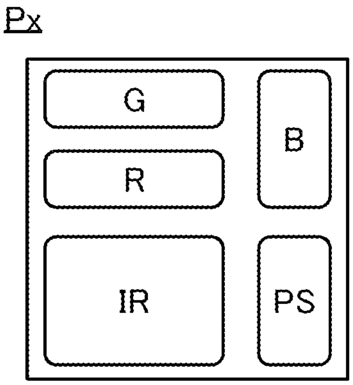
Figure 21E:
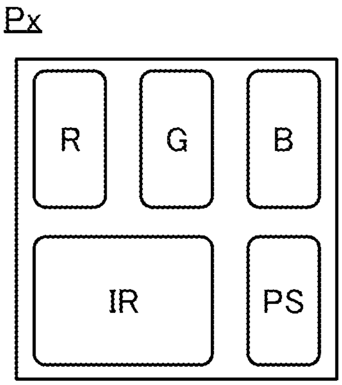

FIG. 21C to FIG. 21E illustrate examples of arrangement of the subpixel G, the subpixel B, the subpixel R, the subpixel IR, and the subpixel PS included in the pixel Px.

FIG. 21C, FIG. 21D, and FIG. 21E illustrate examples in which one pixel is provided in two rows. Three subpixels (the subpixel G, the subpixel B, and the subpixel R) are provided in the upper row (first row), and two subpixels (one subpixel PS and one subpixel IR) are provided in the lower row (second row).

In FIG. 21C, the three vertically long subpixel G, subpixel B, and subpixel R are arranged laterally, and the subpixel PS and the horizontally long subpixel IR are arranged laterally below the three subpixels. In FIG. 21D, the two horizontally long subpixel G and subpixel R are arranged in the vertical direction; the vertically long subpixel B is arranged laterally next to the subpixels G and R; and the horizontally long subpixel IR and the vertically long subpixel PS are arranged laterally below the subpixels R, G, and B. In FIG. 21E, the three vertically long subpixel R, subpixel G, and subpixel B are arranged laterally, and the horizontally long subpixel IR and the vertically long subpixel PS are arranged laterally below the subpixels R, G, and B. In FIG. 21D and FIG. 21E, the area of the subpixel IR is the largest, and the area of the subpixel PS is substantially the same as that of the subpixel and the like.

Figure 21F:
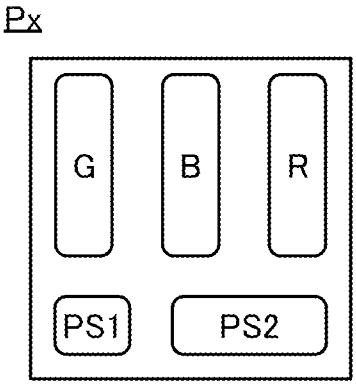

The pixel Px includes two highly sensitive light-receiving elements having different wavelength ranges. The pixel Px illustrated in FIG. 21F includes the three vertically long subpixel G, subpixel B, and subpixel R which are arranged laterally and the subpixel PS1 and the subpixel PS2 which are arranged laterally below the three subpixels. Each of the subpixel PS1 and the subpixel PS2 includes a light-receiving element. The subpixel PS2 has a higher sensitivity in the infrared wavelength range than the subpixel PS1, for example. The subpixel PS1 preferably detects light in blue, violet, bluish violet, green, yellowish green, yellow, orange, and red wavelength ranges, for example. The subpixel PS2 preferably detects light in the infrared wavelength range, for example.

Here, light-receiving elements included in the subpixel PS1 and the subpixel PS2 can include an active layer formed by patterning an organic film formed in the same step. In such a case, for example, in microcavity structures each using a pixel electrode and a common electrode of a light-receiving element, the light-receiving elements have different cavity lengths to enhance wavelength ranges of light detected by the respective light-receiving elements.

The light-receiving elements included in the subpixel PS1 and the subpixel PS2 may include different active layers. In such a case, the active layers included in the light-receiving elements may be formed using different FMMs.

Figure 21G:
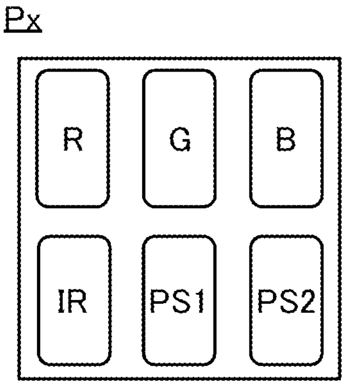

The pixel Px illustrated in FIG. 21G has a structure in which the three vertically long subpixel G, subpixel B, and subpixel R are arranged laterally and the vertically long subpixel IR, subpixel PS1, and subpixel PS2 are arranged laterally below the three subpixels.

Figure 21H:
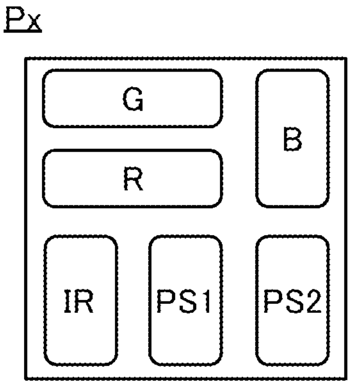

In the pixel Px illustrated in FIG. 21H, the two horizontally long subpixel G and subpixel R are arranged in the vertical direction; the vertically long subpixel B is arranged laterally next to the subpixels G and R; and the vertically long subpixel IR, the vertically long subpixel PS1, and the vertically long subpixel PS2 are arranged laterally below the subpixels R, G, and B.

Note that the layout of the subpixels is not limited to the above structures.

The subpixel R includes a light-emitting element that emits red light. The subpixel G includes a light-emitting element that emits green light. The subpixel B includes a light-emitting element that emits blue light. The subpixel IR includes a light-emitting element that emits infrared light. The subpixel PS includes a light-receiving element. Although there is no particular limitation on the wavelength of light that the subpixel PS detects, the light-receiving element included in the subpixel PS preferably has sensitivity to light emitted from the light-emitting element included in the subpixel R, the subpixel G, the subpixel B, or the subpixel IR. The light-receiving element preferably detects one or more of light in blue, violet, bluish violet, green, yellow green, yellow, orange, red, and infrared wavelength ranges, for example.

The light-receiving area of the subpixel PS is smaller than the light-emitting area of each of the other subpixels. A smaller light-receiving area leads to a narrower image-capturing range, inhibits a blur in an image capturing result, and improves the definition. Thus, by using the subpixel PS, high-resolution or high-definition image capturing is possible. For example, image capturing for personal authentication with the use of a fingerprint, a palm print, the iris, the shape of a blood vessel (including the shape of a vein and the shape of an artery), a face, or the like is possible by using the subpixel PS.

Moreover, the subpixel PS can be used in a touch sensor (also referred to as a direct touch sensor), a near touch sensor (also referred to as a hover sensor, a hover touch sensor, a contactless sensor, or a touchless sensor), or the like. For example, the subpixel PS preferably detects infrared light. With use of an element detecting infrared light, touch detection can be performed even in a dark place. Furthermore, with use of an element detecting infrared light, a black object can be detected. For example, a hand wearing a glove of a dark color such as black can be detected as an object.

Here, the touch sensor or the near touch sensor can detect an approach or contact of an object (e.g., a finger, a hand, or a pen). The touch sensor can detect an object when the display apparatus and the object come in direct contact with each other. The near touch sensor can detect an object even when the object is not in contact with the display apparatus. For example, the display apparatus can preferably detect an object when the distance between the display apparatus and the object is more than or equal to 0.1 mm and less than or equal to 300 mm, preferably more than or equal to 3 mm and less than or equal to 50 mm. With this structure, the display apparatus can be controlled without an object directly contacting with the display apparatus. In other words, the display apparatus can be controlled in a contactless (touchless) manner. With the above structure, the display apparatus can have a reduced risk of being dirty or damaged, or can be operated without the object directly touching a dirt (e.g., dust or a virus) attached to the display apparatus.

For high-resolution image capturing, the subpixel PS is preferably provided in every pixel included in the display apparatus. Meanwhile, in the case where the subpixel PS is used in a touch sensor, a near touch sensor, or the like, high accuracy is not required as compared to the case of capturing an image of a fingerprint or the like; accordingly, the subpixel PS is provided in some of the pixels in the display apparatus. When the number of subpixels PS included in the display apparatus is smaller than the number of subpixels R, for example, higher detection speed can be achieved.

Figure 22A:
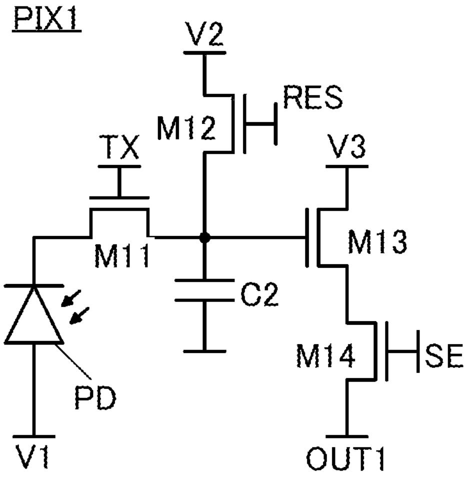
FIG. 22A and FIG. 22B are diagrams illustrating examples of circuit diagrams of pixels.
Figure 22B:
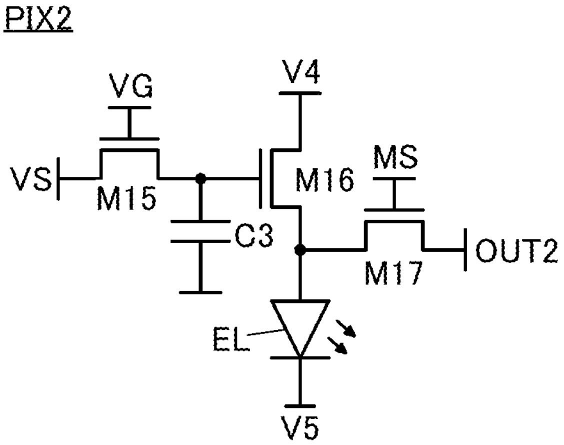

FIG. 22A illustrates an example of a pixel circuit for a subpixel including a light-receiving element. FIG. 22B illustrates an example of a pixel circuit for a subpixel including a light-emitting element.

A pixel circuit PIX1 illustrated in FIG. 22A includes a light-receiving element PD, a transistor M11, a transistor M12, a transistor M13, a transistor M14, and a capacitor C2. Here, a photodiode is used as an example of the light-receiving element PD.

An anode of the light-receiving element PD is electrically connected to a wiring V1, and a cathode of the light-receiving element PD is electrically connected to one of a source and a drain of the transistor M11. A gate of the transistor M11 is electrically connected to a wiring TX, and the other of the source and the drain of the transistor M11 is electrically connected to one electrode of the capacitor C2, one of a source and a drain of the transistor M12, and a gate of the transistor M13. A gate of the transistor M12 is electrically connected to a wiring RES, and the other of the source and the drain of the transistor M12 is electrically connected to a wiring V2. One of a source and a drain of the transistor M13 is electrically connected to a wiring V3, and the other of the source and the drain of the transistor M13 is electrically connected to one of a source and a drain of the transistor M14. A gate of the transistor M14 is electrically connected to a wiring SE, and the other of the source and the drain of the transistor M14 is electrically connected to a wiring OUT1.

A constant potential is supplied to the wiring V1, the wiring V2, and the wiring V3. When the light-receiving element PD is driven with a reverse bias, the wiring V2 is supplied with a potential higher than the potential of the wiring V1. The transistor M12 is controlled by a signal supplied to the wiring RES and has a function of resetting the potential of a node connected to the gate of the transistor M13 to a potential supplied to the wiring V2. The transistor M11 is controlled by a signal supplied to the wiring TX and has a function of controlling the timing at which the potential of the node changes, in accordance with current flowing through the light-receiving element PD. The transistor M13 functions as an amplifier transistor for performing output corresponding to the potential of the node. The transistor M14 is controlled by a signal supplied to the wiring SE and functions as a selection transistor for reading an output corresponding to the potential of the node by an external circuit connected to the wiring OUT1.

A pixel circuit PIX2 illustrated in FIG. 22B includes a light-emitting element EL, a transistor M15, a transistor M16, a transistor M17, and a capacitor C3. Here, a light-emitting diode is used as an example of the light-emitting element EL. In particular, an organic EL element is preferably used as the light-emitting element EL.

A gate of the transistor M15 is electrically connected to a wiring VG, one of a source and a drain of the transistor M15 is electrically connected to a wiring VS, and the other of the source and the drain of the transistor M15 is electrically connected to one electrode of the capacitor C3 and a gate of the transistor M16. One of a source and a drain of the transistor M16 is electrically connected to a wiring V4, and the other of the source and the drain of the transistor M16 is electrically connected to an anode of the light-emitting element EL and one of a source and a drain of the transistor M17. A gate of the transistor M17 is electrically connected to a wiring MS, and the other of the source and the drain of the transistor M17 is electrically connected to a wiring OUT2. A cathode of the light-emitting element EL is electrically connected to a wiring V5.

A constant potential is supplied to the wiring V4 and the wiring V5. The anode of the light-emitting element EL can be set to a high potential, and the cathode can be set to a lower potential than the anode. The transistor M15 is controlled by a signal supplied to the wiring VG and functions as a selection transistor for controlling a selection state of the pixel circuit PIX2. The transistor M16 functions as a driving transistor that controls current flowing through the light-emitting element EL in accordance with a potential supplied to the gate of the transistor M16.

When the transistor M15 is on, a potential supplied to the wiring VS is supplied to the gate of the transistor M16, and the luminance of the light-emitting element EL can be controlled in accordance with the potential. The transistor M17 is controlled by a signal supplied to the wiring MS and has a function of outputting a potential between the transistor M16 and the light-emitting element EL to the outside through the wiring OUT2.

Here, transistors in which a metal oxide (an oxide semiconductor) is used in a semiconductor layer where a channel is formed are preferably used as the transistor M11, the transistor M12, the transistor M13, and the transistor M14 included in the pixel circuit PIX1 and the transistor M15, the transistor M16, and the transistor M17 included in the pixel circuit PIX2.

A transistor using a metal oxide having a wider band gap and a lower carrier density than silicon achieves an extremely low off-state current. Therefore, owing to the low off-state current, charge accumulated in a capacitor that is connected in series to the transistor can be retained for a long time. Hence, it is particularly preferable to use transistors containing an oxide semiconductor as the transistor M11, the transistor M12, and the transistor M15 each of which is connected in series with the capacitor C2 or the capacitor C3. Moreover, the use of transistors using an oxide semiconductor as the other transistors can reduce the manufacturing cost.

For example, the off-state current per micrometer of channel width of an OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude. Alternatively, transistors using silicon as a semiconductor in which a channel is formed can be used as the transistor M11 to the transistor M17. It is particularly preferable to use silicon with high crystallinity, such as single crystal silicon or polycrystalline silicon, because high field-effect mobility can be achieved and higher-speed operation can be performed.

Alternatively, a transistor containing an oxide semiconductor may be used as at least one of the transistor M11 to the transistor M17, and transistors containing silicon may be used as the other transistors.

Although n-channel transistors are illustrated in FIG. 22A and FIG. 22B, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be periodically arranged in one region.

One or more layers including the transistor and/or the capacitor are preferably provided to overlap with the light-receiving element PD or the light-emitting element EL. Thus, the effective area of each pixel circuit can be reduced, and a high-resolution light-receiving portion or display portion can be achieved.

To increase the luminance of the light-emitting element EL included in the pixel circuit, the amount of current fed through the light-emitting element EL needs to be increased. To increase the current amount, the source-drain voltage of a driving transistor included in the pixel circuit needs to be increased. An OS transistor has a higher withstand voltage between a source and a drain than a Si transistor; hence, high voltage can be applied between the source and the drain of the OS transistor. Accordingly, when an OS transistor is used as the driving transistor in the pixel circuit, the amount of current flowing through the light-emitting element can be increased, so that the luminance of the light-emitting element can be increased.

When transistors operate in a saturation region, a change in source-drain current relative to a change in gate-source voltage can be smaller in an OS transistor than in a Si transistor. Accordingly, when an OS transistor is used as the driving transistor included in the pixel circuit, current flowing between the source and the drain can be set minutely by a change in gate-source voltage; hence, the amount of current flowing through the light-emitting element can be controlled. Consequently, the number of gray levels expressed by the pixel circuit can be increased.

Regarding saturation characteristics of current flowing when transistors operate in a saturation region, even in the case where the source-drain voltage of an OS transistor increases gradually, a more stable current (saturation current) can be fed through the OS transistor than through a Si transistor. Thus, by using an OS transistor as the driving transistor, stable current can be fed through light-emitting elements that contain an EL material even when the current-voltage characteristics of the light-emitting elements vary, for example. In other words, when the OS transistor operates in the saturation region, the source-drain current hardly changes with an increase in the source-drain voltage; hence, the luminance of the light-emitting element can be stable.

As described above, by using an OS transistor as the driving transistor included in the pixel circuit, it is possible to achieve "inhibition of black floating", "increase in emission luminance", "increase in gray level", "inhibition of variation in light-emitting elements", and the like.

The refresh rate can be variable in the display apparatus of one embodiment of the present invention. For example, the refresh rate can be adjusted in accordance with the contents displayed on the display apparatus (e.g., adjusted in the range from 0.01 Hz to 240 Hz inclusive), whereby power consumption can be reduced. The driving with a lowered refresh rate for reducing power consumption of a display apparatus may be referred to as idling stop (IDS) driving.

The driving frequency of the touch sensor or the near touch sensor may be changed in accordance with the refresh rate. For example, when the refresh rate of the display apparatus is 120 Hz, the driving frequency of the touch sensor or the near touch sensor can be higher than 120 Hz (can typically be 240 Hz). With this structure, low power consumption can be achieved, and the response speed of the touch sensor or the near touch sensor can be increased.

At least part of this embodiment can be implemented in combination with the other embodiments described in this specification as appropriate.

Embodiment 6

In this embodiment, a light-emitting element (also referred to as a light-emitting device) and a light-receiving element (also referred to as a light-receiving device) that can be used in a light-emitting and light-receiving apparatus of one embodiment of the present invention will be described.

In this specification and the like, an element manufactured using a metal mask or an FMM (a fine metal mask, a high-resolution metal mask) may be referred to as an element having an MM (a metal mask) structure. In this specification and the like, an element manufactured without using a metal mask or an FMM may be referred to as an element having an MML (metal maskless) structure.

In this specification and the like, a structure in which light-emitting layers in light-emitting elements of different colors (here, blue (B), green (G), and red (R)) are separately formed or separately patterned may be referred to as an SBS (Side By Side) structure. In this specification and the like, a light-emitting element capable of emitting white light may be referred to as a white-light-emitting element. Note that a combination of white-light-emitting elements with coloring layers (e.g., color filters) enables a full-color display element.

Light-emitting elements can be classified roughly into a single structure and a tandem structure. An element having a single structure includes one light-emitting unit between a pair of electrodes, and the light-emitting unit preferably includes one or more light-emitting layers.

To obtain white light emission by using two light-emitting layers each having a single structure, two light-emitting layers are selected such that the light-emitting layers emit light of complementary colors. For example, when the emission color of a first light-emitting layer and the emission color of a second light-emitting layer are complementary colors, the light-emitting element can be configured to emit white light as a whole. Specifically, for example, the light-emitting element includes a first light-emitting layer and a second light-emitting layer; the first light-emitting layer contains a light-emitting substance emitting light of a first color and the second light-emitting layer contains a light-emitting substance emitting light of a second color; and the first color and the second color are complementary colors. In the case of a light-emitting element including three or more light-emitting layers, the light-emitting device is configured to emit white light as a whole by combining emission colors of the three or more light-emitting layers.

An element having a tandem structure includes two or more light-emitting units between a pair of electrodes, and each light-emitting unit preferably includes one or more light-emitting layers. When light-emitting layers that emit light of the same color are used in each light-emitting unit, luminance per predetermined current can be increased, and the light-emitting element can have higher reliability than that with a single structure. To obtain white light emission in the tandem structure, the structure is made so that light from light-emitting layers of the plurality of light-emitting units can be combined to be white light. Note that a combination of emission colors for obtaining white light emission is similar to that in the case of a single structure. In the element having a tandem structure, an intermediate layer such as a charge-generation layer is suitably provided between the plurality of light-emitting units.

When the above white-light-emitting element (having a single structure or a tandem structure) and the above light-emitting element having an SBS structure are compared to each other, the light-emitting element having an SBS structure can have lower power consumption than the white-light-emitting element. To reduce power consumption, a light-emitting element having an SBS structure is suitably used. Meanwhile, the white-light-emitting element is suitable in terms of lower manufacturing cost or higher manufacturing yield because the manufacturing process of the white-light-emitting element is simpler than that of the light-emitting element having an SBS structure.

[Element Structure]

Next, detailed structures of the light-emitting element, the light-receiving element, and the light-emitting and light-receiving element which can be used in the display apparatus of one embodiment of the present invention will be described.

The display apparatus of one embodiment of the present invention can have any of the following structures: a top-emission structure in which light is emitted in a direction opposite to the substrate where the light-emitting elements are formed, a bottom-emission structure in which light is emitted toward the substrate where the light-emitting elements are formed, and a dual-emission structure in which light is emitted toward both surfaces.

In this embodiment, a top-emission display apparatus is described as an example.

In this specification and the like, unless otherwise specified, in describing a structure including a plurality of components (e.g., light-emitting elements or light-emitting layers), alphabets are omitted when a common part of the components is described.

Figure 23A:
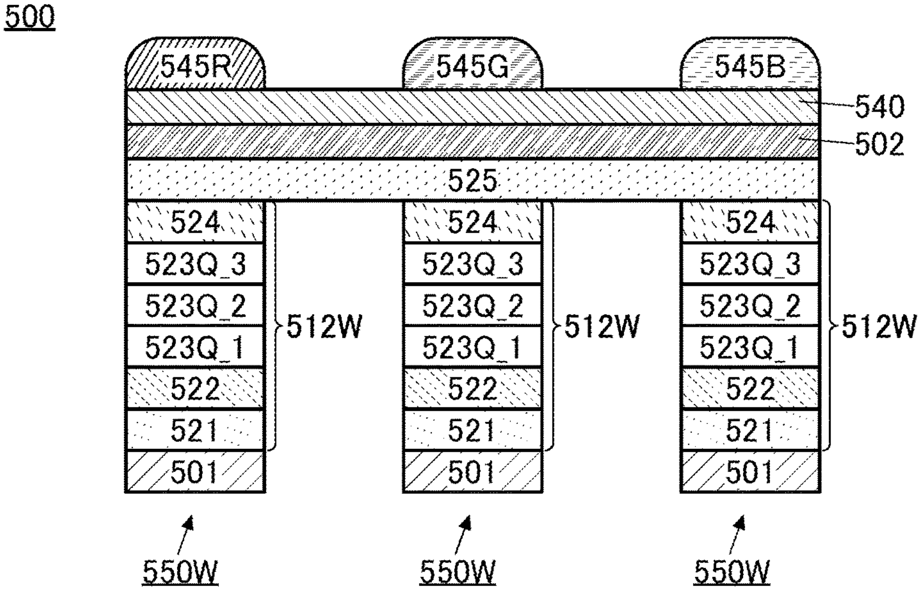
FIG. 23A to FIG. 23F are diagrams illustrating structure examples of a display apparatus.

A display apparatus 500 illustrated in FIG. 23(A) includes a plurality of light-emitting elements 550W which emit white light. A coloring layer 545R that transmits red light, a coloring layer 545G that transmits green light, and a coloring layer 545B that transmits blue light are provided over the respective light-emitting elements 550W. Here, the coloring layer 545R, the coloring layer 545G, and the coloring layer 545B can be provided to overlap with the light-emitting elements 550W with a protective layer 540 therebetween.

The light-emitting element 550W illustrated in FIG. 23A includes a light-emitting unit 511W between a pair of electrodes (an electrode 501 and an electrode 502). The electrode 501 functions as a pixel electrode and is provided for every light-emitting element. The electrode 502 functions as a common electrode and is shared by a plurality of light-emitting elements.

That is, the light-emitting element 550W illustrated in FIG. 23A is a light-emitting element including one light-emitting unit. Note that in this specification, a structure including one light-emitting unit between a pair of electrodes as in the light-emitting element 550W illustrated in FIG. 23A is referred to as a single structure.

A conductive film that transmits visible light is used as the electrode 502 through which light is extracted. A conductive film that reflects visible light is preferably used as the electrode 501 through which light is not extracted.

The light-emitting elements included in the display apparatus of this embodiment preferably employ a micro-optical resonator (microcavity) structure. Therefore, one of the pair of electrodes of the light-emitting element is preferably an electrode having properties of transmitting and reflecting visible light (a transflective electrode), and the other is preferably an electrode having a property of reflecting visible light (a reflective electrode). When the light-emitting element has a microcavity structure, light obtained from the light-emitting layer can be resonated between the electrodes, whereby light emitted from the light-emitting element can be intensified.

Note that the transflective electrode can have a stacked-layer structure of a reflective electrode and an electrode having a property of transmitting visible light (also referred to as a transparent electrode).

The light transmittance of the transparent electrode is greater than or equal to 40%. For example, an electrode having a visible light (light with a wavelength greater than or equal to 400 nm and less than 750 nm) transmittance higher than or equal to 40% is preferably used in the light-emitting elements. The transflective electrode has a visible light reflectance higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity less than or equal to $1\times10^{-2}$ Ω2 cm. Note that in the case where any of the light-emitting elements emits near-infrared light (light with a wavelength greater than or equal to 750 nm and less than or equal to 1300 nm), the near-infrared light transmittance and reflectance of these electrodes preferably satisfy the above-described numerical ranges of the visible light transmittance and reflectance.

The light-emitting units 512W illustrated in FIG. 23A can be formed as island-shaped layers. Specifically, the light-emitting unit 512W illustrated in FIG. 23A corresponds to a stacked layer of the organic layer 112*a*, the organic layer 115, and the organic layer 116, a stacked layer of the organic layer 112*b*, the organic layer 115, and the organic layer 116, or a stacked layer of the organic layer 112*c*, the organic layer 115, and the organic layer 116 which are illustrated in FIG. 1B and the like. Note that the light-emitting element 550W corresponds to the light-emitting element 140*a*, the light-emitting element 140*b*, or the light-emitting element 140*c*. The electrode 501 corresponds to the pixel electrode 111*a*, the pixel electrode 111*b*, or the pixel electrode 111*c*. The electrode 502 corresponds to the common electrode 113.

The light-emitting unit 512W includes a layer 521, a layer 522, a light-emitting layer 523Q_1, a light-emitting layer 523Q_2, a light-emitting layer 523Q_3, a layer 524, and the like. The light-emitting element 550W includes a layer 525 and the like between the light-emitting unit 512W and the electrode 502.

FIG. 23A illustrates an example in which the light-emitting unit 512W does not include the layer 525 and the layer 525 is provided to be shared by the light-emitting elements. In this case, the layer 525 can be referred to as a common layer. By providing one or more common layers for a plurality of light-emitting elements in this manner, the manufacturing step can be simplified, resulting in a reduction in manufacturing cost. Note that the layer 525 may be provided for every light-emitting element. That is, the layer 525 may be included in the light-emitting unit 512W.

The layer 521 includes, for example, a layer containing a substance with a high hole-injection property (a hole-injection layer). The layer 522 includes, for example, a layer containing a substance with a high hole-transport property (a hole-transport layer). The layer 524 includes, for example, a layer containing a substance with a high electron-transport property (an electron-transport layer). The layer 525 includes, for example, a layer containing a substance with a high electron-injection property (an electron-injection layer). Note that a structure may be employed in which the layer 521 may include an electron-injection layer, the layer 522 may include an electron-transport layer, the layer 524 may include a hole-transport layer, and the layer 525 may include a hole-injection layer.

The hole-injection layer is a layer that injects holes from an anode to the hole-transport layer and contains a material with a high hole-injection property. Examples of the material with a high hole-injection property include an aromatic amine compound and a composite material containing a hole-transport material and an acceptor material (an electron-accepting material).

In the light-emitting elements, the hole-transport layer is a layer that transports holes, which are injected from the anode by the hole-injection layer, to the light-emitting layer. The hole-transport layer is a layer that transports holes, which are injected from the anode by the hole-injection layer, to the light-emitting layer. The hole-transport layer is a layer that contains a hole-transport material. As the hole-transport material, a substance having a hole mobility greater than or equal to $1\times 10^{-6}$ $cm^2/Vs$ is preferable. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

In the light-emitting element, the electron-transport layer is a layer that transports electrons, which are injected from the cathode by the electron-injection layer, to the light-emitting layer. The electron-transport layer is a layer that contains an electron-transport material. As the electron-transport material, a substance having an electron mobility greater than or equal to $1\times 10^{-6}$ $cm^2/Vs$ is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-transport layer may have a stacked-layer structure, and may include a hole-blocking layer, in contact with the light-emitting layer, which blocks holes moving from the anode side to the cathode side through the light-emitting layer.

The electron-injection layer is a layer injecting electrons from a cathode to the electron-transport layer and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (an electron-donating material) can also be used.

For the electron-injection layer, it is possible to use, for example, an alkali metal, an alkaline earth metal, or a compound thereof, such as lithium, cesium, ytterbium, lithium fluoride (LiF), cesium fluoride (CsF), calcium fluoride (CaFx, where X is a given number), 8-(quinolinolato) lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate. In addition, the electron-injection layer may have a stacked-layer structure of two or more layers. For example, it is possible to employ a structure where lithium fluoride is used for a first layer and ytterbium is provided for a second layer as the stacked-layer structure.

Alternatively, an electron-transport material may be used for the electron-injection layer. For example, a compound having an unshared electron pair and an electron deficient heteroaromatic ring can be used for the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In addition, in general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used for the organic compound having an unshared electron pair. Note that NBPhen has a higher glass transition temperature (Tg) than BPhen and thus has high heat resistance.

Note that FIG. 23A explicitly illustrates the layer 521 and the layer 522 separately; however, one embodiment of the present invention is not limited thereto. For example, the layer 522 may be omitted when the layer 521 has functions of both a hole-injection layer and a hole-transport layer or the layer 521 has functions of both an electron-injection layer and an electron-transport layer.

The light-emitting layer 523Q_1, the light-emitting layer 523Q_2, and the light-emitting layer 523Q_3 are layers containing a light-emitting substance. The light-emitting layer can contain one or more kinds of light-emitting substances. As the light-emitting substance, a substance that exhibits an emission color of blue, violet, bluish violet, green, yellowish green, yellow, orange, red, or the like is used as appropriate. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably contains a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

In a combination of materials for forming an exciplex, the HOMO level (the highest occupied molecular orbital level) of the hole-transport material is preferably higher than or equal to the HOMO level of the electron-transport material. The LUMO level (the lowest unoccupied molecular orbital level) of the hole-transport material is preferably higher than or equal to the LUMO level of the electron-transport material. The LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectrum of the hole-transport material, the emission spectrum of the electron-transport material, and the emission spectrum of the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

In the light-emitting element 550W illustrated in FIG. 23A, white light emission can be obtained from the light-emitting element 550W by selecting light-emitting layers such that the light-emitting layer 523Q_1, the light-emitting layer 523Q_2, and the light-emitting layer 523Q_3 emit light of complementary colors. Although the example in which the light-emitting unit 512W includes three light-emitting layers is illustrated here, the number of light-emitting layers is not limited, and two layers may be included.

The coloring layer 545R, the coloring layer 545G, and the coloring layer 545B are provided over the light-emitting elements 550W capable of emitting white light, whereby the respective pixels emit red light, green light, and blue light so that full-color display can be performed. Note that although examples of providing the coloring layer 545R transmitting red light, the coloring layer 545G transmitting green light, and the coloring layer 545B transmitting blue light are described in FIG. 27A and the like, the present invention is not limited thereto. Visible light of colors transmitted by the coloring layers is visible light of at least two different colors that are appropriately selected from red, green, blue, cyan, magenta, and yellow, for example.

Thus, full-color display can be performed by providing coloring layers as appropriate even when the layer 521, the layer 522, the layer 524, the layer 525, the light-emitting layer 523Q_1, the light-emitting layer 523Q_2, and the light-emitting layer 523Q_3 have the same structure (material, thickness, and the like) in the pixels of different colors. Consequently, in the display apparatus of one embodiment of the present invention, the light-emitting element does not need to be formed separately in each pixel; hence, the manufacturing step can be simplified, and the manufacturing cost can be reduced. Note that the present invention is not limited thereto, and at least one of the layer 521, the layer 522, the layer 524, the layer 525, the light-emitting layer 523Q_1, the light-emitting layer 523Q_2, and the light-emitting layer 523Q_3 may have a structure that differs among pixels.

FIG. 24B to FIG. 24F illustrate structure examples of a light-receiving element 550S that can be used for a display apparatus. In the components illustrated in FIG. 24B to FIG. 24F, components similar to the components illustrated in FIG. 23 are denoted by the same reference numerals.

Figure 24A:
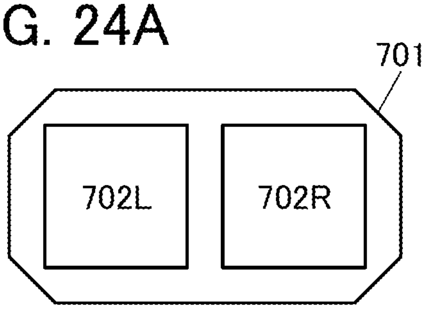
FIG. 24A to FIG. 24J are diagrams illustrating structure examples of a display apparatus.
Figure 24B:
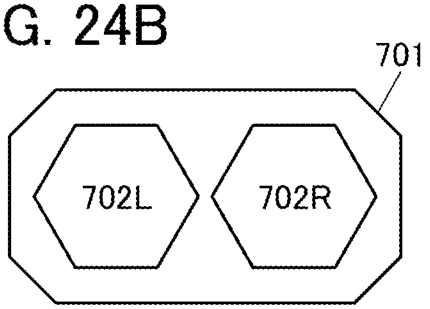

The light-receiving element 550S illustrated in FIG. 24B includes a light-receiving unit 555 between a pair of electrodes (the electrode 501 and the electrode 502). The electrode 501 functions as a pixel electrode and is provided in every light-receiving element. The electrode 502 functions as a common electrode and is shared by a plurality of light-emitting elements and a light-receiving element.

The light-receiving unit 555 illustrated in FIG. 24B can be formed as an island-shaped layer. That is, the light-receiving unit 555 illustrated in FIG. 24B corresponds to the organic layer 155 illustrated in FIG. 1B and the like. Note that the light-receiving element 550S corresponds to the light-receiving element 140S. Furthermore, the electrode 501 corresponds to the pixel electrode 111S. The electrode 502 corresponds to the common electrode 113.

The light-receiving unit 555 includes the layer 521, the layer 522, an active layer 526, the layer 524, and the like. The layer 521, the layer 522, and the layer 524 are the same as those used in the light-emitting unit 512W. The light-receiving element 550S includes a layer 525 and the like between the light-receiving unit 555 and the electrode 502. The protective layer 540 is provided over the electrode 502. Here, the layer 525, the electrode 502, and the protective layer 540 are films provided in common between the light-emitting element 550W and the light-receiving element 550S as illustrated in FIG. 23A or the like.

The active layer 526 includes a semiconductor. Examples of the semiconductor include an inorganic semiconductor such as silicon and an organic semiconductor including an organic compound. This embodiment illustrates an example in which an organic semiconductor is used as the semiconductor included in the active layer 526. An organic semiconductor is preferably used, in which case the light-emitting layer and the active layer 526 can be formed by the same method (e.g., a vacuum evaporation method) and thus the same manufacturing apparatus can be used.

As the active layer 526, a pn photodiode or a pin photodiode can be used, for example. An n-type semiconductor material and a p-type semiconductor material that can be used as the active layer 526 are described below. The n-type semiconductor material and the p-type semiconductor material may be formed as layers to be stacked or may be mixed to form one layer.

Examples of an n-type semiconductor material contained in the active layer 526 are electron-accepting organic semiconductor materials such as fullerene (e.g., $C_{60}$ and $C_{70}$) and a fullerene derivative. Fullerene has a soccer ball-like shape, which is energetically stable. Both the HOMO level and the LUMO level of fullerene are deep (low). Having a deep LUMO level, fullerene has an extremely high electron-accepting property (acceptor property). In general, when π-electron conjugation (resonance) spreads in a plane as in benzene, an electron-donating property (donor property) becomes high; however, since fullerene has a spherical shape, fullerene has a high electron-accepting property even when π-electron conjugation widely spreads. The high electron-accepting property efficiently causes rapid charge separation and is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-Phenyl-$C_{71}$-butyric acid methyl ester (abbreviation: $PC_{70}BM$), [6,6]-Phenyl-$C_{61}$-butyric acid methyl ester (abbreviation:

$PC_{60}BM$), and 1',1",4',4"-Tetrahydro-di[1,4]methanonaphthaleno[1,2:2',3',56,60:2",3"][5,6]fullerene-$C_{60}$ (abbreviation: ICBA).

Another example of an n-type semiconductor material includes a perylenetetracarboxylic derivative such as N,N-dimethyl-3,4,9,10-perylenetetracarboxylic diimide (abbreviation: Me-PTCDI).

Another example of an n-type semiconductor material includes 2,2'-(5,5'-(thieno[3,2-b]thiophene-2,5-diyl)bis(thiophene-5,2-diyl))bis(methan-1-yl-1-ylidene)dimalononitrile (abbreviation: FT2TDMN).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 526 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), quinacridone, and rubrene.

Other examples of a p-type semiconductor material include a carbazole derivative, a thiophene derivative, a furan derivative, and a compound having an aromatic amine skeleton. Other examples of a p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 526 is preferably formed by co-evaporation of an n-type semiconductor and a p-type semiconductor. Alternatively, the active layer 526 may be formed by stacking an n-type semiconductor and a p-type semiconductor.

Either a low molecular compound or a high molecular compound can be used for the light-emitting element and the light-receiving element, and an inorganic compound may also be contained. Each of the layers included in the light-emitting element and the light-receiving element can be formed by an evaporation method (including a vacuum evaporation method), a transfer method, a printing method, an inkjet method, a coating method, or the like.

As the hole-transport material or the electron-blocking material, a high molecular compound such as poly(3,4-ethylenedioxythiophene)/poly(styrenesulfonic acid) (PEDOT/PSS), or an inorganic compound such as molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

For the active layer 526, a high molecular compound such as Poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer 526 may contain a mixture of three or more kinds of materials. For example, a third material may be mixed with an n-type semiconductor material and a p-type semiconductor material in order to extend the wavelength range. In that case, the third material may be a low molecular compound or a high molecular compound.

Figure 23B:
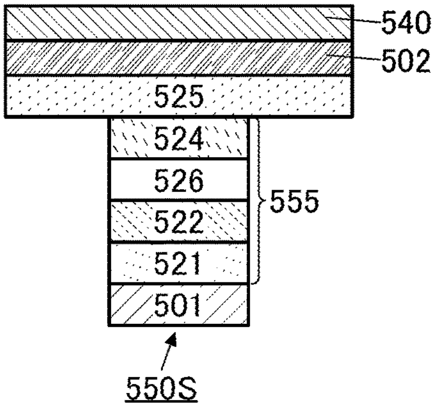

The light-receiving unit 555 can have a structure in which the layer 521 (hole-injection layer), the layer 522 (hole-transport layer), the active layer 526, the layer 524 (electron-transport layer), and the layer 525 (electron-injection layer) are stacked in this order as illustrated in FIG. 23B. This is the same stacking order as that of the light-emitting unit 512W illustrated in FIG. 23A. In that case, in each of the light-emitting element 550W and the light-receiving element 550S, the electrode 501 can function as an anode and the electrode 502 can function as a cathode. In other words, the light-receiving element 550S is driven by application of reverse bias between the electrode 501 and the electrode 502, whereby light incident on the light-receiving element 550S can be detected and charge can be generated and extracted as current.

However, the present invention is not limited thereto. For example, a structure may be employed in which the layer 521 may include an electron-injection layer, the layer 522 may include an electron-transport layer, the layer 524 may include a hole-transport layer, and the layer 525 may include a hole-injection layer. In that case, in the light-receiving element 550S, the electrode 501 functions as a cathode and the electrode 502 can function as an anode. As described in the above embodiment, the light-emitting elements 550W and the light-receiving element 550S can be separately formed in the present invention. Therefore, even when the structures of the light-emitting elements 550W are greatly different from the structure of the light-receiving element 550S, the light-emitting elements 550W and the light-receiving element 550S can be manufactured relatively easily.

Figure 23C:
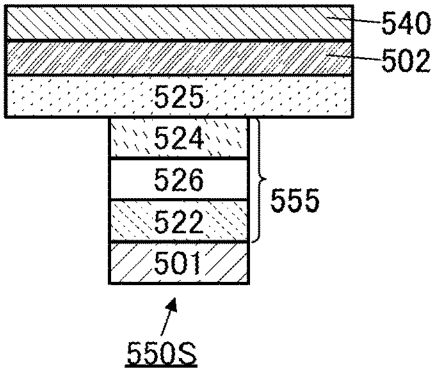

The layer 521, the layer 522, the layer 524, and the layer 525 illustrated in FIG. 23B do not necessarily have to be all provided. For example, the layer 522 including a hole-injection layer may be in contact with the electrode 501 as illustrated in FIG. 23C without providing the layer 521 including a hole-injection layer. Note that at least one of the layer 522 including a hole-transport layer and the layer 524 including an electron-transport layer is preferably provided in contact with the active layer 526, as illustrated in FIG. 23B and FIG. 23C. Thus, in the light-receiving element 550S, leakage current is generated between the electrode 501 and the electrode 502, so that a reduction in the sensitivity of imaging can be inhibited.

Figure 23D:
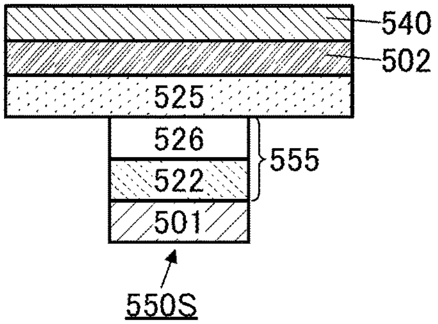

Furthermore, one of the layer 522 and the layer 524 may be omitted. For example, as illustrated in FIG. 23D, a structure in which the layer 524 including an electron-transport layer is not provided and the active layer 526 is in contact with the layer 525 may be employed.

Figure 23E:
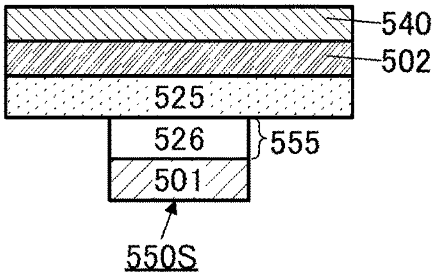

Moreover, the light-receiving unit 555 may include only the active layer 526. For example, as illustrated in FIG. 23E, a structure in which the layer 522 including a hole-transport layer is not provided and the active layer 526 is in contact with the electrode 501 may be employed.

Figure 23F:
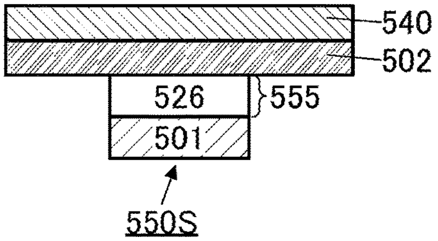

Furthermore, in the case where the layer 525 is not a common layer and is provided for each light-emitting element, a structure in which the layer 525 is not provided for the light-receiving element 550S can be employed. For example, as illustrated in FIG. 23F, a structure in which the layer 525 including an electron-injection layer is not provided and the active layer 526 is in contact with the electrode 502 may be employed.

This embodiment can be combined with the other embodiments as appropriate.

Embodiment 7

In this embodiment, a high-resolution display apparatus will be described.

[Structure Example of Display Panel]

Wearable electronic devices for VR, AR, and the like can provide 3D images by using parallax. In that case, it is necessary to display an image for the right eye in the right eye's field of view and display an image for the left eye in the left eye's field of view. Although the shape of a display portion in a display apparatus may be a horizontal rectangular shape, pixels provided outside the range of vision of both eyes do not contribute to display, and thus black is always displayed in these pixels.

In view of the above, it is preferred that a display portion of a display panel be divided into two regions for the right eye and for the left eye, and that pixels not be provided in an outer region which does not contribute to display. Hence, power consumption needed for writing to pixels can be reduced. Moreover, loads on source lines, gate lines, and the like are reduced, so that display with a high frame rate is possible. Consequently, smooth moving images can be displayed, which improves sense of reality.

FIG. 24A illustrates a structure example of a display panel. In FIG. 24A, a display portion 702L for the left eye and a display portion 702R for the right eye are provided inward from a substrate 701. Note that in addition to the display portion 702L and the display portion 702R, a driver circuit, a wiring, an IC, an FPC, or the like may be provided over the substrate 701.

The display portion 702L and the display portion 702R illustrated in FIG. 24A have a square top surface shape.

Figure 24C:
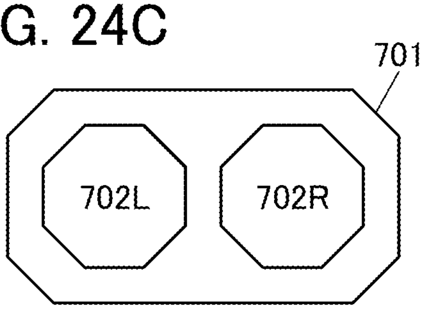
Figure 24D:
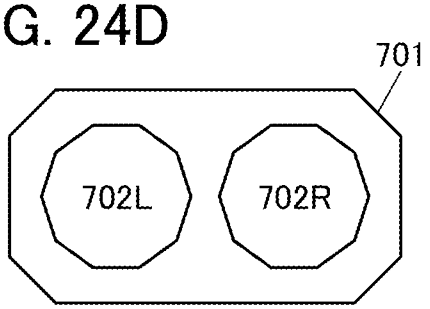
Figure 24E:
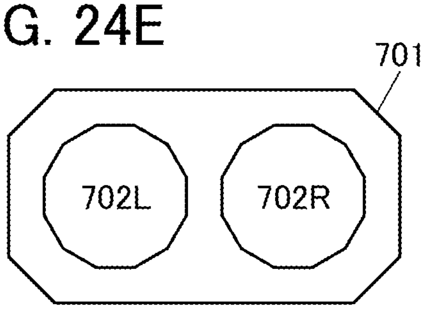

The top surface shapes of the display portion 702L and the display portion 702R may be other regular polygons. FIG. 24B illustrates an example in which the top surface shape is a regular hexagon; FIG. 24C illustrates an example in which the top surface shape is a regular octagon; FIG. 24D illustrates an example in which the top surface shape is a regular decagon; and FIG. 24E illustrates an example in which the top surface shape is a regular dodecagon. When a polygon with even-numbered corners is used as above, the shape of the display portion can be bilaterally symmetrical. Note that a polygon that is not a regular polygon may be used. Moreover, a regular polygon or a polygon with rounded corners may be used.

Since the display portion consists of pixels arranged in a matrix, a linear portion of the outline of the display portion is not strictly a straight line and can be partly a stair-like portion. In particular, a linear portion that is not parallel to the direction of pixel arrangement has a stair-like top surface shape. Since the user watches images without perceiving the shape of the pixels, a tilted outline, which is stair-like to be exact, of the display portion can be regarded as a straight line. Similarly, a curved portion, which is stair-like to be exact, of the outline of the display portion can be regarded as a curve.

Figure 24F:
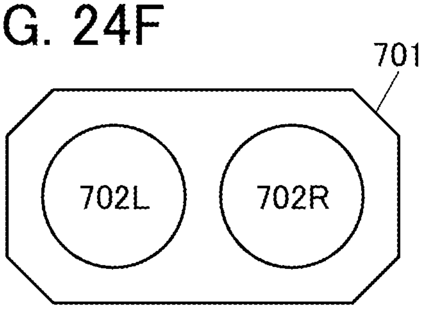

FIG. 24F illustrates an example in which the top surface shapes of the display portion 702L and the display portion 702R are circular.

The top surface shapes of the display portion 702L and the display portion 702R may be bilaterally asymmetrical. Moreover, the top surface shapes may not necessarily be regular polygonal.

Figure 24G:
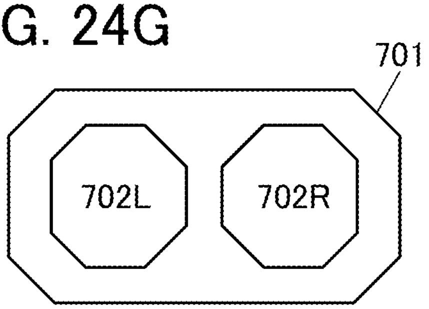
Figure 24H:
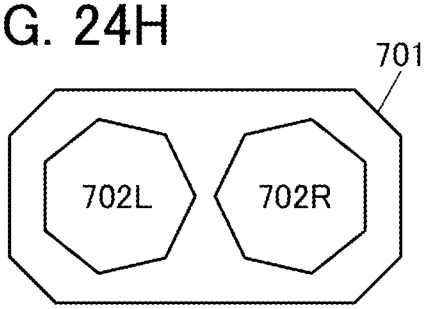

FIG. 24G illustrates an example in which the top surface shapes of the display portion 702L and the display portion 702R are bilaterally asymmetric octagonal. FIG. 24H illustrates an example in which the top surface shape is regular heptagonal. Even when the top surface shapes of the display portion 702L and the display portion 702R have a bilaterally asymmetrical shape in this manner, the display portion 702L and the display portion 702R are preferably arranged bilaterally symmetrically. Consequently, an image with no unnaturalness can be provided.

Although the structures where the display portion is divided into two are described above, the display portions may have a continuous shape.

Figure 24I:
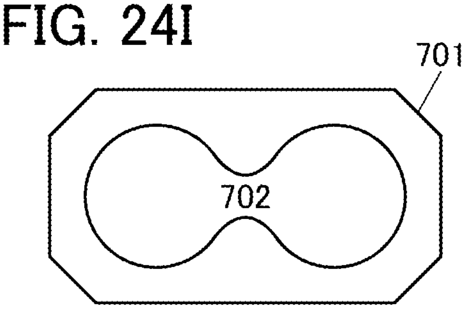
Figure 24J:
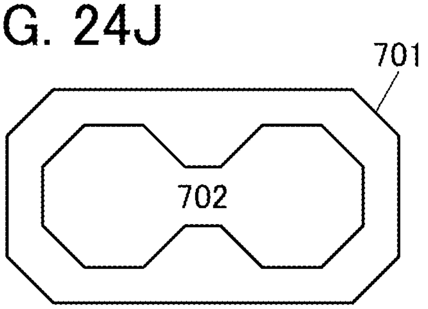

FIG. 24I illustrates an example in which the two circular display portions 702 in FIG. 24F are connected. FIG. 24J illustrates an example in which the two regular octagonal display portions 702 in FIG. 24C are connected.

The above is the description of the structure examples of the display panel.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 8

In this embodiment, a metal oxide (also referred to as an oxide semiconductor) that can be used in the OS transistor described in the above embodiment will be described.

The metal oxide used in the OS transistor preferably contains at least indium or zinc, and further preferably contains indium and zinc. The metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. Specifically, M is preferably one or more kinds selected from gallium, aluminum, yttrium, and tin, and further preferably M is gallium.

The metal oxide can be formed by a sputtering method, a chemical vapor deposition (CVD) method such as a metal organic chemical vapor deposition (MOCVD) method, an atomic layer deposition (ALD) method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method. The XRD spectrum obtained by GIXD measurement may be hereinafter simply referred to as an XRD spectrum.

For example, the XRD spectrum of the quartz glass substrate shows a peak with a substantially bilaterally symmetrical shape. On the other hand, the peak of the XRD spectrum of the In—Ga—Zn oxide film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film deposited at room temperature. Thus, it is suggested that the In—Ga—Zn oxide deposited at room temperature is in an intermediate state, which is neither a single crystal nor polycrystal nor an amorphous state, and it cannot be concluded that In—Ga—Zn oxide film is in an amorphous state.

<<Structure of Oxide Semiconductor>>

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductors include the above-described CAAC-OS and nc-OS. Other examples of the non-single-crystal oxide semiconductors include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[Caac-Os]

The CAAC-OS is an oxide semiconductor having a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga,Zn) layer) are stacked. Indium and gallium can be replaced with each other. Therefore, indium may be contained in the (Ga,Zn) layer. In addition, gallium may be contained in the In layer. Note that zinc may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor having small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of flexibility of the manufacturing process.

[nc-OS]

In the nc-OS, a microscopic region (e.g., a region with a size greater than or equal to 1 nm and less than or equal to 10 nm, specifically, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS will be described in detail. Note that the CAC-OS relates to the material composition.

[CAC-OS]

The CAC-OS refers to one composition of a material in which elements included in a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof and these regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used for a deposition gas. The proportion of the flow rate of an oxygen gas in the total flow rate of the deposition gas during deposition is preferably as low as possible. For example, the proportion of the flow rate of an oxygen gas in the total flow rate of the deposition gas during deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility (u) can be achieved.

On the other hand, the second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (u), and excellent switching operation can be achieved.

A transistor using the CAC-OS has high reliability. Thus, the CAC-OS is the most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that impurities in an oxide semiconductor refer to, for example, elements other than the main components of an oxide semiconductor. For example, an element with a concentration lower than 0.1 atomic % can be regarded as an impurity.

<Impurities>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times 10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times 10^{18}$ atoms/$cm^3$, preferably lower than or equal to 2× 1016 atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 9

In this embodiment, electronic devices of one embodiment of the present invention will be described with reference to FIG. 25 to FIG. 28.

An electronic device in this embodiment includes the display apparatus of one embodiment of the present invention. In the display apparatus of one embodiment of the present invention, increases in resolution, definition, and sizes are easily achieved. Thus, the display apparatus of one embodiment of the present invention can be used for a display portion of a variety of electronic devices.

The display apparatus of one embodiment of the present invention can be manufactured at low cost, which leads to a reduction in the manufacturing cost of an electronic device.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or notebook personal computer, a monitor of a computer or the like, digital signage, and a large game machine such as a pachinko machine.

In particular, the display apparatus of one embodiment of the present invention can have a high resolution, and thus can be suitably used for an electronic device including a relatively small display portion. Examples of such an electronic devices include information terminals (wearable devices) such as watch-type and bracelet-type information terminals and wearable devices capable of being worn on the head, such as a VR device like a head-mounted display and a glasses-type AR device. Examples of wearable devices include an SR device and an MR device.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display apparatus of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With the display apparatus with such high definition or high resolution, the electronic device can have higher realistic sensation, sense of depth, and the like in personal use such as portable use or home use.

The electronic device in this embodiment can be incorporated along a curved surface of an inside wall or an outside wall of a house or a building or the interior or the exterior of a car.

The electronic device in this embodiment may include an antenna. When a signal is received by the antenna, the electronic device can display a video, data, and the like on a display portion. When the electronic device includes the antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of kinds of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 25A:
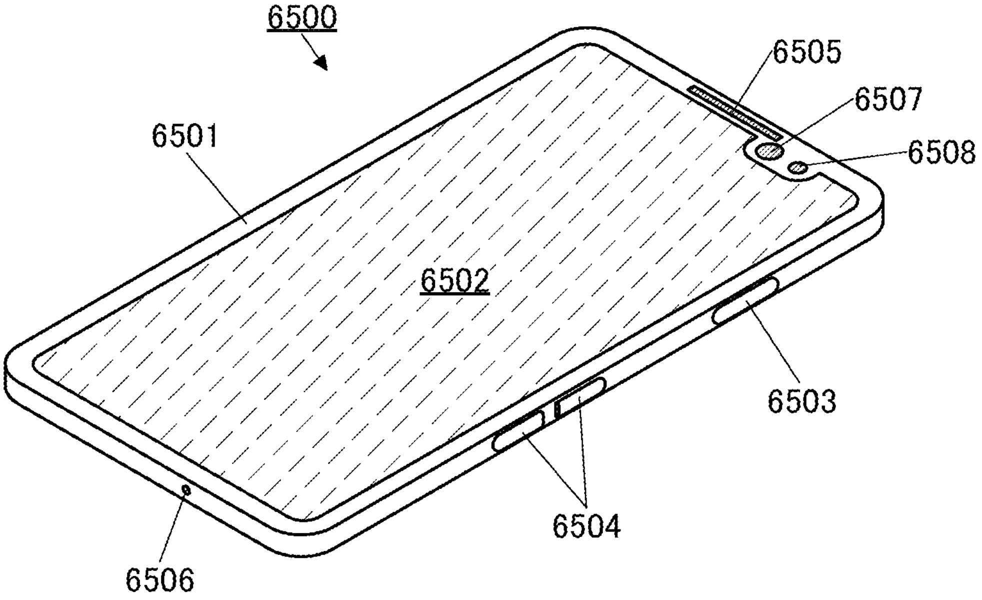
FIG. 25A and FIG. 25B are diagrams illustrating an example of an electronic device.

An electronic device 6500 illustrated in FIG. 25A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 25B:
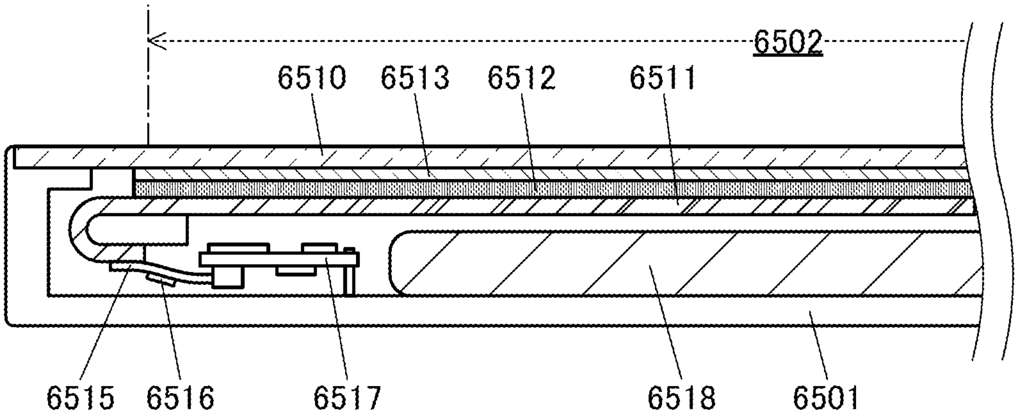

FIG. 25B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display (a display apparatus having flexibility) of one embodiment of the present invention can be used for the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 26A:
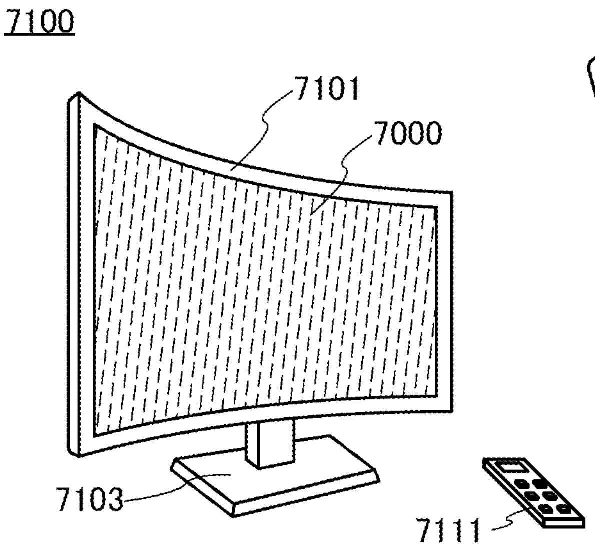
FIG. 26A to FIG. 26D are diagrams illustrating examples of electronic devices.

FIG. 26A illustrates an example of a television device. In a television device 7100, a display portion 7000 is incorporated in a housing 7101. Here, a structure in which the housing 7101 is supported by a stand 7103 is illustrated.

The display apparatus of one embodiment of the present invention can be used for the display portion 7000.

Operation of the television device 7100 illustrated in FIG. 26A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be controlled and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 26B:
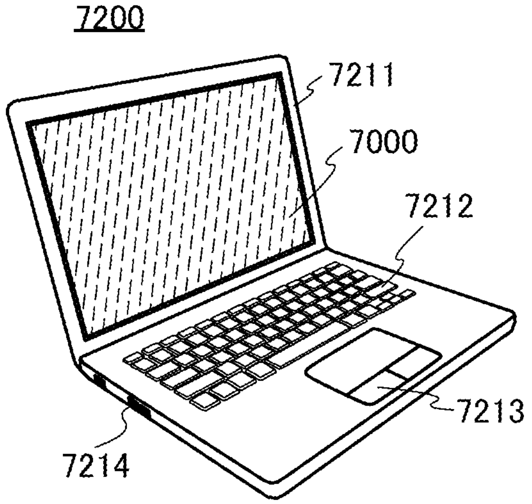

FIG. 26B illustrates an example of a notebook personal computer. A notebook personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used in the display portion 7000.

Figure 26C:
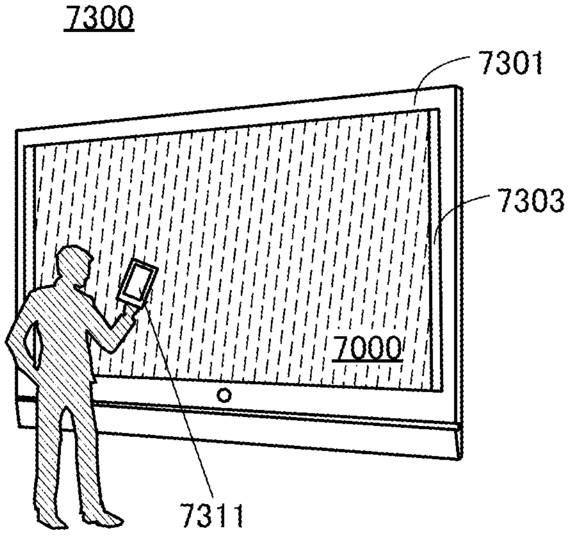
Figure 26D:
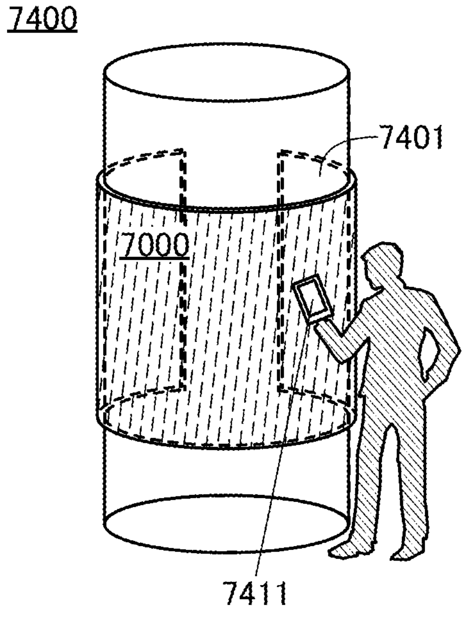

FIG. 26C and FIG. 26D illustrate examples of digital signage.

Digital signage 7300 illustrated in FIG. 26C includes a housing 7301, the display portion 7000, a speaker 7303, and the like. Furthermore, the digital signage 7300 can include an LED lamp, an operation key (including a power switch or an operation switch), a connection terminal, a variety of sensors, a microphone, and the like.

FIG. 26D is digital signage 7400 attached to a cylindrical pillar 7401. The digital signage 7400 includes the display portion 7000 provided along a curved surface of the pillar 7401. The display apparatus of one embodiment of the present invention can be used for the display portion 7000 in FIG. 26C and FIG. 26D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of an image or a moving image on the display portion 7000, intuitive operation by a user is possible. Moreover, for an application for providing information such as route information or traffic information, usability can be enhanced by intuitive operation.

As illustrated in FIG. 26C and FIG. 26D, it is preferable that the digital signage 7300 or the digital signage 7400 can work with an information terminal 7311 or an information terminal 7411, such as a smartphone a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 27A:
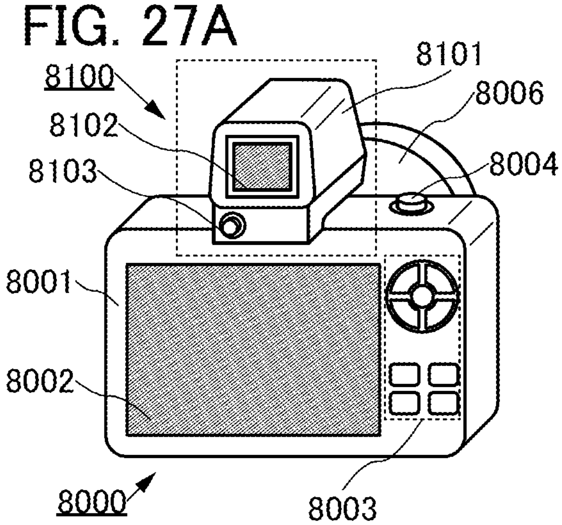
FIG. 27A to FIG. 27F are diagrams illustrating examples of electronic devices.

FIG. 27A is a diagram illustrating the appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000. Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. In the finder 8100, a video or the like received from the camera 8000 can be displayed on the display portion 8102.

The button 8103 has a function of a power button or the like.

The display apparatus of one embodiment of the present invention can be used for the display portion 8002 of the camera 8000 and the display portion 8102 of the finder 8100. Note that a finder may be incorporated in the camera 8000.

Figure 27B:
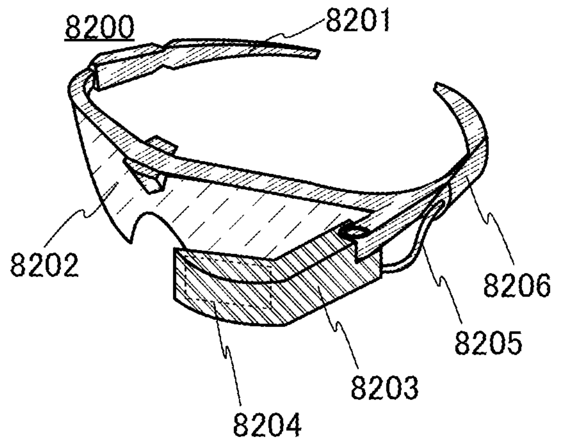

FIG. 27B is a diagram illustrating the appearance of a head-mounted display 8200.

The head-mounted display 8200 includes a wearing portion 8201, a lens 8202, a main body 8203, a display portion 8204, a cable 8205, and the like. A battery 8206 is incorporated in the wearing portion 8201.

The cable 8205 supplies electric power from the battery 8206 to the main body 8203. The main body 8203 includes a wireless receiver or the like and can display received video information on the display portion 8204. In addition, the main body 8203 is provided with a camera, and information on the movement of the user's eyeball or eyelid can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

The display apparatus of one embodiment of the present invention can be used in the display portion 8204.

Figure 27C:
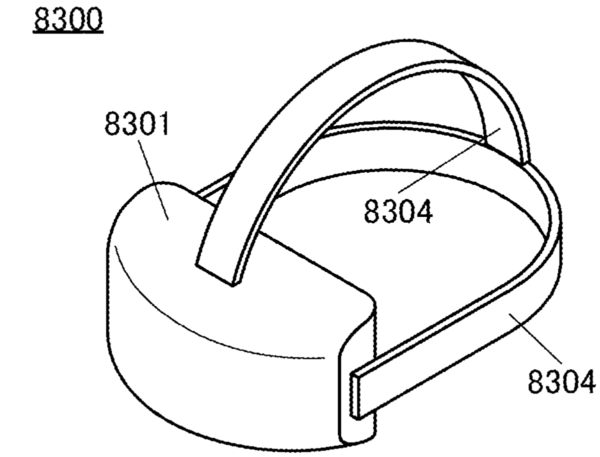
Figure 27D:
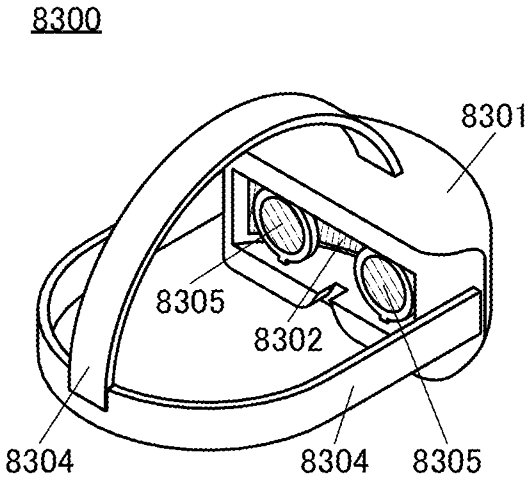
Figure 27E:
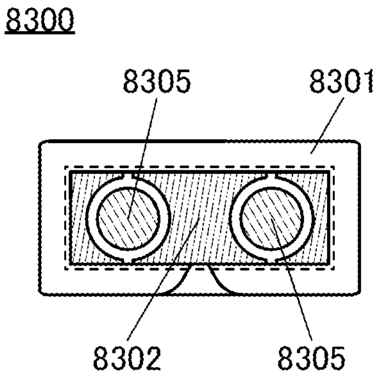

FIG. 27C to FIG. 27E are diagrams illustrating the appearance of a head-mounted display 8300. The head-mounted display 8300 includes a housing 8301, a display portion 8302, a fixing band 8304, and a pair of lenses 8305.

A user can perceive display on the display portion 8302 through the lenses 8305. Note that the display portion 8302 is preferably curved and placed because the user can feel a high realistic sensation. In addition, when another image displayed on a different region of the display portion 8302 is perceived through the lenses 8305, three-dimensional display using parallax, or the like can also be performed. Note that the number of display portions 8302 provided is not limited to one; two display portions 8302 may be provided so that one display portion is provided for one eye of the user.

The display apparatus of one embodiment of the present invention can be used for the display portion 8302. The display apparatus of one embodiment of the present invention can achieve extremely high resolution. For example, a pixel is not easily perceived by the user even when the user perceives display that is magnified by the use of the lenses 8305 as illustrated in FIG. 27E. In other words, a video with a strong sense of reality can be perceived by the user with the use of the display portion 8302.

Figure 27F:
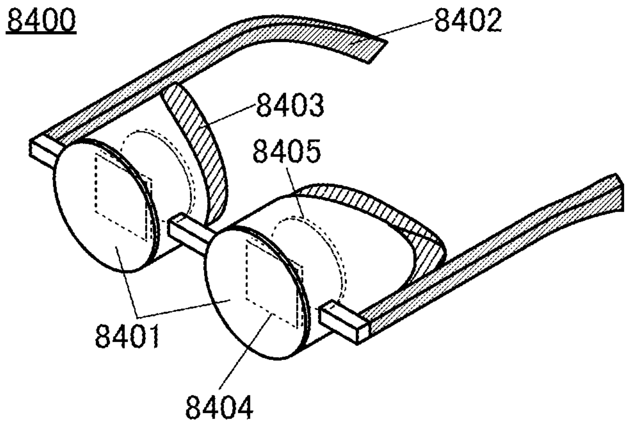

FIG. 27F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. The pair of display portions 8404 may display different images, whereby three-dimensional display using parallax can be performed.

A user can perceive display on the display portion 8404 through the lenses 8405. The lens 8405 has a focus adjustment mechanism and can adjust the position according to the user's eyesight. The display portion 8404 is preferably a square or a horizontal rectangle. Accordingly, realistic sensation can be increased.

The mounting portion 8402 preferably has plasticity and elasticity to be adjusted to fit the size of the user's face and not to slide down. In addition, part of the mounting portion 8402 preferably has a vibration mechanism functioning as a bone conduction earphone. Thus, without additionally requiring an audio device such as earphones or a speaker, the user can enjoy video and sound only by wearing. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered by cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Electronic devices illustrated in FIG. 28A to FIG. 28F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 28A to FIG. 28F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The display apparatus of one embodiment of the present invention can be used in the display portion 9001.

The details of the electronic devices illustrated in FIG. 28A to FIG. 28F are described below.

Figure 28A:
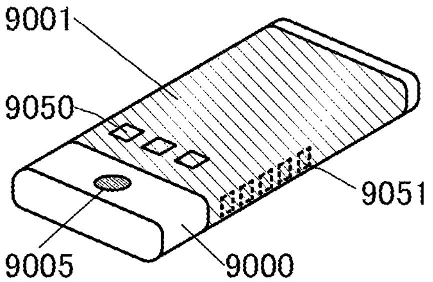
FIG. 28A to FIG. 28F are diagrams illustrating examples of electronic devices.

FIG. 28A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display letters and image information on its plurality of surfaces. FIG. 28A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 28B:
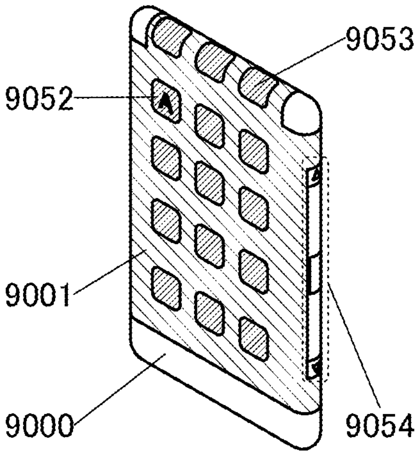

FIG. 28B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer a call, for example.

Figure 28C:
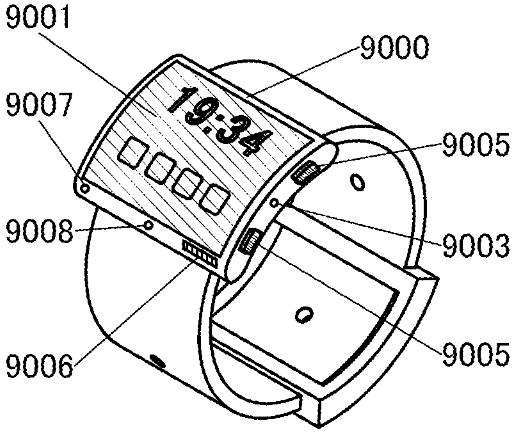

FIG. 28C is a perspective view illustrating a watch-type portable information terminal 9200. The portable information terminal 9200 can be used as a smartwatch (registered trademark), for example. The display surface of the display portion 9001 is curved, and display can be performed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and can be charged. Note that the charging operation may be performed by wireless power feeding.

Figure 28D:
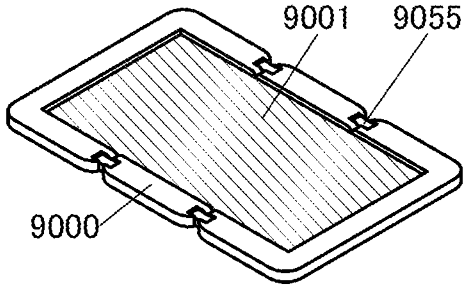
Figure 28E:
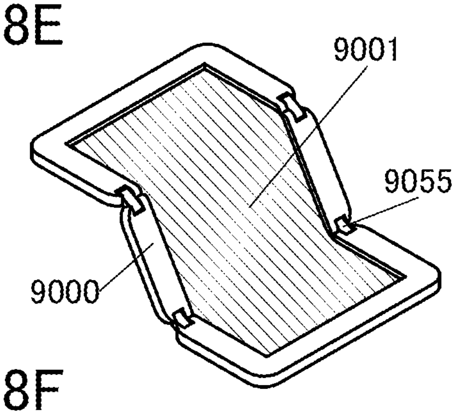
Figure 28F:
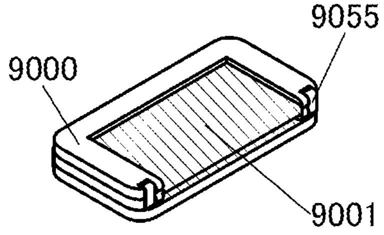

FIG. 28D to FIG. 28F are perspective views illustrating a foldable portable information terminal 9201. FIG. 28D is a perspective view of an opened state of the portable information terminal 9201, FIG. 28F is a perspective view of a folded state thereof, and FIG. 28E is a perspective view of a state in the middle of change from one of FIG. 28D and FIG. 28F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

REFERENCE NUMERALS

100: display apparatus, 100C: display apparatus, 100D: display apparatus, 100E: display apparatus, 100F: display apparatus, 100G: display apparatus, 101: layer, 105: insulating layer, 110: pixel, 110*a*: subpixel, 110*b*: subpixel, 110*c*: subpixel, 110S: subpixel, 111: pixel electrode, 111*a*: pixel electrode, 111*b*: pixel electrode, 111*c*: pixel electrode, 111C: connection electrode, 111S: pixel electrode, 112: organic layer, 112*a*: organic layer, 112*b*: organic layer, 112*c*: organic layer, 112W: organic layer, 113: common electrode, 114: organic layer, 115: organic layer, 116: organic layer, 120: slit, 121: protective layer, 122: resin layer, 125: insulating layer, 125*f*: insulating film, 126: resin layer, 128: substrate, 129: coloring layer, 129*a*: coloring layer, 129*b*: coloring layer, 129*c*: coloring layer, 129*d*: black matrix, 130: connection portion, 135*a*: layer, 135*b*: layer, 135B: layer, 135*c*: layer, 135G: layer, 135R: layer, 135S: layer, 136: substrate, 137: substrate, 140: light-emitting element, 140*a*: light-emitting element, 140*b*: light-emitting element, 140*c*: light-emitting element, 140S: light-receiving element, 140S1: light-receiving element, 140S2: light-receiving element, 143: resist mask, 144: sacrificial film, 145: sacrificial layer, 146: sacrificial film, 147: sacrificial layer, 151S: FMM, 151W: FMM, 155: organic layer, 161: conductive layer, 162: conductive layer, 163: resin layer, 200: display panel, 201: substrate, 202: substrate, 203: functional layer, 211: light-emitting element, 211B: light-emitting element, 211G: light-emitting element, 211R: light-emitting element, 211W: light-emitting element, 212: light-receiving element, 218: region, 220: finger, 221: contact portion, 222: fingerprint, 223: image-capturing range, 225: stylus, 226: path, 240: capacitance, 241: conductive layer, 242: transistor, 243: insulating layer, 244: connection portion, 245: conductive layer, 251: conductive layer, 252: conductive layer, 254: insulating layer, 255*a*: insulating layer, 255*b*: insulating layer, 256: plug, 258: transistor, 259: transistor, 260: transistor, 261: insulating layer, 262: insulating layer, 263: insulating layer, 264: insulating layer, 265: insulating layer, 268: insulating layer, 271: plug, 272*a*: conductive layer, 272*b*: conductive layer, 273: conductive layer, 274: plug, 274*a*: conductive layer, 274*b*: conductive layer, 275: insulating layer, 278: connection portion, 280: display module, 281: semiconductor layer, 281*i*: channel formation region, 281*n*: low-resistance region, 282: circuit portion, 283: pixel circuit portion, 283*a*: pixel circuit, 284: pixel portion, 284*a*: pixel, 285: terminal portion, 286: wiring portion, 288: display portion, 290: FPC, 291: substrate, 292: connection layer, 293: substrate, 294: insulating layer, 301: substrate, 301A: substrate, 301B: substrate, 310: transistor, 310A: transistor, 310B: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 335: insulating layer, 336: insulating layer, 341: conductive layer, 342: conductive layer, 343: plug, 344: insulating layer, 345: insulating layer, 346: insulating layer, 347: bump, 348: adhesive layer, 400: display apparatus, 411*a*: conductive layer, 411*b*: conductive layer, 411*c*: conductive layer, 412*b*: EL layer, 412S: PD layer, 413: common electrode, 414: organic layer, 415*b*: layer, 415S: layer, 416: protective layer, 417: light-blocking layer, 418: coloring layer, 421: insulating layer, 422: resin layer, 430*b*: light-emitting element, 440: light-receiving element, 442: adhesive layer, 451: substrate, 452: substrate, 453: substrate, 454: substrate, 455: adhesive layer, 462: display portion, 464: circuit, 465: wiring, 466: conductive layer, 471: conductive layer, 472: FPC, 473: IC, 500: display apparatus, 501: electrode, 502: electrode, 512W: light-emitting unit, 521: layer, 522: layer, 523Q_1: light-emitting layer, 523Q_2: light-emitting layer, 523Q_3: light-emitting layer, 524: layer, 525: layer, 526: active layer, 540: protective layer, 545B: coloring layer, 545G: coloring layer, 545R: coloring layer, 550S: light-receiving element, 550W: light-emitting element, 555: light-receiving unit, 701: substrate, 702: display portion, 702L: display portion, 702R: display portion, 6500: electronic device, 6501: housing, 6502: display portion, 6503: power supply button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing band, 8305: lens, 8400: head-mounted display, 8401: housing, 8402: mounting portion, 8403: cushion, 8404: display portion, 8405: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal This application is based on Japanese Patent Application Serial No. 2021-089340 filed on May 27, 2021, the entire contents are hereby incorporated herein by reference.

The invention claimed is:

1. A display apparatus comprising:

a first light-emitting element and a second light-emitting element; and a light-receiving element, wherein a first pixel electrode, a first organic layer, and a common electrode are stacked in this order in the first light-emitting element, wherein a second pixel electrode, a second organic layer, and the common electrode are stacked in this order in the light-receiving element, wherein the first organic layer comprises a first light-emitting layer and a second light-emitting layer, wherein the first light-emitting layer comprises a first light-emitting substance, wherein the second light-emitting layer comprises a second light-emitting substance that is different from the first light-emitting substance, wherein the second organic layer comprises a photoelectric conversion layer, wherein a first layer and a second layer are included in a region between the first light-emitting element and the light-receiving element, wherein the first layer overlaps with the second organic layer and comprises a same material as the first organic layer, wherein the second layer overlaps with the first organic layer and comprises a same material as the second organic layer, wherein an end portion of the first organic layer and an end portion of the first layer face each other in the region between the first light-emitting element and the light-receiving element, wherein an end portion of the second organic layer and an end portion of the second layer face each other in the region between the first light-emitting element and the light-receiving element, wherein the first layer comprises a region overlapping with the second pixel electrode and the second organic layer, wherein the second layer comprises a region overlapping with the first pixel electrode and the first organic layer, wherein a third pixel electrode, a third organic layer, and the common electrode are stacked in this order in the second light-emitting element, wherein the third organic layer comprises a third light-emitting layer and a fourth light-emitting layer, wherein the third light-emitting layer comprises the first light-emitting substance, wherein the fourth light-emitting layer comprises the second light-emitting substance, wherein a third layer and a fourth layer are included in a region between the second light-emitting element and the light-receiving element, wherein the third layer overlaps with the third organic layer and comprises a same material as the second organic layer, wherein the fourth layer overlaps with the second organic layer and comprises a same material as the third organic layer, wherein an end portion of the second organic layer and an end portion of the third layer face each other in the region between the second light-emitting element and the light-receiving element, wherein an end portion of the third organic layer and an end portion of the fourth layer face each other in the region between the second light-emitting element and the light-receiving element, wherein the third layer comprises a region overlapping with the third pixel electrode and the third organic layer, and wherein the fourth layer comprises a region overlapping with the second pixel electrode and the second organic layer.

2. The display apparatus according to claim 1, wherein the first organic layer comprises two light-emitting substances, and wherein colors of light emitted by the two light-emitting substances are complementary colors.

3. The display apparatus according to claim 1, wherein the light-receiving element is sandwiched between the first light-emitting element and the second light-emitting element in a plan view.

4. The display apparatus according to claim 1, further comprising:

a first coloring layer overlapping with the first light-emitting element; and a second coloring layer overlapping with the second light-emitting element, wherein a wavelength range of light that the second coloring layer transmits is different from a wavelength range of light that the first coloring layer transmits.

5. The display apparatus according to claim 1, further comprising:

a first coloring layer overlapping with the first light-emitting element; and a second coloring layer overlapping with the second light-emitting element, wherein a wavelength range of light that the first coloring layer transmits is the same as a wavelength range of light that the second coloring layer transmits.

6. The display apparatus according to claim 1, further comprising a resin layer, wherein the resin layer is positioned in the region between the first light-emitting element and the light-receiving element, wherein the end portion of the first organic layer face the end portion of the first layer with the resin layer therebetween, and wherein the end portion of the second organic layer face the end portion of the second layer with the resin layer therebetween.

7. The display apparatus according to claim 1, further comprising a first insulating layer, wherein the first insulating layer is positioned between the first light-emitting element and the light-receiving element, and wherein the first insulating layer is in contact with the end portion of the first organic layer, the end portion of the second organic layer, the end portion of the first layer, and the end portion of the second layer.

* * * * *